(12) United States Patent  
Baraskar et al.

(10) Patent No.: US 11,778,817 B2  
(45) Date of Patent: Oct. 3, 2023

(54) THREE-DIMENSIONAL MEMORY DEVICE INCLUDING III-V COMPOUND SEMICONDUCTOR CHANNEL LAYER AND METHOD OF MAKING THE SAME

(71) Applicant: SANDISK TECHNOLOGIES LLC, Addison, TX (US)

(72) Inventors: Ashish Kumar Baraskar, Santa Clara, CA (US); Raghuveer S. Makala, Campbell, CA (US); Peter Rabkin, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 1 day.

(21) Appl. No.: 16/912,196

(22) Filed: Jun. 25, 2020

(65) Prior Publication Data

US 2021/0408032 A1 Dec. 30, 2021

(51) Int. Cl.  
*H10B 43/27* (2023.01)  
*H01L 21/762* (2006.01)  
(Continued)

(52) U.S. Cl.  
CPC ....... *H10B 43/27* (2023.02); *H01L 21/76254* (2013.01); *H01L 24/08* (2013.01);  
(Continued)

(58) Field of Classification Search  
CPC ......... H01L 27/11582; H01L 27/11556; H01L 21/0245; H01L 21/02598; H01L 21/02005;  
(Continued)

(56) References Cited

U.S. PATENT DOCUMENTS 5,915,167 A 6/1999 Leedy  
9,799,670 B2 10/2017 Nishikawa et al.  
(Continued)

OTHER PUBLICATIONS

Rajashekhar, A. et al., "Three-Dimensional Memory Device Including III-V Compound Semiconductor Channel Layer and Method of Making The Same," U.S. Appl. No. 16/912,279, filed Jun. 25, 2020.  
(Continued)

*Primary Examiner* — Julio J Maldonado  
*Assistant Examiner* — Stanetta D Isaac  
(74) *Attorney, Agent, or Firm* — THE MARBURY LAW GROUP PLLC

(57) ABSTRACT

A stack including a silicon oxide layer, a germanium-containing layer, and a III-V compound semiconductor layer is formed over a substrate. An alternating stack of insulating layers and spacer material layers is formed over the III-V compound semiconductor layer. The spacer material layers are formed as, or are subsequently replaced with, electrically conductive layers. Memory openings are formed through the alternating stack and into the III-V compound semiconductor layer. Memory opening fill structures including a memory film and a vertical semiconductor channel are formed in the memory openings. The vertical semiconductor channels can include a III-V compound semiconductor channel material that is electrically connected to the III-V compound semiconductor layer. The substrate and at least a portion of the silicon oxide layer can be subsequently detached.

20 Claims, 68 Drawing Sheets

(51) Int. Cl.
  *H01L 25/00* (2006.01)
  *H01L 25/18* (2023.01)
  *H01L 23/00* (2006.01)
  *H10B 41/27* (2023.01)
  *H01L 21/02* (2006.01)

(52) U.S. Cl.
  CPC .............. *H01L 25/18* (2013.01); *H01L 25/50* (2013.01); *H10B 41/27* (2023.02); *H01L 21/0245* (2013.01); *H01L 21/02513* (2013.01); *H01L 21/02538* (2013.01); *H01L 21/02595* (2013.01); *H01L 21/02598* (2013.01); *H01L 2224/08145* (2013.01)

(58) Field of Classification Search
  CPC ......... H01L 21/02107; H01L 21/02104; H01L 21/02002; H01L 21/02; H01L 21/76259; H01L 21/76264; H01L 2021/6006
  See application file for complete search history.

(56) References Cited

U.S. PATENT DOCUMENTS

| | | |
|---|---|---|
| 9,818,801 B1 | 11/2017 | Rabkin et al. |
| 9,831,266 B2 | 11/2017 | Kai et al. |
| 9,876,031 B1 | 1/2018 | Shimizu et al. |
| 9,917,100 B2 | 3/2018 | Zhang et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,115,681 B1 | 10/2018 | Ariyoshi |
| 10,199,359 B1 | 2/2019 | Sakakibara et al. |
| 10,224,340 B2 | 3/2019 | Hada et al. |
| 10,283,493 B1 | 5/2019 | Nishida |
| 10,290,650 B1 | 5/2019 | Iwai |
| 10,304,852 B1 | 5/2019 | Cui et al. |
| 10,354,980 B1 | 7/2019 | Mushiga et al. |
| 10,354,987 B1 | 7/2019 | Mushiga et al. |
| 10,381,322 B1 | 8/2019 | Azuma et al. |
| 10,381,362 B1 | 8/2019 | Cui et al. |
| 10,381,373 B2 | 8/2019 | Okizumi et al. |
| 10,438,964 B2 | 10/2019 | Makala et al. |
| 10,510,738 B2 | 12/2019 | Kim et al. |
| 10,629,613 B1 | 4/2020 | Shimizu et al. |
| 10,629,616 B1 | 4/2020 | Kai et al. |
| 10,665,580 B1 | 5/2020 | Hosoda et al. |
| 10,665,581 B1* | 5/2020 | Zhou .................. G11C 16/08 |
| 2003/0203600 A1* | 10/2003 | Chu ................ H01L 21/76256 |
| | | 438/479 |
| 2006/0234474 A1* | 10/2006 | Nastasi ............ H01L 21/76254 |
| | | 257/E21.129 |
| 2011/0298038 A1 | 12/2011 | Son et al. |
| 2014/0231888 A1 | 8/2014 | Kelber et al. |
| 2016/0284723 A1 | 9/2016 | Rabkin et al. |
| 2016/0284724 A1 | 9/2016 | Rabkin et al. |
| 2017/0014881 A1 | 5/2017 | Kai et al. |
| 2017/0148800 A1 | 5/2017 | Nishikawa et al. |
| 2017/0148811 A1 | 5/2017 | Zhang et al. |
| 2017/0352767 A1 | 12/2017 | Hayne |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0182771 A1 | 6/2018 | Costa et al. |
| 2018/0366486 A1 | 12/2018 | Hada et al. |
| 2018/0366487 A1 | 12/2018 | Okizumi et al. |
| 2018/0374866 A1 | 12/2018 | Makala et al. |
| 2019/0043830 A1 | 2/2019 | Sakakibara et al. |
| 2019/0221557 A1 | 7/2019 | Kim et al. |
| 2019/0252361 A1* | 8/2019 | Nishida ................. H01L 23/13 |
| 2019/0371807 A1 | 12/2019 | Nishikawa et al. |
| 2020/0027835 A1 | 1/2020 | Hsu et al. |
| 2020/0066745 A1 | 2/2020 | Yu et al. |
| 2020/0194312 A1 | 6/2020 | Then et al. |

OTHER PUBLICATIONS

"High Mobility Material," https://www.sciencedirect.com/topics/engineering/high-mobility-material.
"III-V Integration & Devices," https://www.zurich.ibm.com/st/nanodevices/monolithicgrowth.html.
"Wet Chemical Etching," http://terpconnect.umd.edu/~browns/wetetch.html.
Alexiev, D. et al., "A Review of Liquid Phase Epitaxial Grown Gallium arsenide," https://arxiv.org/abs/cond-mat/04086S3v1.
Buzynin, Y. et al., "GaAs/e/Si Epitaxial Substrates: Development and Characteristics," AIP Advances 7, 015304 (2017).
Kuo, W.C. et al., "High Quality GaAs Epilayers Grown on Si Substrate Using 100nm Ge Buffer, Layer," International Journal of Photoenergy, vol. 2016, Article ID 7218310, 5 pages, (2016). http://dx.doi.org/10.1155/2016/7218310.
Bolkhovityanov, Y.B. et al., "GaAs Epitaxy on Si Substrates: Modern Status of Research and Engineering," Physics—Uspekhi, vol. 51, No. 5, pp. 437-456, (2008).
Bruel, M. et al., "Smart-Cut: A New Silicon on Insulator Material Technology Based on Hydrogen Implantation and Wafer Bonding," JPN. J. Appl. Phys, vol. 36, Part 1, No. 3B, pp. 1636-1641, (1997).
U.S. Appl. No. 16/886,164, filed May 28, 2018, SanDisk Technologies LLC.
U.S. Appl. No. 16/200,115, filed Nov. 26, 2018, SanDisk Technologies LLC.
U.S. Appl. No. 16/231,752, filed Dec. 24, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/268,132, filed Feb. 5, 2019, SanDisk Technologies LLC.
U.S. Appl. No. 16/268,183, filed Feb. 5, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 19, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/394,233, filed Apr. 25, 2019, SanDisk Technologies LLC.
U.S. Appl. No. 16/406,335, filed May 8, 2019, SanDisk Technologies LLC.
U.S. Appl. No. 16/407,310, filed May 9, 2019, SanDisk Technologies LLC.
U.S. Appl. No. 16/408,722, filed May 10, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.

(56) References Cited

OTHER PUBLICATIONS

U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/800,078, filed Feb. 25, 2020, SanDisk Technologies LLC.
U.S. Appl. No. 16/800,097, filed Feb. 25, 2020, SanDisk Technologies LLC.
U.S. Appl. No. 16/801,456, filed Feb. 26, 2020, SanDisk Technologies LLC.
U.S. Appl. No. 16/806,087, filed Mar. 2, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/879,146, filed May 20, 2020, SanDisk Technologies LLC.
U.S. Appl. No. 16/886,164, filed May 28, 2020, SanDisk Technologies LLC.
U.S. Appl. No. 16/886,221, filed May 28, 2020, SanDisk Technologies LLC.
U.S. Appl. No. 16/887,659, filed May 29, 2020, SanDisk Technologies LLC.
U.S. Appl. No. 16/887,738, filed May 29, 2020, SanDisk Technologies LLC.
U.S. Appl. No. 16/887,818, filed May 29, 2020, SanDisk Technologies LLC.
U.S. Appl. No. 16/888,055, filed May 29, 2020, SanDisk Technologies LLC.
U.S. Appl. No. 16/888,188, filed May 29, 2020, SanDisk Technologies LLC.
U.S. Appl. No. 16/910,752, filed Jun. 24, 2020, SanDisk Technologies LLC.
Notification of Transmittal of the International Search Report and the Written Opinion of the International Searching Authority for International Patent Application No. PCTUS2021/012421, dated May 9, 2021, 11 pages.
USPTO Office Communication, Non-Final Office Action for U.S. Appl. No. 16/912,279, dated Aug. 25, 2021, 23 pages.

* cited by examiner

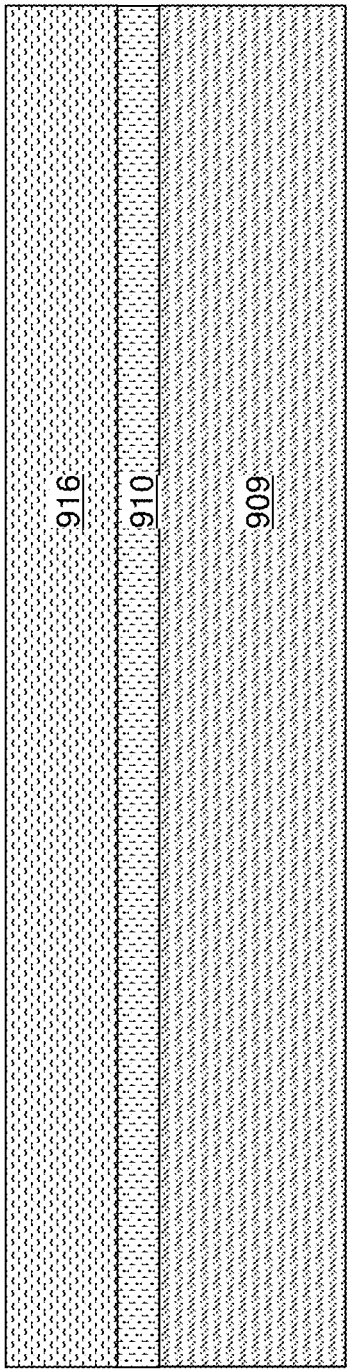
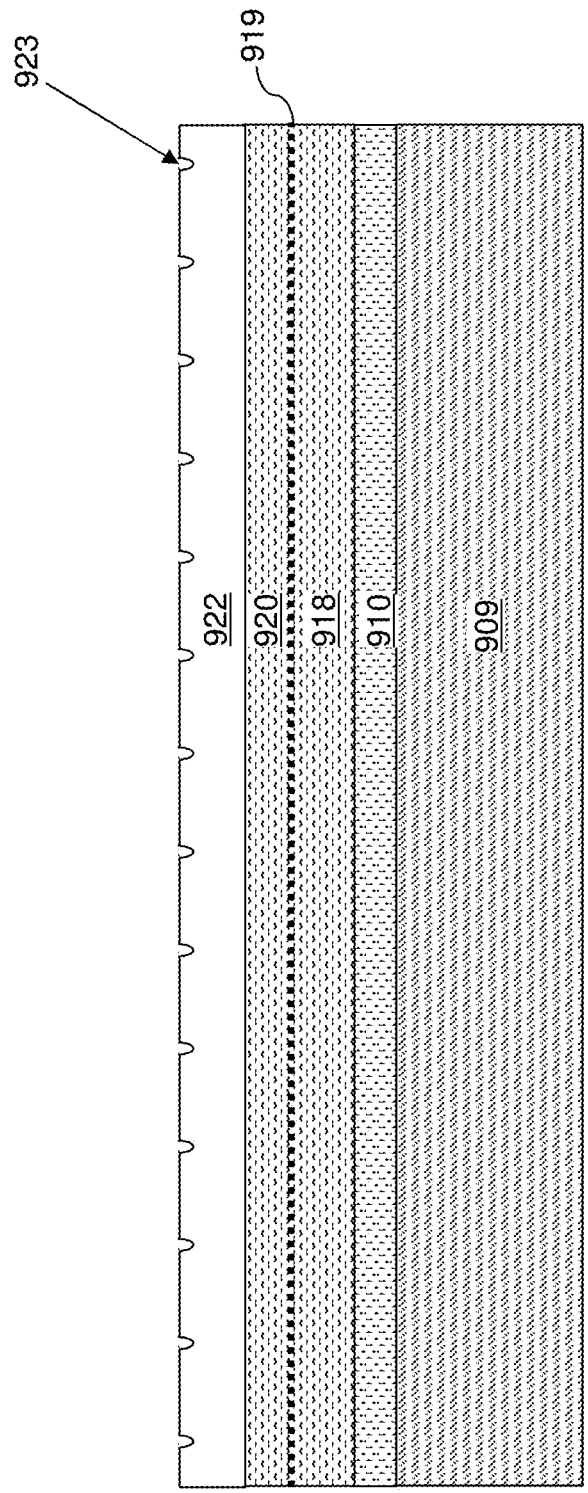
FIG. 1A
FIG. 1B

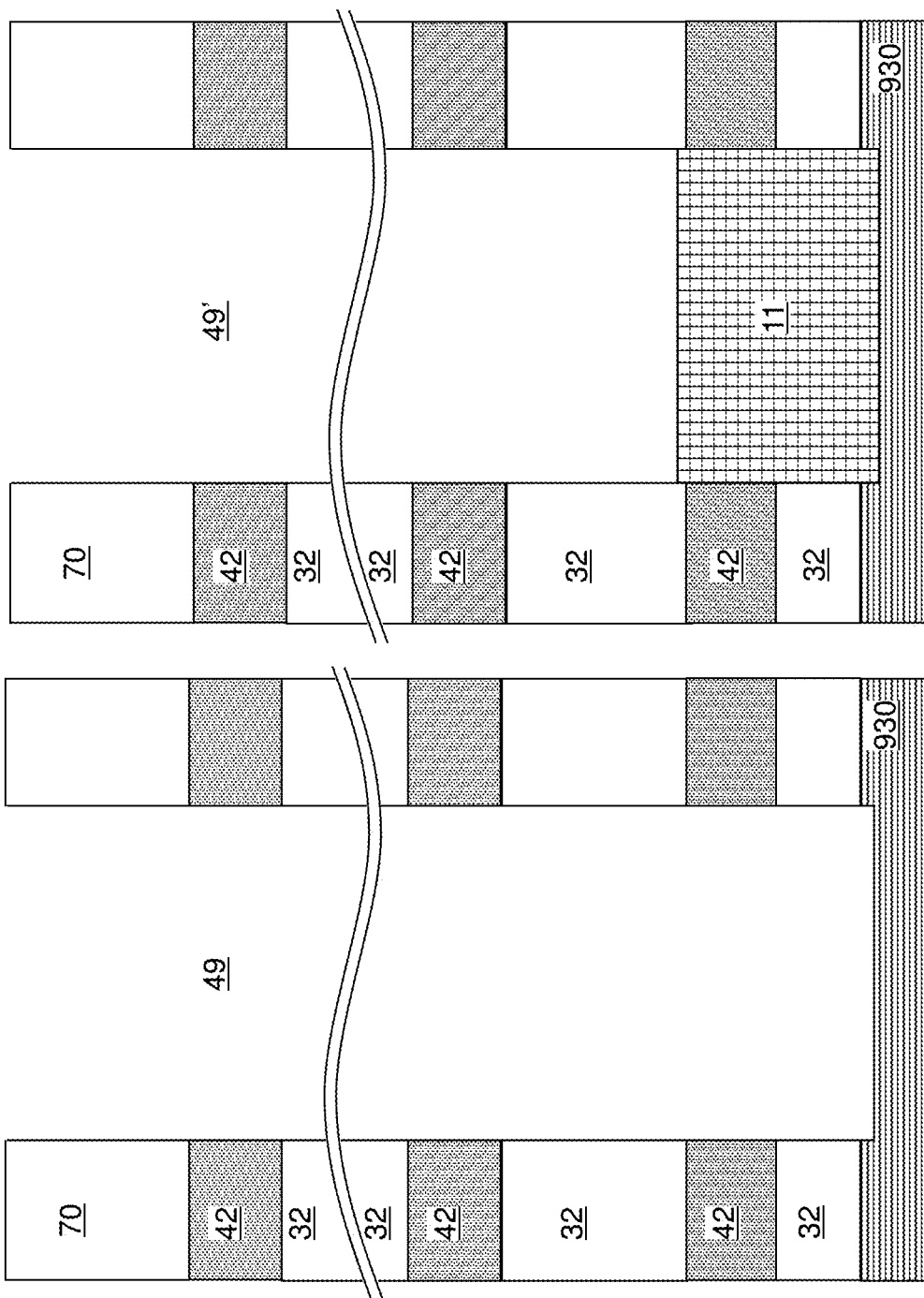

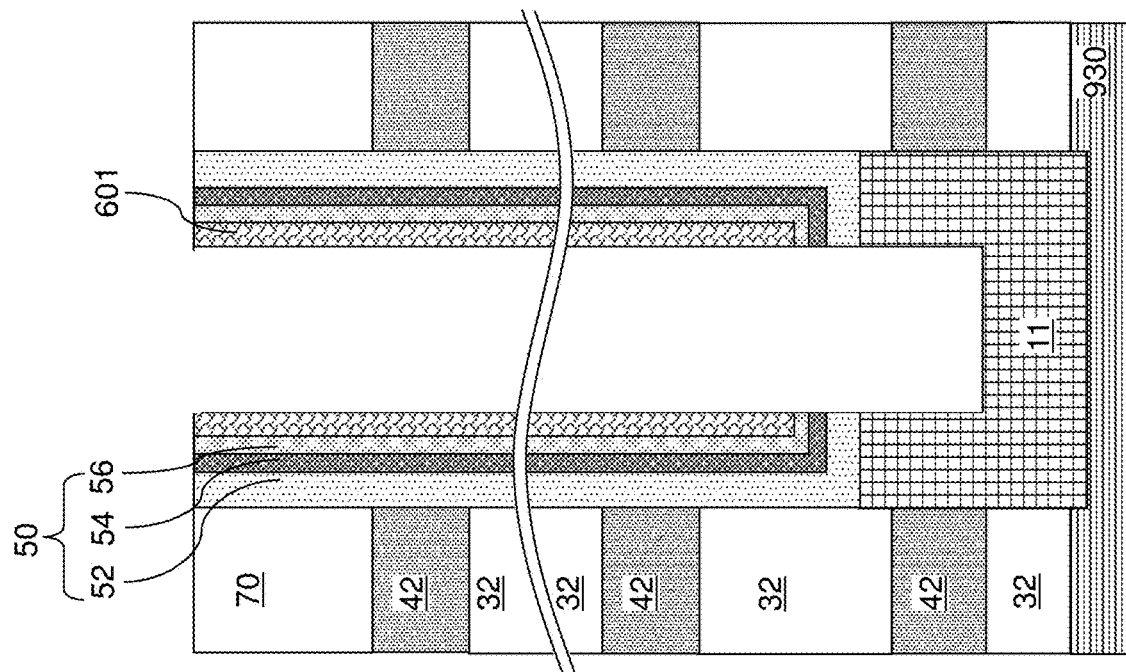
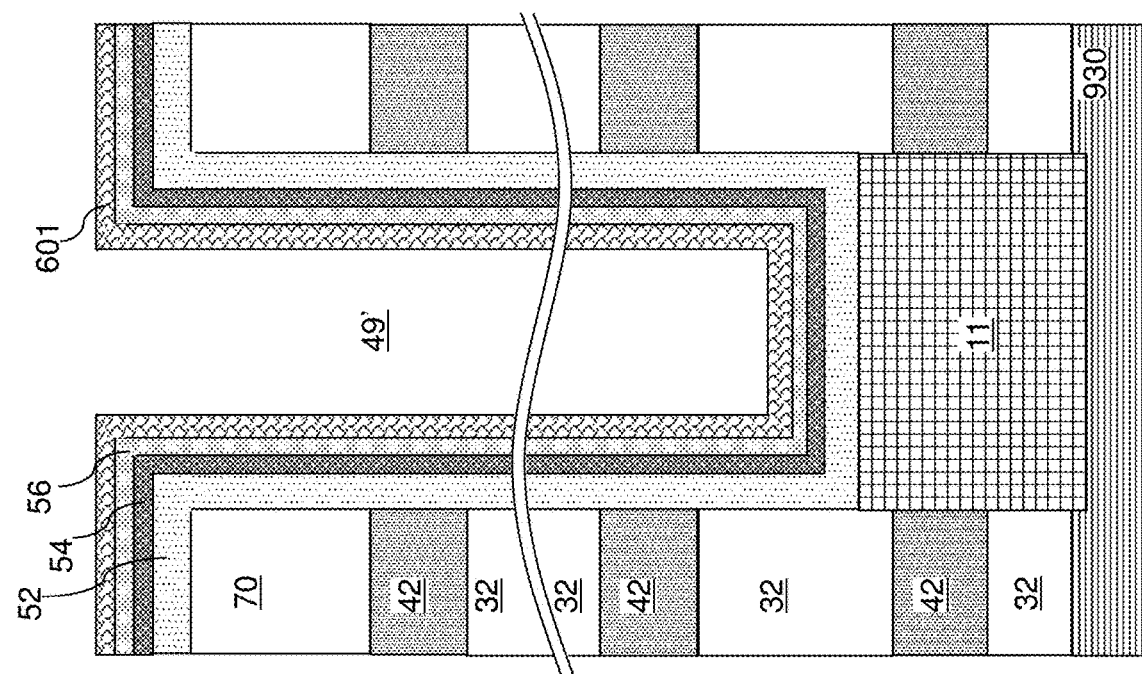

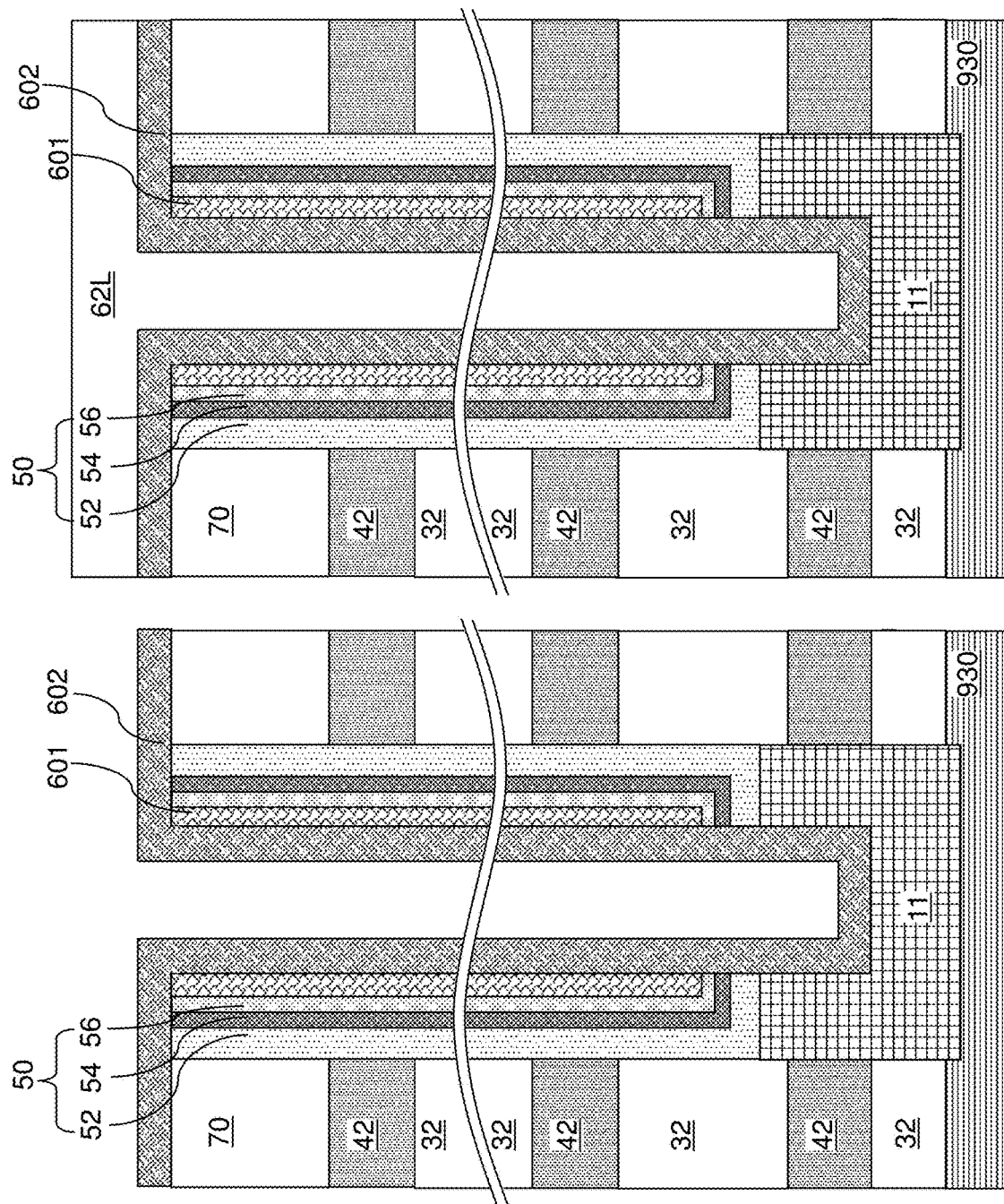

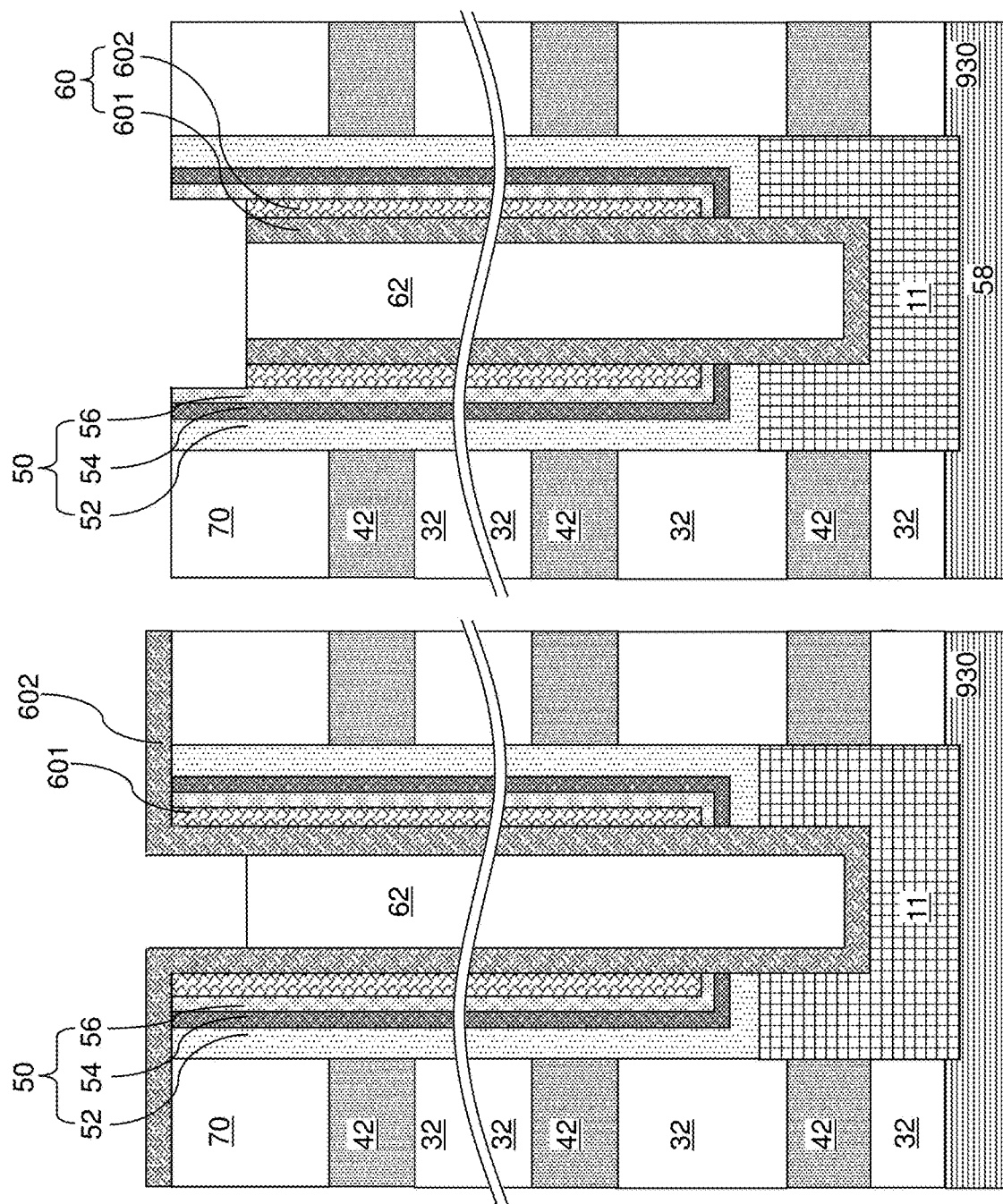

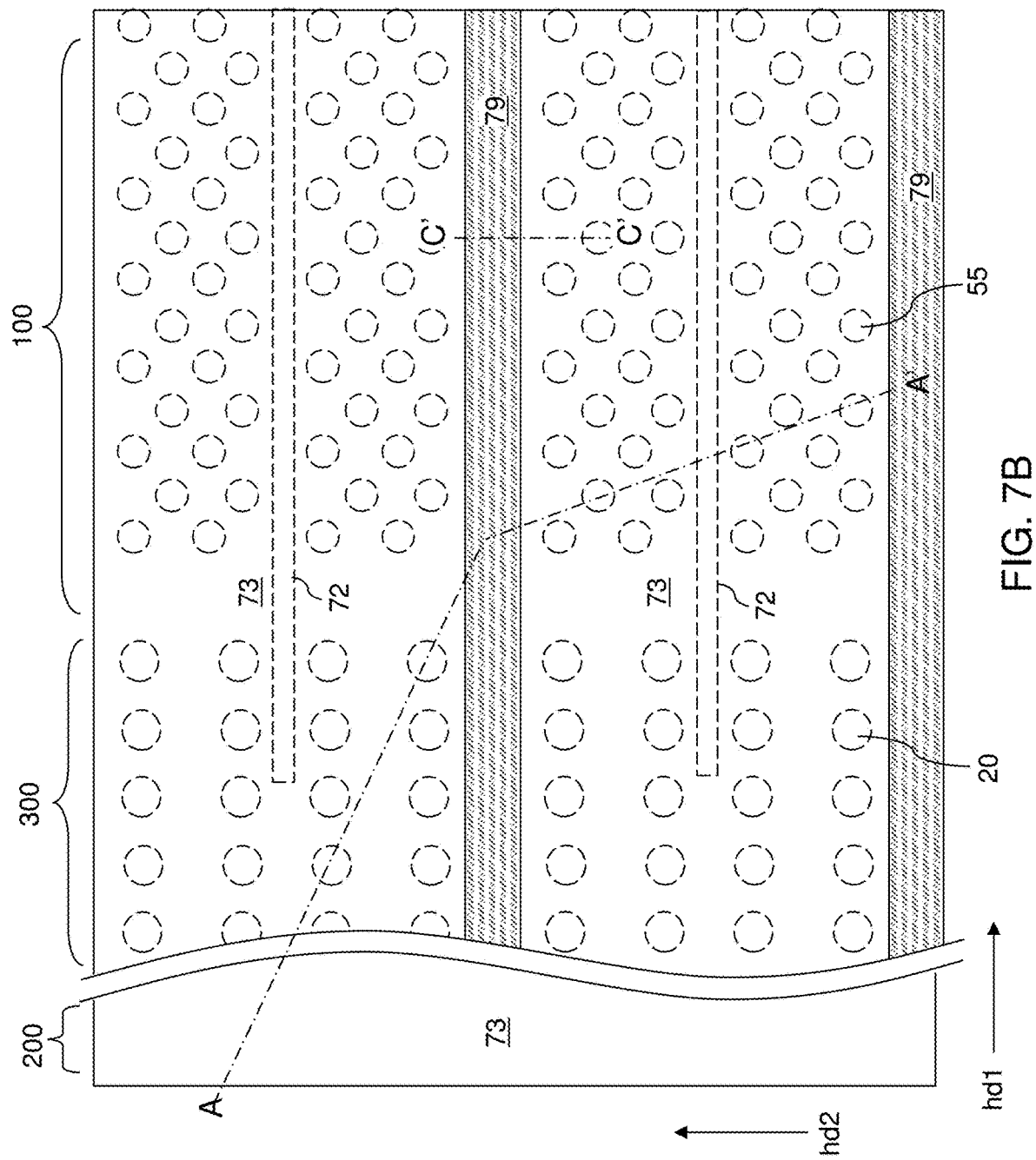

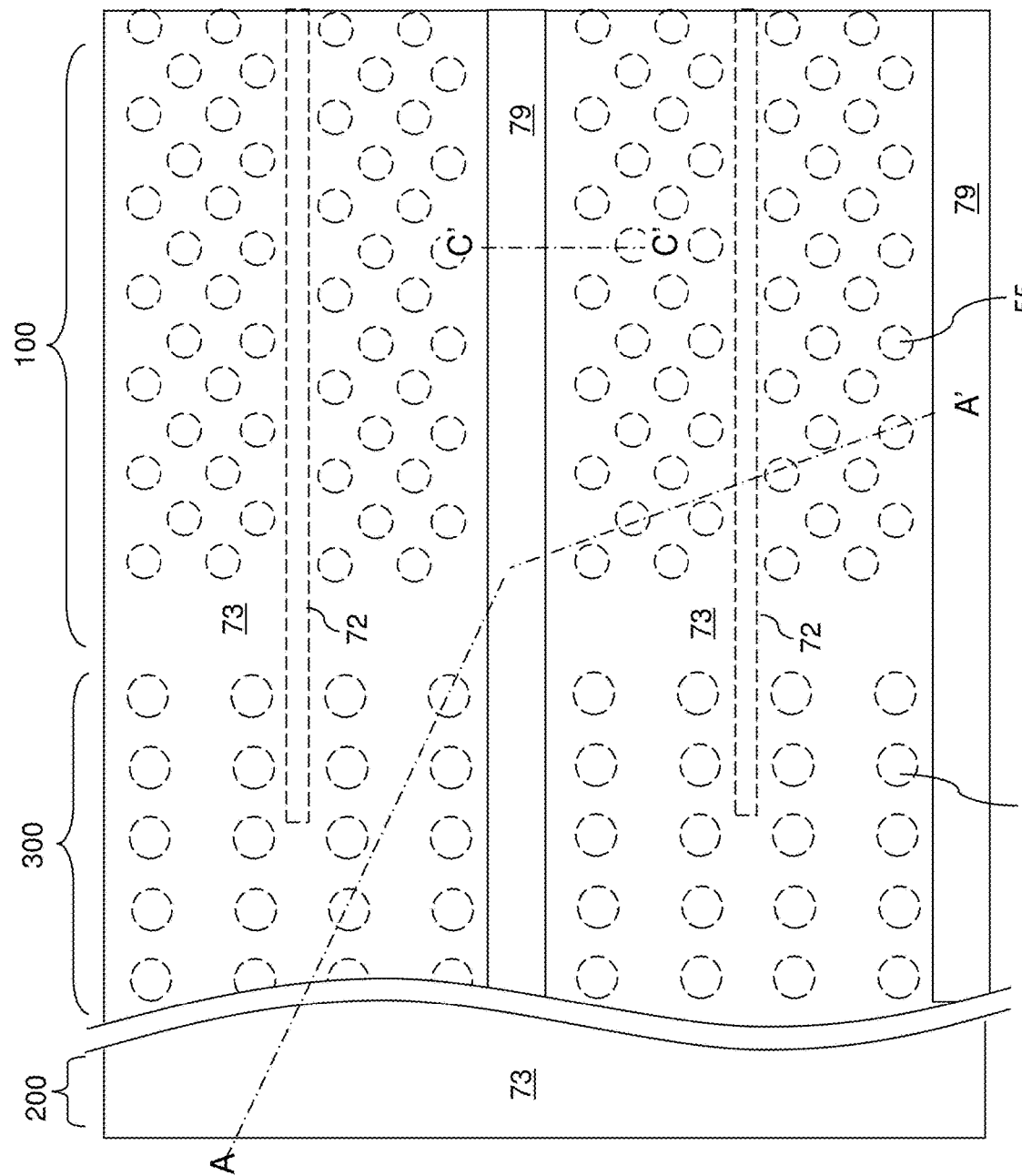

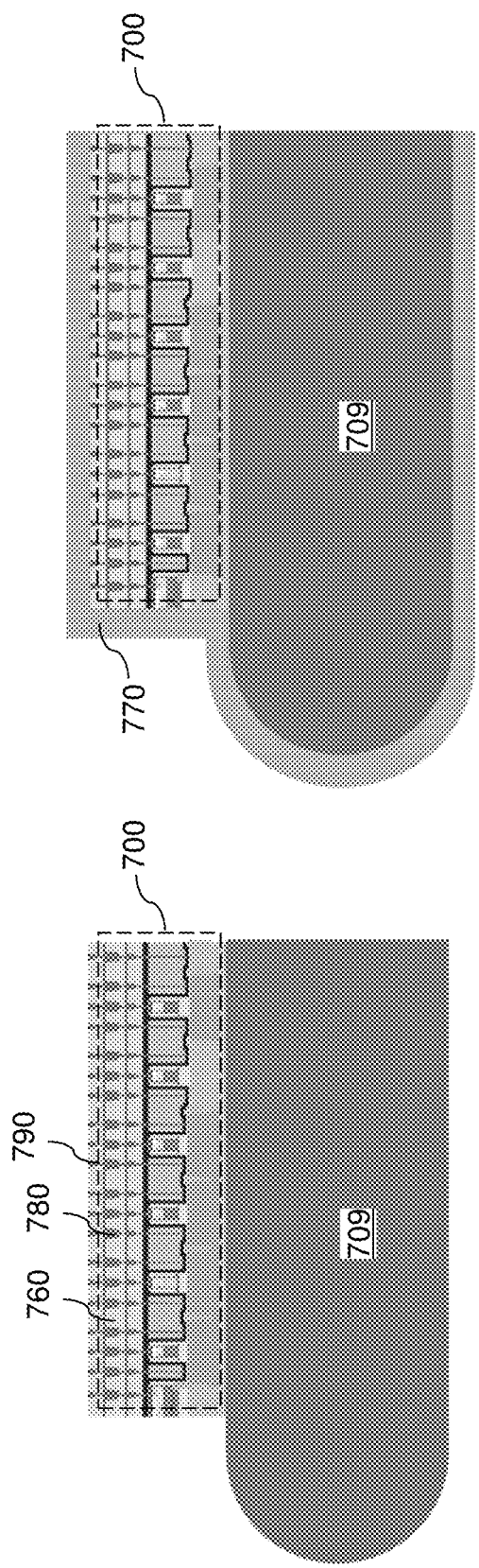

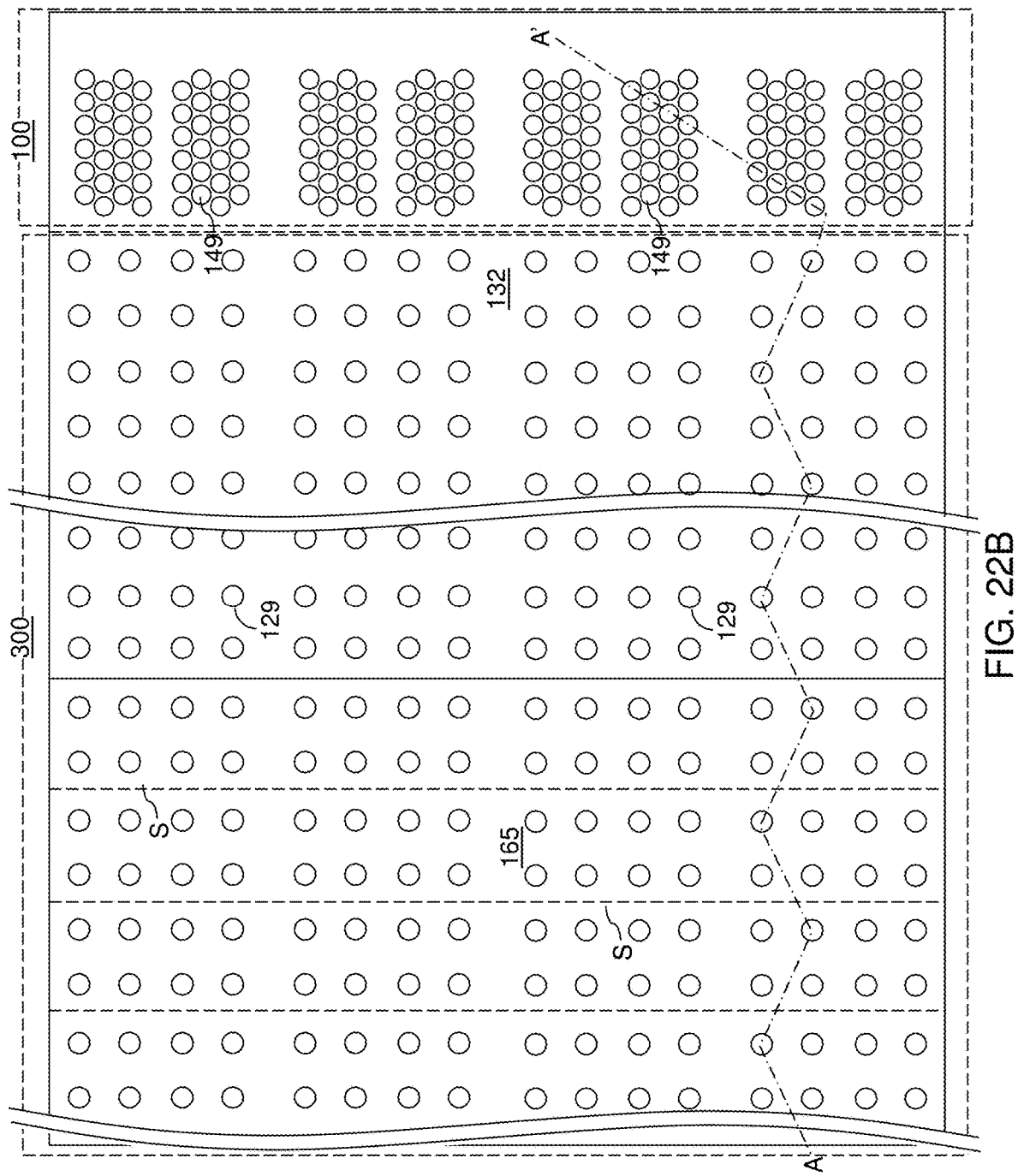

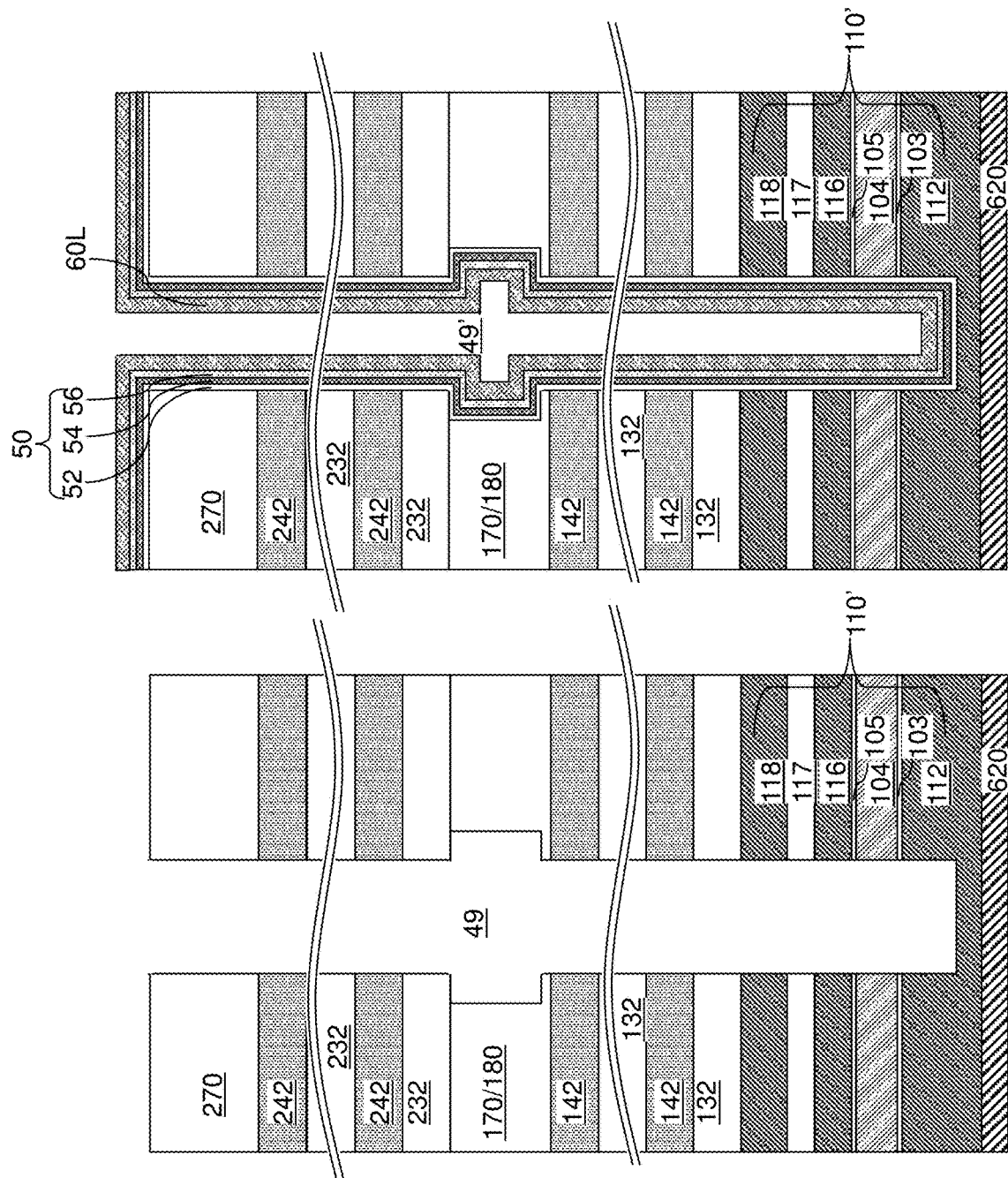

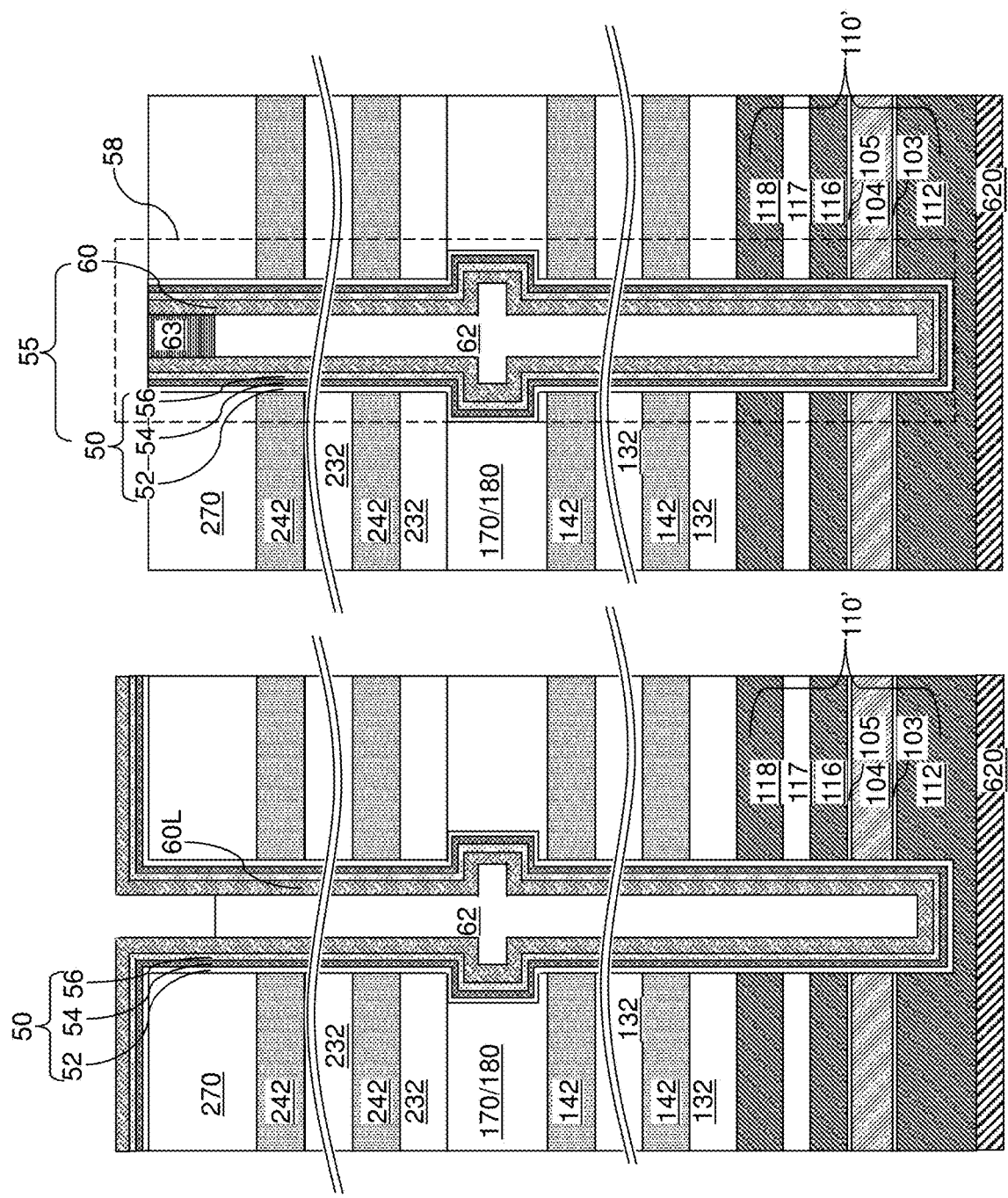

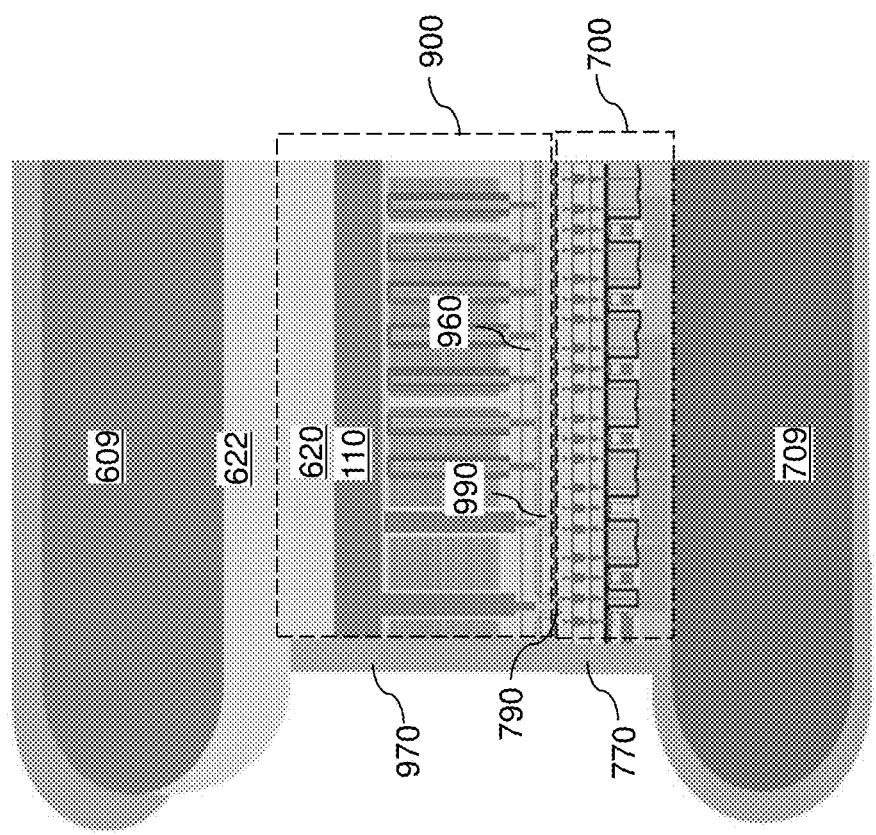

THREE-DIMENSIONAL MEMORY DEVICE INCLUDING III-V COMPOUND SEMICONDUCTOR CHANNEL LAYER AND METHOD OF MAKING THE SAME

FIELD

The present disclosure relates generally to the field of semiconductor devices, and particularly to a three-dimensional memory device including a III-V compound semiconductor channel and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a memory film and a vertical semiconductor channel.

SUMMARY

According to an aspect of the present disclosure, a method of forming a three-dimensional memory device is provided, which comprises: providing an assembly including a substrate material layer, a silicon oxide layer, and a single-crystalline germanium-containing layer; growing a single-crystalline III-V compound semiconductor layer on the single-crystalline germanium-containing layer; forming an alternating stack of insulating layers and spacer material layers over the single-crystalline III-V compound semiconductor layer, wherein the spacer material layers are formed as, or are subsequently replaced with, electrically conductive layers; forming memory openings through the alternating stack; and forming memory opening fill structures in the memory openings, wherein each memory opening fill structure comprises a memory film and a vertical semiconductor channel having a bottom end that is electrically connected to the single-crystalline III-V compound semiconductor layer.

According to another aspect of the present disclosure, a semiconductor structure is provided, which comprises: a single-crystalline germanium-containing layer; a single-crystalline III-V compound semiconductor layer that is epitaxially aligned to the single-crystalline germanium-containing layer; an alternating stack of insulating layers and electrically conductive layers located on the single-crystalline III-V compound semiconductor layer; memory stack structures vertically extending through the alternating stack; first dielectric material layers embedding first metal interconnect structures and first metal pads, wherein the first dielectric material layers are located over the alternating stack, and wherein the first metal interconnect structures are electrically connected to nodes of the memory stack structures; second dielectric material layers embedding second metal interconnect structures and second metal pads, wherein the second dielectric material layers are located over the first dielectric material layers, wherein the second metal pads are bonded to the first metal pads; and field effect transistors located over the second dielectric material layers and electrically connected to the second metal interconnect structures.

According to yet another aspect of the present disclosure, a method of forming a three-dimensional memory device is provided, which comprises: forming a silicon oxide layer, a polycrystalline germanium-containing layer, a polycrystalline III-V compound semiconductor layer, and a source-level sacrificial layer over a substrate; forming an alternating stack of insulating layers and spacer material layers over the source-level sacrificial layer, wherein the spacer material layers are formed as, or are subsequently replaced with, electrically conductive layers; forming memory openings through the alternating stack and into the source-level sacrificial layer; forming memory opening fill structures in the memory openings, wherein each memory opening fill structure comprises a memory film and a vertical semiconductor channel; and replacing the source-level sacrificial layer with a source contact layer that contacts vertical semiconductor channels of the memory opening fill structures.

According to still another aspect of the present disclosure, a semiconductor structure is provided, which comprises: a polycrystalline germanium-containing layer; a polycrystalline III-V compound semiconductor layer located on the germanium-containing layer; a source contact layer located on the polycrystalline III-V compound semiconductor layer; an alternating stack of insulating layers and electrically conductive layers located on the source contact layer; memory stack structures vertically extending through the alternating stack; first dielectric material layers embedding first metal interconnect structures and first metal pads, wherein the first dielectric material layers are located over the alternating stack, and wherein the first metal interconnect structures are electrically connected to nodes of the memory stack structures; second dielectric material layers embedding second metal interconnect structures and second metal pads, wherein the second dielectric material layers are located over the first dielectric material layers, wherein the second metal pads are bonded to the first metal pads; and field effect transistors located over the second dielectric material layers and electrically connected to the second metal interconnect structures.

BRIEF DESCRIPTION OF THE DRAWINGS

FIG. 1A is a vertical cross-sectional view of a transfer substrate after formation of an optional single-crystalline graded silicon-germanium layer and a single-crystalline germanium-containing layer according to a first embodiment of the present disclosure.

FIG. 1B is a vertical cross-sectional view of the transfer substrate after formation of a first silicon oxide component layer and a hydrogen implanted region according to the first embodiment of the present disclosure.

FIGS. 5A-5K are sequential schematic vertical cross-sectional views of a memory opening within the first exemplary structure during formation of a memory opening fill structure therein according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIG. 13B is a partial see-through top-down view of the first exemplary structure of FIG. 13A. The vertical plane A-A' is the plane of the schematic vertical cross-sectional view of FIG. 13A.

FIGS. 17A-17C are sequential vertical cross-sectional views of an edge region of a semiconductor substrate with a peripheral circuit thereupon during formation of a second silicon nitride diffusion barrier layer according to the first embodiment of the present disclosure.

FIG. 22B is a horizontal cross-sectional view of the second exemplary structure along the horizontal plane B-B' in FIG. 20A. The zig-zag vertical plane A-A' corresponds to the plane of the vertical cross-sectional view of FIG. 22A.

FIGS. 27A-27D illustrate sequential vertical cross-sectional views of a memory opening during formation of a memory opening fill structure according to the second embodiment of the present disclosure.

FIGS. 37A and 37B are sequential vertical cross-sectional views of an edge region of a bonded assembly during separation at a silicon oxide layer according to the second embodiment of the present disclosure.

DETAILED DESCRIPTION

Figure 1C:
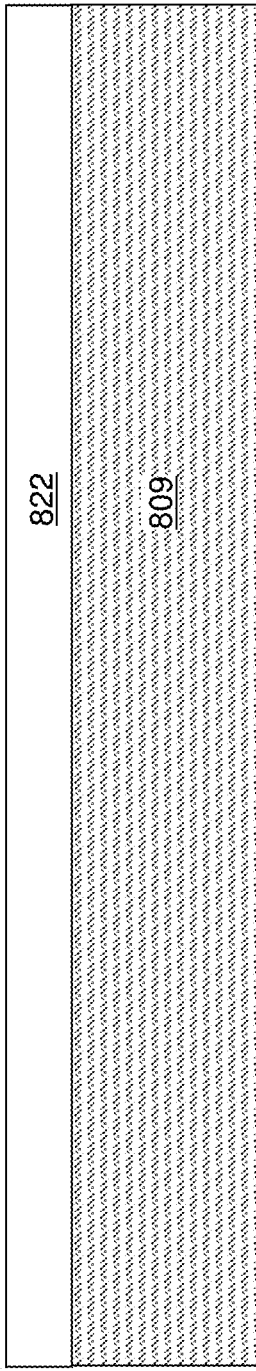
FIG. 1C is a vertical cross-sectional view of a substrate after formation of a second silicon oxide component layer thereupon according to the first embodiment of the present disclosure.

As discussed above, the present disclosure is directed to a three-dimensional memory device including a III-V compound semiconductor channel layer and methods of making the same using wafer bonding, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1A, a transfer substrate 909 including a single-crystalline semiconductor material can be provided. In one embodiment, the transfer substrate 909 can include single-crystalline silicon. For example, the transfer substrate 909 can include a commercially available single-crystalline silicon wafer. A single-crystalline graded silicon-germanium layer 910 can be optionally formed on the transfer substrate 909. In one embodiment, a selective epitaxy process can be performed to epitaxially grow a single-crystalline silicon-germanium alloy material in which the atomic percentage of germanium atoms increases with a distance from the top surface of the transfer substrate 909. For example, the atomic percentage of germanium may increase from 0% to 100% during deposition of the material of the single-crystalline graded silicon-germanium layer 910. The thickness of the single-crystalline graded silicon-germanium layer 910 may be in a range from 100 nm to 300 nm, although lesser and greater thicknesses may also be employed.

An in-process single-crystalline germanium-containing layer 916 can be formed by epitaxial deposition of a germanium-containing material that includes germanium at an atomic concentration in a range from 50% to 100%, such as from 80% to 100%. Generally, an in-process single-crystalline germanium-containing layer 916 can be grown on the transfer substrate 909 by an epitaxial growth process. If the single-crystalline graded silicon-germanium layer 910 is present, then the in-process single-crystalline germanium-containing layer 916 can be grown from a physically exposed planar surface of the single-crystalline graded silicon-germanium layer 910. In one embodiment, the in-process single-crystalline germanium-containing layer 916 consists essentially of single-crystalline germanium. The in-process single-crystalline germanium-containing layer 916 can have a thickness in a range from 100 nm to 500 nm, such as 300 nm to 400 nm, although lesser and greater thicknesses may also be employed. The in-process single-crystalline germanium-containing layer 916 can be epitaxially aligned to the single-crystalline semiconductor material of the transfer substrate 909.

Referring to FIG. 1B, a silicon oxide layer is formed on the top surface of the in-process single-crystalline germanium-containing layer 916. The silicon oxide layer is herein referred to as a first silicon oxide component layer 922, which is a component of another silicon oxide layer to be subsequently formed. The first silicon oxide component layer 922 is formed over the in-process single-crystalline germanium-containing layer 916. The first silicon oxide component layer 922 can be formed by deposition of a silicon oxide material, for example, by chemical vapor deposition. The thickness of the first silicon oxide component layer 922 can be in a range from 30 nm to 300 nm, such as 50 nm to 100 nm, although lesser and greater thicknesses can also be employed.

Hydrogen atoms can be implanted through the first silicon oxide component layer 922 into the in-process single-crystalline germanium-containing layer 916 to form a hydrogen implanted region 919. The in-process single-crystalline germanium-containing layer 916 is divided into a proximal single-crystalline germanium-containing layer 918 and a distal single-crystalline germanium-containing layer 920 by the hydrogen implanted region 919.

Optionally, grooves 923 can be formed on a top surface of the first silicon oxide component layer 922. The grooves 923 can be subsequently employed as channels for flowing an isotropic etchant such as dilute hydrofluoric acid such that portions of the first silicon oxide component layer 922 can be etched and easily detached from a second silicon oxide component layer. Alternatively, the grooves 923 can be omitted.

Generally, the hydrogen implanted region 919 can be formed within the in-process single-crystalline germanium-containing layer 916 by implanting hydrogen atoms, and the in-process single-crystalline germanium-containing layer 916 can be divided into a single-crystalline germanium-containing layer (i.e., a distal single-crystalline germanium-containing layer) 920 contacting the first silicon oxide component layer 922 and located distal from the transfer substrate 909, and an additional single-crystalline germanium-containing layer (i.e., the proximal single-crystalline germanium-containing layer) 918 located on and proximal to the transfer substrate 909. A first assembly including a transfer substrate 909, the single-crystalline germanium-containing layers (918, 920), and a first silicon oxide component layer 922 is provided.

Referring to FIG. 1C, another substrate including a substrate material layer 809 is illustrated. The substrate material layer 809 may include a semiconductor substrate (e.g., a silicon wafer), a conductive substrate, or an insulating substrate. The thickness of the substrate material layer 809 may be in a range from 30 microns to 1 mm, although lesser and greater thicknesses may also be employed. A silicon oxide layer can be formed on a planar surface of the substrate material layer 809. The silicon oxide layer is herein referred to as a second silicon oxide component layer 822. The second silicon oxide component layer 822 includes, and/or consists essentially of, silicon oxide, and can be formed by physical vapor deposition. The thickness of the second silicon oxide component layer 822 can be in a range from 100 nm to 500 nm, such as 200 nm to 300 nm, although lesser and greater thicknesses may also be employed. A second assembly including a substrate material layer 809 material layer and a second silicon oxide component layer 822 is provided.

Figure 1D:
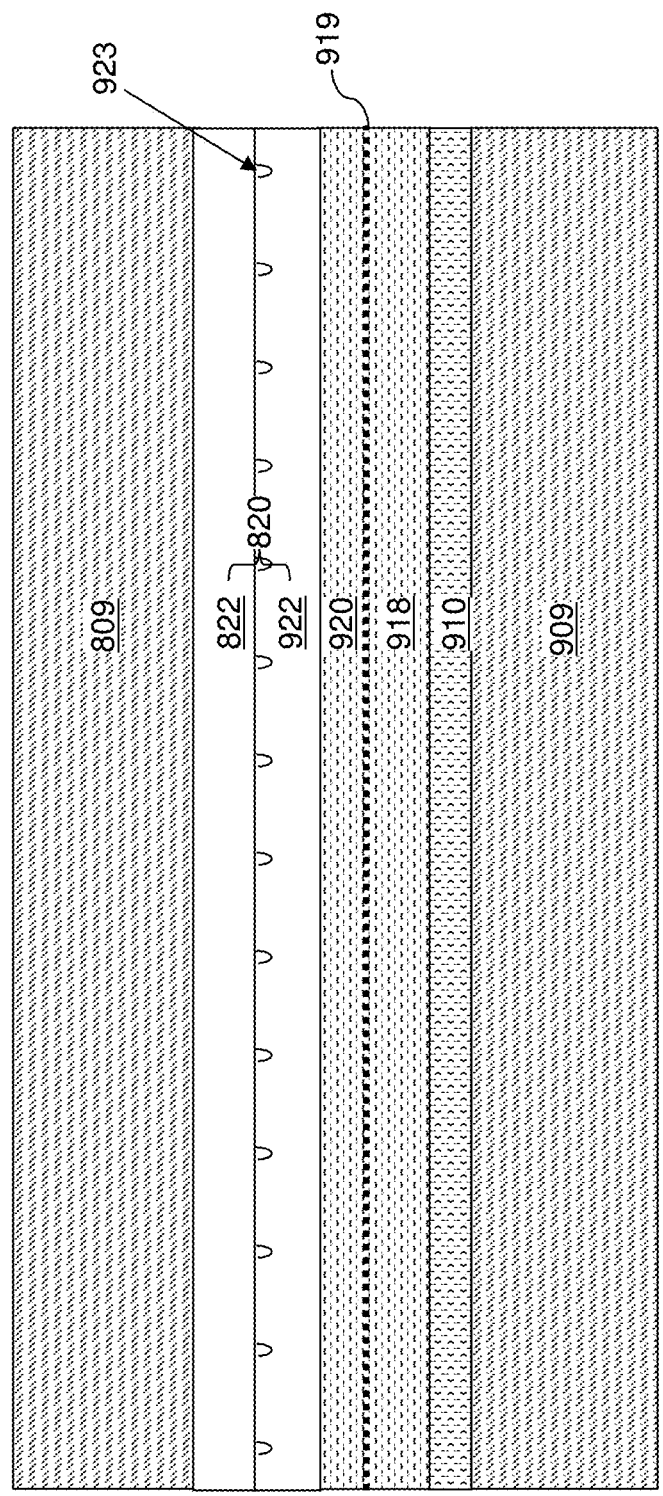
FIG. 1D is a vertical cross-sectional view of a first exemplary structure formed by bonding the first silicon oxide component layer and the second silicon oxide component layer according to the first embodiment of the present disclosure.

Referring to FIG. 1D, the first silicon oxide component layer 922 can be bonded to the second silicon oxide component layer 822 by disposing the second silicon oxide component layer 822 on the first silicon oxide component layer 922, and by performing a first thermal anneal process that induces diffusion of silicon oxide materials of the first silicon oxide component layer 922 and the second silicon oxide component layer 822 across the bonding interface. The elevated temperature of the first thermal anneal process may be in a range from 200 degrees Celsius to 400 degrees Celsius, although lower and higher temperatures may also be employed. The combination of the first silicon oxide component layer 922 and the second silicon oxide component layer 822 forms a silicon oxide layer 820, which includes a bonding interface between the first silicon oxide component layer 922 and the second silicon oxide component layer 822. In other words, the silicon oxide layer 820 can be formed by bonding the first silicon oxide component layer 922 with the second silicon oxide component layer 822.

Figure 1E:
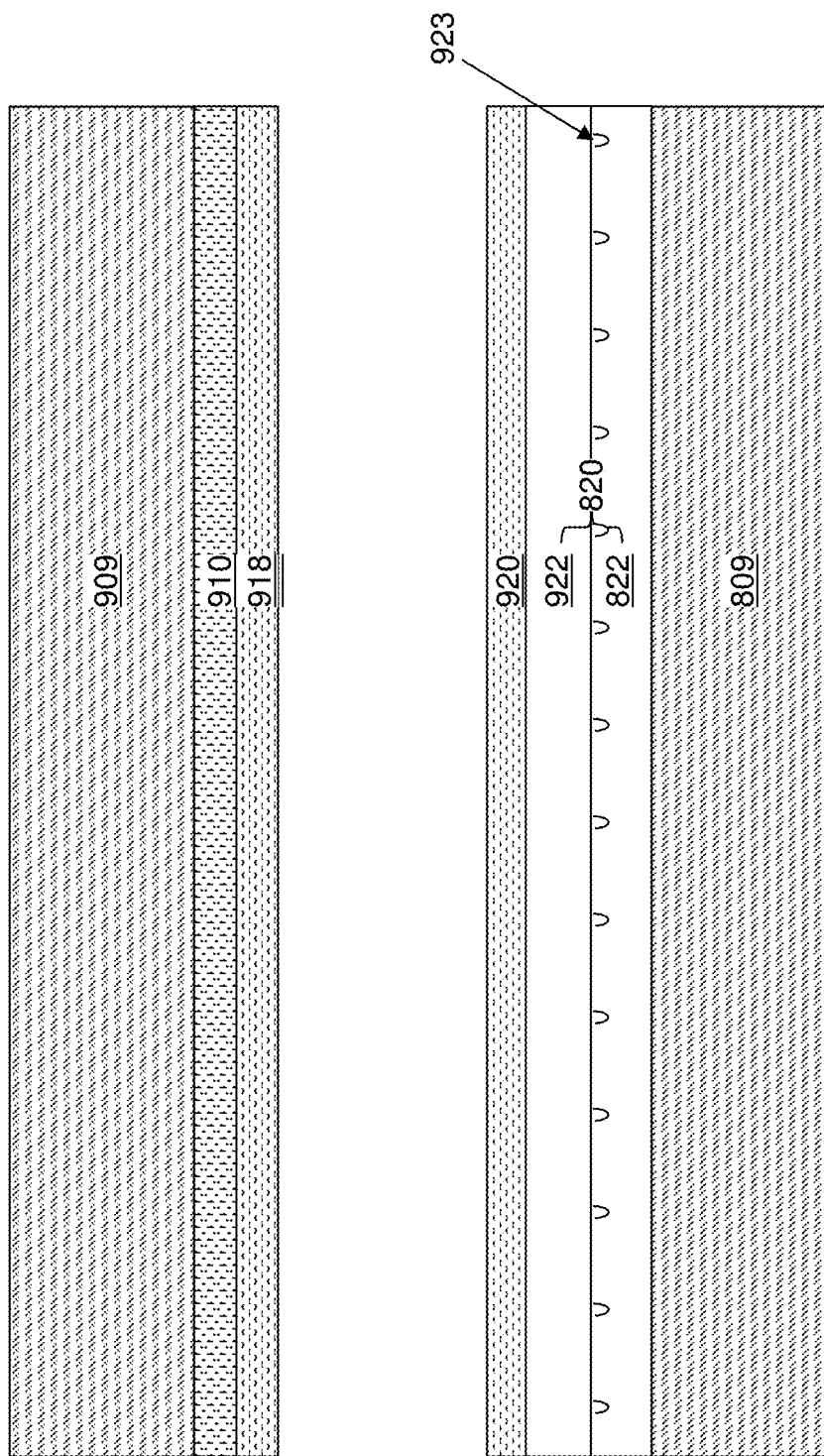
FIG. 1E is a vertical cross-sectional view of the first exemplary structure after inducing cleavage at the hydrogen implanted region according to the first embodiment of the present disclosure.

Referring to FIG. 1E, the transfer substrate 909 can be detached from an assembly including the substrate material layer 809, the silicon oxide layer 820, and a single-crystalline germanium-containing layer (i.e., the distal single-crystalline germanium-containing layer) 920. Specifically, cleavage of the distal single-crystalline germanium-containing layer 920 from the proximal single-crystalline germanium-containing layer 918 at the hydrogen implanted region 919 can be induced by performing a second thermal anneal process. The elevated temperature of the second thermal anneal process can be selected to induce bubbling of hydrogen atoms in the hydrogen implanted region 919. For example, the temperature of the second thermal anneal process may be in a range from 450 degrees Celsius to 700 degrees Celsius. The assembly of the transfer substrate 909, the optional single-crystalline graded silicon-germanium layer 910, and the proximal single-crystalline germanium-containing layer 918 can be detached from the assembly of the substrate material layer 809, the silicon oxide layer 820, and the distal single-crystalline germanium-containing layer 920. The distal single-crystalline germanium-containing layer 920 is herein referred to as a single-crystalline germanium-containing layer 920. An assembly is provided, which is a layer stack including, from bottom to top, a substrate material layer 809, a silicon oxide layer 820, and a single-crystalline germanium-containing layer 920.

Figure 1F:
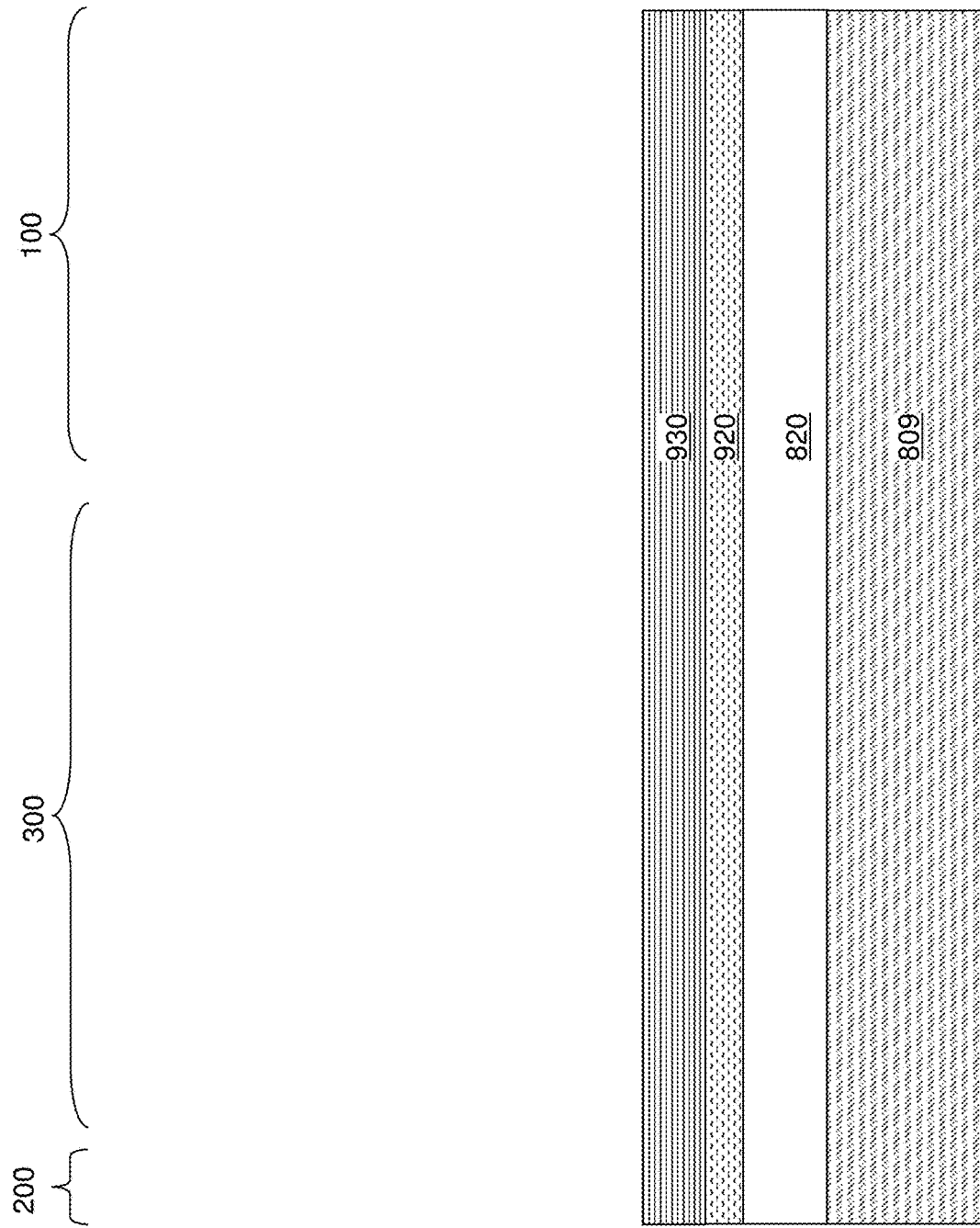
FIG. 1F is a vertical cross-sectional view of the first exemplary structure after formation of a single-crystalline III-V compound semiconductor layer according to the first embodiment of the present disclosure.

Referring to FIG. 1F, a single-crystalline III-V compound semiconductor layer 930 can be epitaxially grown from the top surface of single-crystalline germanium-containing layer 920. The single-crystalline III-V compound semiconductor layer 930 includes a III-V compound semiconductor material such as AlP, AlAs, AlSb, GaN, GaP, GaAs, GaSb, InN, InP, InAs, InGaAs, InSb, AlGaN, AlGaP, AlGaAs, AlGaSb, GaInN, GaInP, GaInAs, GaInSb, etc. In one embodiment, the single-crystalline III-V compound semiconductor layer 930 comprises GaAs. The single-crystalline III-V compound semiconductor layer 930 can be grown directly on the top surface of the single-crystalline germanium-containing layer 920 by an epitaxial deposition process, which may employ a chemical vapor deposition process. The single-crystalline III-V compound semiconductor layer 930 can be epitaxially aligned to the single crystalline material of the single-crystalline germanium-containing layer 920.

In one embodiment, the single-crystalline III-V compound semiconductor layer 930 may be intrinsic or may have a doping of a first conductivity type, which may be p-type or n-type. The atomic concentration of dopants of the first conductivity type in the single-crystalline III-V compound semiconductor layer 930 may be in a range from $1.0 \times 10^{15}/cm^3$ to $1.0 \times 10^{18}/cm^3$, such as from $1.0 \times 10^{16}/cm^3$ to $1.0 \times 10^{17}/cm^3$, although lesser and greater atomic concentrations can also be employed. In one embodiment, the first conductivity type may be p-type, and the single-crystalline III-V compound semiconductor layer 930 can include p-doped GaAs. The thickness of the single-crystalline III-V compound semiconductor layer 930 can be in a range from 100 nm to 500 nm, such as 200 nm to 300 nm, although lesser and greater thicknesses may also be employed.

The first exemplary structure may include a memory array region 100 in which a memory array is to be subsequently formed, a staircase region 300 in which contact via structures to word lines are to be subsequently formed, and an optional peripheral region 200 in which peripheral semiconductor devices are to be subsequently formed. If present, the peripheral region 200 may be employed to provide a logic (i.e., driver) circuit including field effect transistors and configured to control operation of memory elements in the memory array to be subsequently formed. Alternatively, the driver circuit may be formed below the memory array region 100 or on a separate substrate from the memory array region 100 and then bonded to the memory array region 100.

Figure 2:
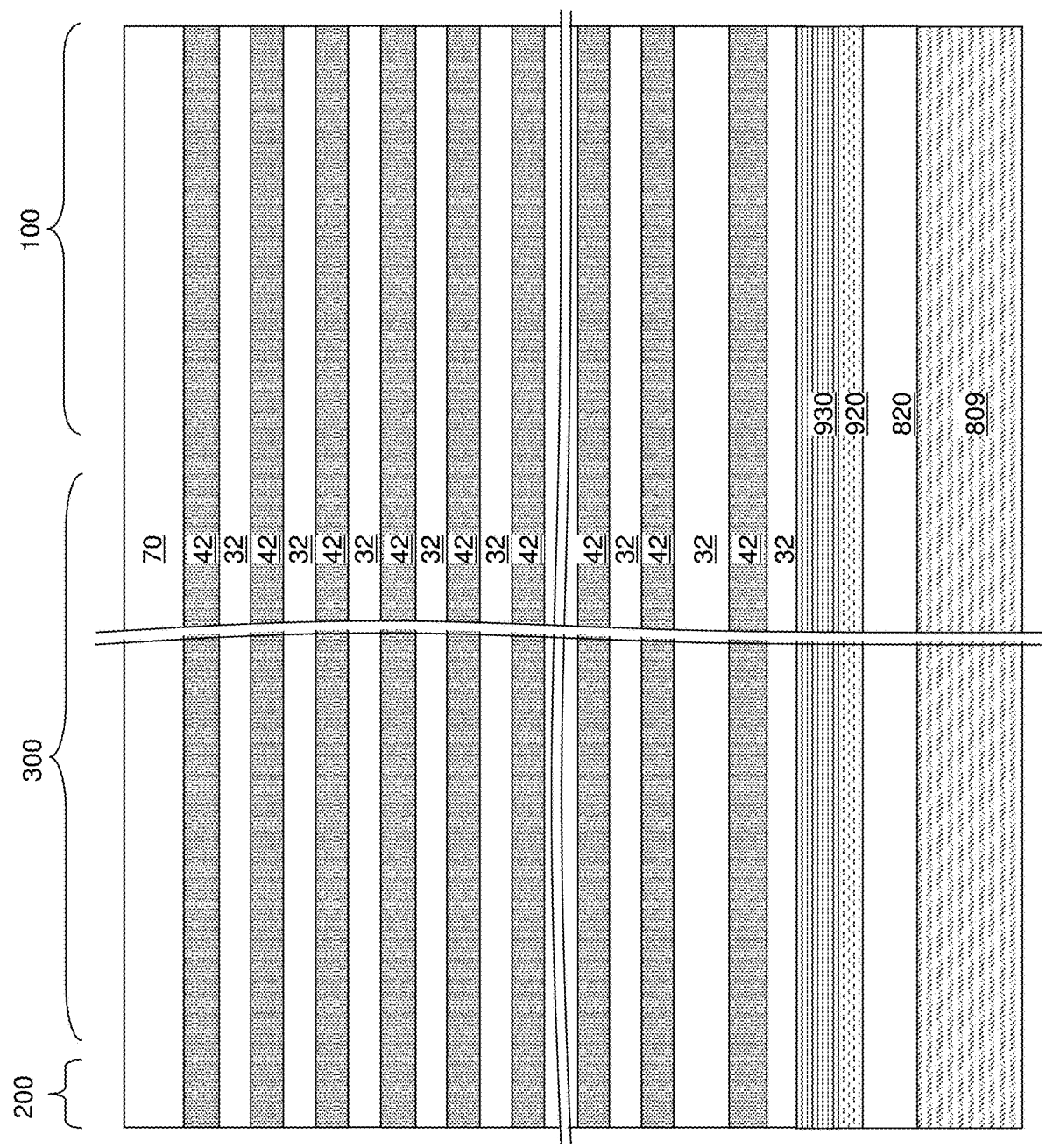
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of insulating layers 32 and spacer material layers can be formed over the top surface of the single-crystalline III-V compound semiconductor layer 930. The spacer material layers may be formed as electrically conductive layers, or may be formed as sacrificial material layers 42 and may be subsequently replaced with electrically conductive layers. While the present disclosure is described employing an embodiment in which the spacer material layers are sacrificial material layers 42 that are subsequently replaced with electrically conductive layers, embodiments are expressly contemplated herein in which electrically conductive layers are formed instead of sacrificial material layers 42. In this case, steps for replacing the sacrificial material layers 42 with electrically conductive layers can be omitted.

The stack of the alternating plurality is herein referred to as an alternating stack (32, 42). The insulating layers 32 include a first material, which is an insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 comprise, and/or consists essentially of, silicon oxide.

The spacer material layers include a second material that is different from the first material. In case the spacer material layers are formed as the sacrificial material layers 42, the sacrificial material layers 42 include a sacrificial material that can be subsequently removed selective to the material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 comprise, and/or consist essentially of, an insulating material, a semiconductor material, or a conductive material. The sacrificial material layers 42 can be subsequently replaced with electrically conductive electrodes which can function, for example, as control gate electrodes of a vertical NAND device. Non-limiting examples of the sacrificial material that can be employed for the sacrificial material include silicon nitride, an amorphous semiconductor material (such as amorphous silicon), and a polycrystalline semiconductor material (such as polysilicon). In one embodiment, the sacrificial material layers 42 can include silicon nitride.

In one embodiment, the insulating layers 32 can include silicon oxide, and sacrificial material layers can include silicon nitride sacrificial material layers. The insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The sacrificial material layers 42 can be formed, for example, CVD or atomic layer deposition (ALD). The thicknesses of the insulating layers 32) and the sacrificial material layers 42 can be in a range from 10 nm to 60 nm, such as from 20 nm to 40 nm, although lesser and greater thicknesses can be employed for each insulating layer 32 and for each sacrificial material layer 42. In some embodiments, the bottommost sacrificial material layer 42 may be subsequently replaced with an electrically conductive layer that functions as a source-side electrode that turns on or turns off a horizontal semiconductor channel that is formed in the top surface portions of the single-crystalline III-V compound semiconductor layer 930.

The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
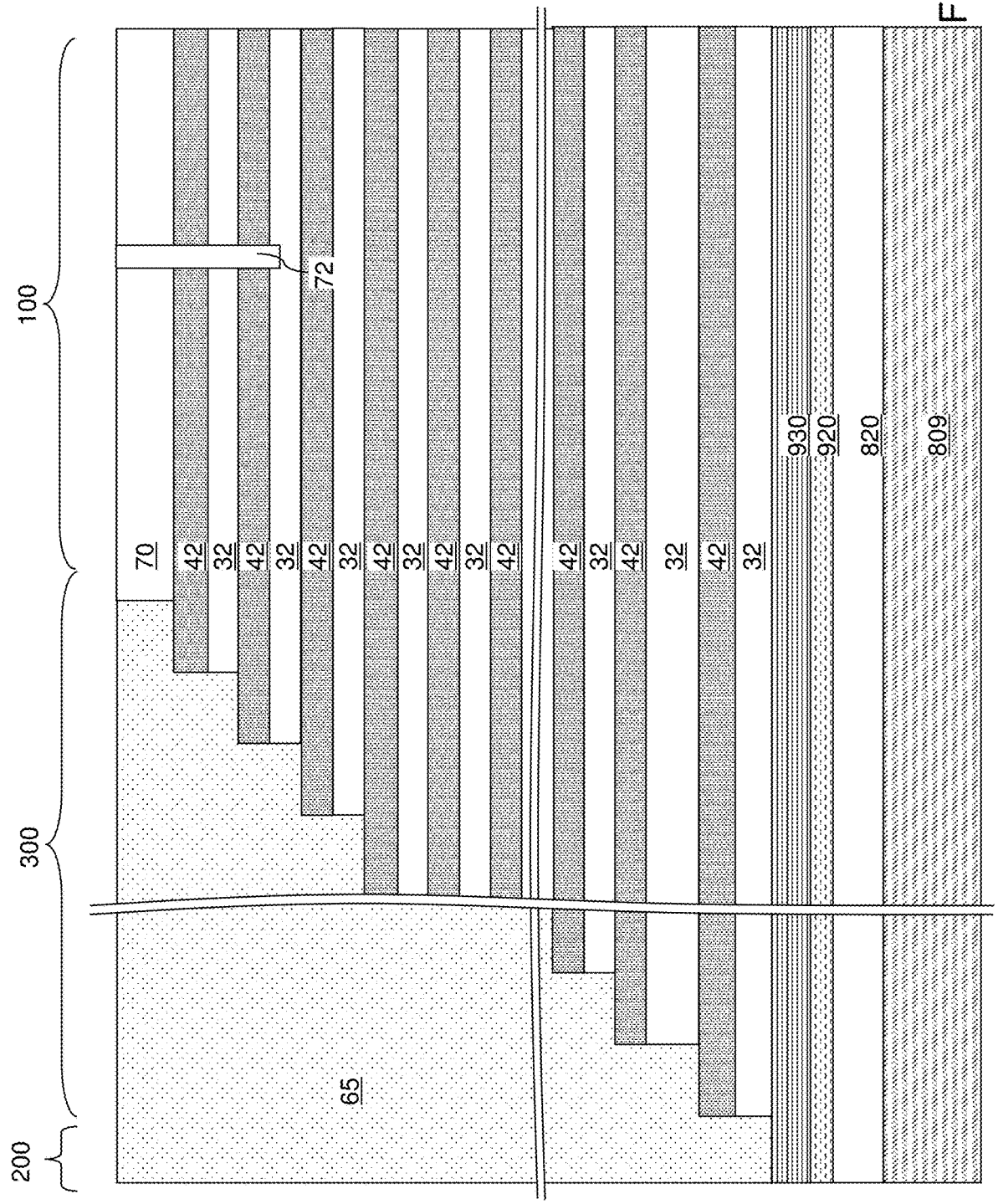
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces. The terrace region is formed in the staircase region 300, which is located between the memory array region 100 and the peripheral region 200 containing the at least one semiconductor device for the peripheral circuitry.

The stepped cavity can have various stepped surfaces such that the horizontal cross-sectional shape of the stepped cavity changes in steps as a function of the vertical distance from the top surface of the single-crystalline III-V compound semiconductor layer 930. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
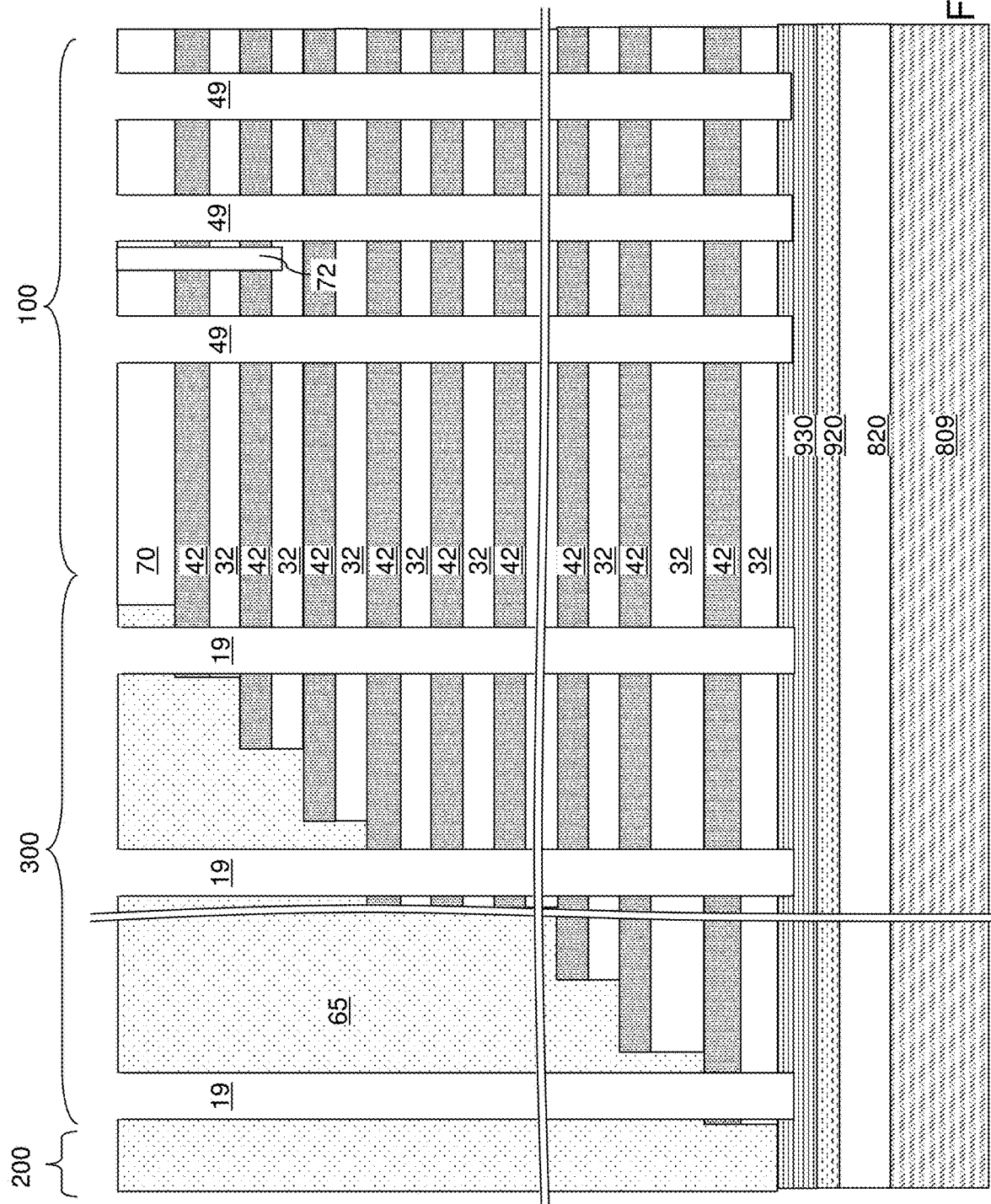
FIG. 4A is a schematic vertical cross-sectional view of the first exemplary structure after formation of memory openings and support openings according to the first embodiment of the present disclosure.
Figure 4B:
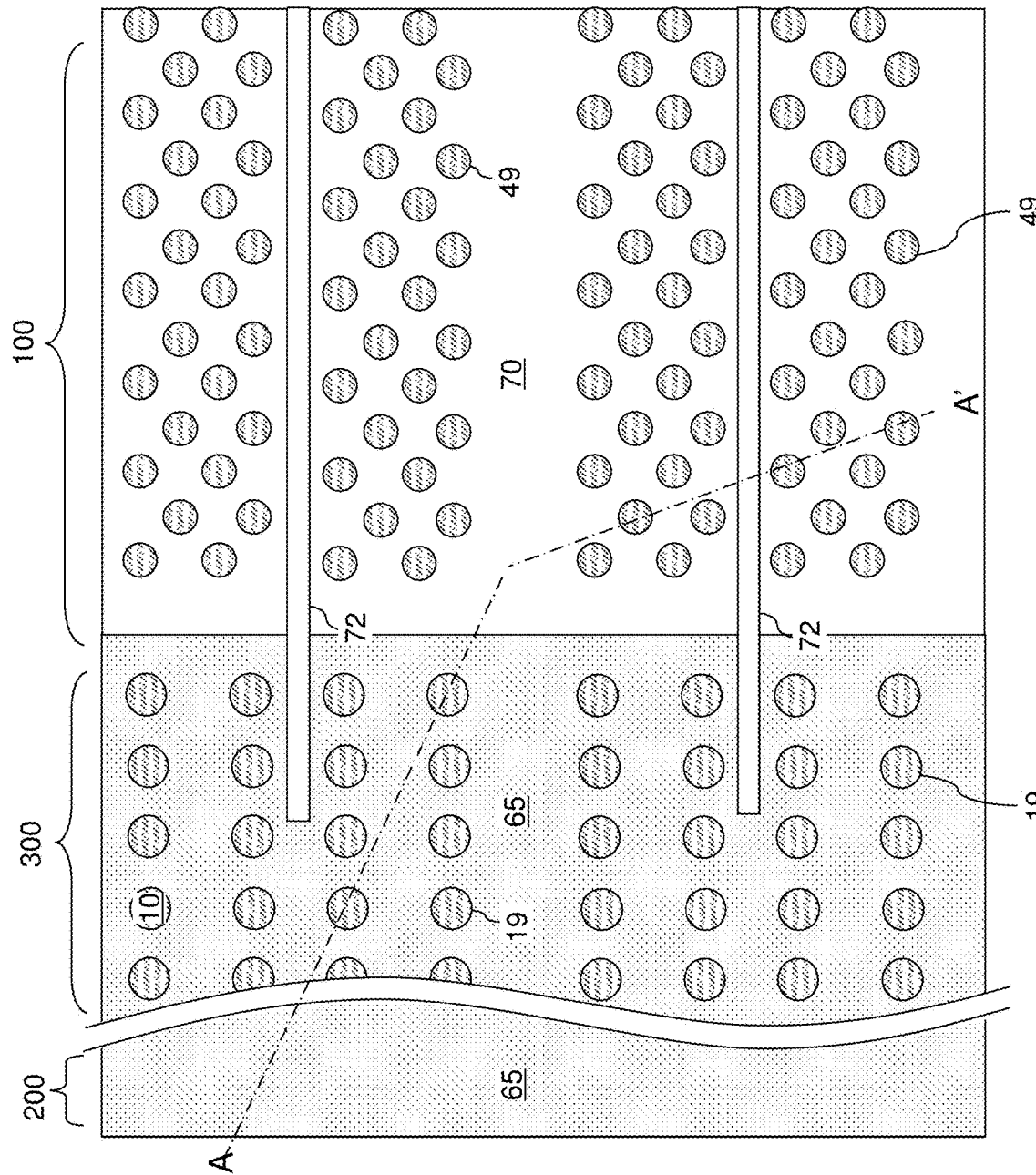
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the single-crystalline III-V compound semiconductor layer 930. In one embodiment, an overetch into the single-crystalline III-V compound semiconductor layer 930 may be optionally performed after the top surface of the single-crystalline III-V compound semiconductor layer 930 is physically exposed at a bottom of each memory opening 49 and each support opening 19. The overetch may be performed prior to, or after, removal of the lithographic material stack. In other words, the recessed surfaces of the single-crystalline III-V compound semiconductor layer 930 may be vertically offset from the un-recessed top surfaces of the single-crystalline III-V compound semiconductor layer 930 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the single-crystalline III-V compound semiconductor layer 930.

Each of the memory openings 49 and the support openings 19 may include a sidewall (or a plurality of sidewalls) that extends substantially perpendicular to the topmost surface of the single-crystalline III-V compound semiconductor layer 930. A two-dimensional array of memory openings 49 can be formed in the memory array region 100. A two-dimensional array of support openings 19 can be formed in the staircase region 300.

FIGS. 5A-5K illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the single-crystalline III-V compound semiconductor layer 930. At this processing step, each support opening 19 can extend through the retro-stepped dielectric material portion 65, a subset of layers in the alternating stack (32, 42), and optionally through the upper portion of the single-crystalline III-V compound semiconductor layer 930. The recess depth of the bottom surface of each memory opening with respect to the top surface of the single-crystalline III-V compound semiconductor layer 930 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional III-V compound semiconductor pedestal (e.g., an epitaxial pedestal) 11 can be formed at the bottom portion of each memory opening 49 and each support openings 19, for example, by selective epitaxy. Each III-V compound semiconductor pedestal 11 comprises a single crystalline III-V compound semiconductor material in epitaxial alignment with the single crystalline semiconductor material of the single-crystalline III-V compound semiconductor layer 930. The III-V compound semiconductor pedestal 11 can be formed by selectively growing a single crystalline III-V compound semiconductor material from a physically exposed portion of a top surface of the single-crystalline III-V compound semiconductor layer 930 at the bottom of the memory opening 49. Each III-V compound semiconductor pedestal 11 can include any of the III-V compound semiconductor materials that may be employed for the single-crystalline III-V compound semiconductor layer 930. The single crystalline III-V compound semiconductor material of the III-V compound semiconductor pedestals 11 may be the same as, or may be different from, the III-V compound semiconductor material of the single-crystalline III-V compound semiconductor layer 930. In one embodiment, the top surface of each III-V compound semiconductor pedestal 11 can be formed above a horizontal plane including the top surface of a bottommost sacrificial material layer 42. In this case, a source select gate electrode can be subsequently formed by replacing the bottommost sacrificial material layer 42 with a conductive material layer. The III-V compound semiconductor pedestal 11 can be a portion of a transistor channel. The transistor channel extends between a source region to be subsequently formed on the single-crystalline III-V compound semiconductor layer 930 and a drain region to be subsequently formed in an upper portion of the memory opening 49. A memory cavity 49' is present in the unfilled portion of the memory opening 49 above the III-V compound semiconductor pedestal 11. In one embodiment, the III-V compound semiconductor pedestal 11 can have a doping of the first conductivity type, which is the same as the conductivity type of the single-crystalline III-V compound semiconductor layer 930 that the III-V compound semiconductor pedestal 11 contacts. In one embodiment, the single crystalline III-V compound semiconductor material of the III-V compound semiconductor pedestals 11 may include p-type doped ("p-doped") GaAs or InGaAs.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart. The charge storage layer 54 can be formed as a single charge storage layer of homogeneous composition, or can include a stack of multiple charge storage layers. The multiple charge storage layers, if employed, may, or may not, comprise a plurality of spaced-apart floating gate material layers that contain conductive materials and/or semiconductor materials. Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one III-V compound semiconductor material. The at least one III-V compound semiconductor material has a doping of the first conductivity type, i.e., the same conductivity type as the conductivity type of the single-crystalline III-V compound semiconductor layer 930 and the III-V compound semiconductor pedestals 11. In one embodiment, the first semiconductor channel layer 601 includes p-doped GaAs or InGaAs. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the III-V compound semiconductor pedestal 11 (or a surface of the single-crystalline III-V compound semiconductor layer 930 in case the III-V compound semiconductor pedestals 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the III-V compound semiconductor pedestal 11 (or of the single-crystalline III-V compound semiconductor layer 930 in case III-V compound semiconductor pedestals 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surfaces of the III-V compound semiconductor pedestal 11 (or the single-crystalline III-V compound semiconductor layer 930 if the III-V compound semiconductor pedestal 11 is omitted), and directly on the first semiconductor channel layer 601. The second semiconductor channel layer 602 includes at least one III-V compound semiconductor material. In one embodiment, the second semiconductor channel layer 602 includes the same III-V compound semiconductor material as the first semiconductor channel layer 601. The second semiconductor channel layer 602 can have a doping of the first conductivity type. For example, the second semiconductor channel layer 602 can include p-doped GaAs or InGaAs. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material, which may be a polycrystalline III-V compound semiconductor material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5H, portions of the first semiconductor channel layer 601 and the second semiconductor channel layer 602 that are located above the horizontal plane including the top surface of the dielectric core 62 can be removed, for example, by performing a selective isotropic etch process that etches the semiconductor materials of the semiconductor channel layers (601, 602) selective to the dielectric materials of the insulating cap layer 70 and the memory film 50. Each remaining portion of the semiconductor channel layers (601, 602) comprises a vertical semiconductor channel 60. The III-V compound material of the vertical semiconductor channel 60 is herein referred to as a III-V compound semiconductor channel material. In one embodiment, the first semiconductor channel layer 601 and the second semiconductor channel layer 602 may have a same material composition. In another embodiment, an anneal process can be formed at this processing step or at a later processing step to homogenize the material composition in the vertical semiconductor channel 60. In this case, the III-V compound semiconductor channel material of the vertical semiconductor channel 60 can have a fixed band gap, which is the band gap of the III-V compound semiconductor material of the vertical semiconductor channel 60.

Figure 5J:
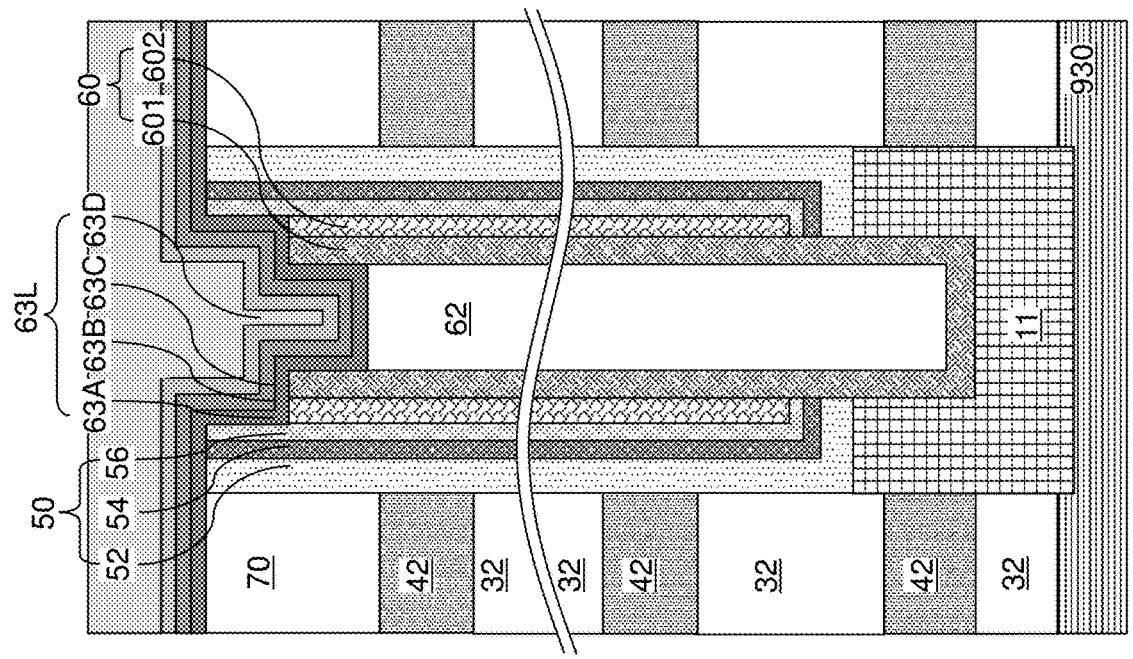
Figure 5I:
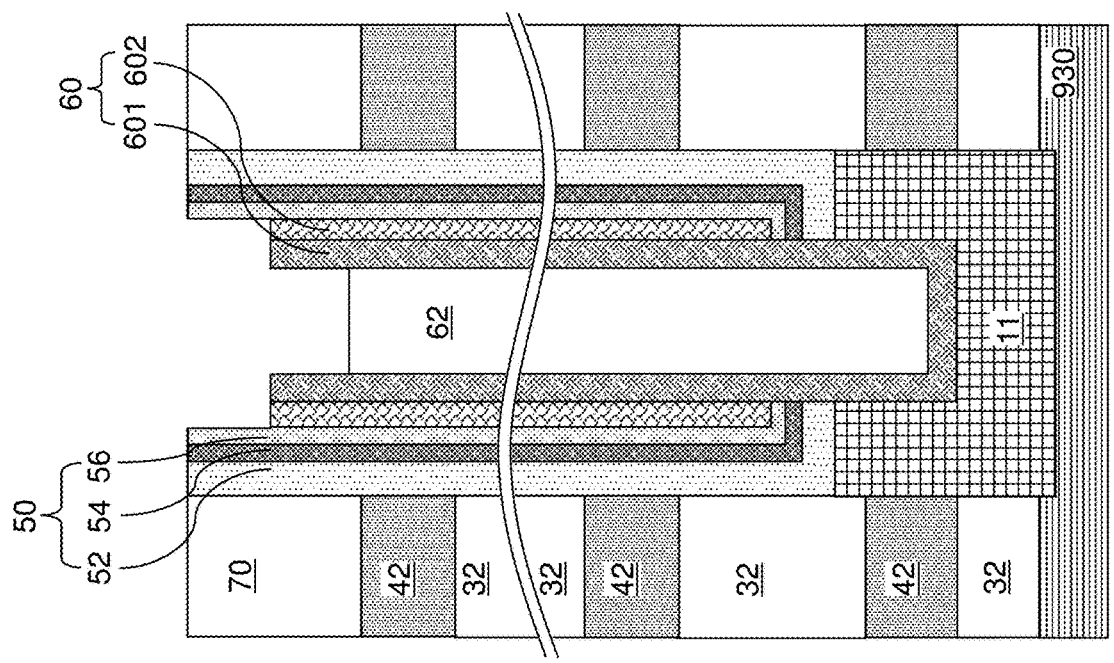

Referring to FIG. 5I, the dielectric core 62 can be vertically recess below the horizontal top surfaces of the vertical semiconductor channel 60. The top surface of the dielectric core 62 may be recessed down to, or below, the horizontal plane including the top surface of the topmost sacrificial material layer 42. Top portions of the inner sidewall of the second semiconductor channel layer 602 can be physically exposed to the recess region that is formed over the dielectric core 62. The recess region can have an upper portion that is laterally bounded by the memory film 50 and a lower portion that is laterally bounded by the inner sidewall of the second semiconductor channel layer 602.

Referring to FIG. 5J, a graded III-V compound semiconductor material layer 63L can be deposited over the dielectric core 62, the vertical semiconductor channel 60, and the insulating cap layer 70. In one embodiment, the graded III-V compound semiconductor material layer 63L includes a layer stack of at least two discrete III-V compound semiconductor material layers (63A, 63B, 63C, 63D) having different material compositions and having a doping of a second conductivity type that is the opposite of the first conductivity type. Specifically, the III-V compound semiconductor material layers (63A, 63B, 63C, 63D) may include at least two III-V compound semiconductor material layers such as three or more III-V compound semiconductor material layers having a respective band gap. The band gaps of the III-V compound semiconductor material layers (63A, 63B, 63C, 63D) are selected such that the band gap of the first III-V compound semiconductor material layer 63A that is deposited directly on the vertical semiconductor channel 60 may substantially match or be slightly greater than the band gap of the vertical semiconductor channel 60. Subsequently deposited III-V compound semiconductor material layers (63B, 63C, 63D) have a respective band gap that is less than the band gap of any previously deposited III-V compound semiconductor material layer.

In an illustrative example, the III-V compound semiconductor channel material of the vertical semiconductor channel 60 can include p-doped GaAs or InGaAs, and the III-V compound semiconductor material layers (63A, 63B, 63C, 63D) can include a first III-V compound semiconductor material layer 63A including n-doped GaAs or InGaAs and having the same band gap or substantially the same band gap as the vertical semiconductor channel 60. For example, if the vertical semiconductor layer 60 comprises p-doped GaAs, then the first III-V compound semiconductor material layer 63A comprises n-doped GaAs or n-doped InGaAs having a formula $In_xGa_{1-x}As$, where $0<x<0.1$. If the vertical semiconductor layer 60 comprises p-doped InGaAs having a formula $In_yGa_{1-y}As$, then the first III-V compound semiconductor material layer 63A comprises n-doped InGaAs having a formula $In_xGa_{1-x}As$, where $x>y$. The second III-V compound semiconductor material layer 63B is deposited on the first III-V compound semiconductor material layer 63A. The second III-V compound semiconductor material layer 63B comprises a n-doped InGaAs which contains more indium than the vertical semiconductor layer 60 and the first III-V compound semiconductor material layer 63A. For example, if the vertical semiconductor layer 60 comprises p-doped GaAs, then the second III-V compound semiconductor material layer 63B comprises n-doped InGaAs having a formula $In_zGa_{1-z}As$, where $z>0.1$, such as $0.1<z<0.3$. If the vertical semiconductor layer 60 comprises p-doped InGaAs having a formula $In_yGa_{1-y}As$, then the second III-V compound semiconductor material layer 63B comprises n-doped InGaAs having a formula $In_zGa_{1-z}As$, where $z>x>y$. The third III-V compound semiconductor material layer 63C may be deposited on the second III-V compound semiconductor material layer 63B. The third III-V compound semiconductor material layer 63C comprises a n-doped InGaAs which contains more indium than the second III-V compound semiconductor material layer 63B. The third III-V compound semiconductor material layer 63C may have a formula $In_pGa_{1-p}As$, where $p>z$, for example $0.3<p<0.5$. The fourth III-V compound semiconductor material layer 63D may be deposited on the third III-V compound semiconductor material layer 63C. The fourth III-V compound semiconductor material layer 63D comprises a n-doped InGaAs which contains more indium than the third III-V compound semiconductor material layer 63C. The fourth III-V compound semiconductor material layer 63D may have a formula $In_qGa_{1-q}As$, where $q>p$, for example $0.5<q<0.7$. Generally, the III-V compound semiconductor material of each successive III-V compound semiconductor material layer can be selected such that the band gap of each subsequently deposited III-V compound semiconductor material layer decreases relative to the band gap of an immediately preceding III-V compound semiconductor material layer.

While the present disclosure is described employing an embodiment in which the III-V compound semiconductor material layers (63A, 63B, 63C, 63D) include four III-V compound semiconductor material layers, two, three, four, or more layers can be included in the III-V compound semiconductor material layers (63A, 63B, 63C, 63D). Further, while an example in which the vertical semiconductor channel 60 includes n-doped GaAs or InGaAs, embodiments are expressly contemplated herein in which the vertical semiconductor channel 60 includes any III-V compound semiconductor material having a doping of a first conductivity type and having a fixed band gap. The III-V compound semiconductor material layers (63A, 63B, 63C, 63D) include any number of III-V compound semiconductor material layers. The III-V compound semiconductor material layer 63L may be deposited by non-selective III-V compound semiconductor deposition processes (such as chemical vapor deposition processes without concurrent flow of an etchant gas such as HCl), or by selective III-V compound semiconductor deposition process (such as chemical vapor deposition processes employing concurrent or alternating flow of an etchant gas).

The first III-V compound semiconductor material layer 63A that contacts the vertical semiconductor channel 60 has the same band gap as, or has substantially the same band gap as, the vertical semiconductor channel 60. Each subsequently deposited layer within the III-V compound semiconductor material layers (63A, 63B, 63C, 63D) has a lesser band gaps relative to the band gap of a respective preceding III-V compound semiconductor material layer. The layers in the III-V compound semiconductor material layers (63A, 63B, 63C, 63D) can have a doping of a second conductivity type that is the opposite of the first conductivity type. The thickness of each layer within the III-V compound semiconductor material layers (63A, 63B, 63C, 63D) can be selected such that each interface between layers within the III-V compound semiconductor material layers (63A, 63B, 63C, 63D) extends below the horizontal plane including the top surface of the vertical semiconductor channel 60. The total thickness of the III-V compound semiconductor material layers (63A, 63B, 63C, 63D) can be selected that the entire volume of the recess region overlying the vertical semiconductor channel 60 is filled with the III-V compound semiconductor material layers (63A, 63B, 63C, 63D).

While the present disclosure is described employing an embodiment in which the III-V compound semiconductor material layers (63A, 63B, 63C, 63D) are formed as discrete material layers, embodiments are expressly contemplated herein in which a single continuously graded III-V compound semiconductor material layer 63L replaces the III-V compound semiconductor material layers (63A, 63B, 63C, 63D). In this case, the continuously graded III-V compound semiconductor material layer has a composition gradient that provides a continuously decreasing band gap as a function of a distance from the interface with the vertical semiconductor channel 60. For example, the continuously graded III-V compound semiconductor material layer may include an InGaAs layer in which the atomic concentration of indium continuously increases as a function of a distance from the interface with the vertical semiconductor channel. The atomic concentration of indium in the continuously graded III-V compound semiconductor material layer may increase, for example, from 0% to 10% at the interface to a range from 50% to 100% at a distal portion of the continuously graded III-V compound semiconductor material layer. The graded III-V compound semiconductor material layer 63L includes a continuously decreasing band gap from the vertical semiconductor channel 60 to the top of the layer 63L. Thus, in this embodiment, layer 63L may be an InGaAs layer of a second conductivity type (e.g., n-doped InGaAs layer) having a continuously increasing indium content and a continuously decreasing gallium content starting from the interface with the vertical semiconductor channel and ending at the top surface of layer 63L. In one embodiment, the bottom surface of layer 63L may comprise a gallium rich InGaAs material or a GaAs material which contains essentially no indium. In one embodiment, the top surface of layer 63L may comprise an indium rich InGaAs material which has a higher indium content than the gallium rich InGaAs material, or an InAs material which contains essentially no gallium.

Figure 5K:
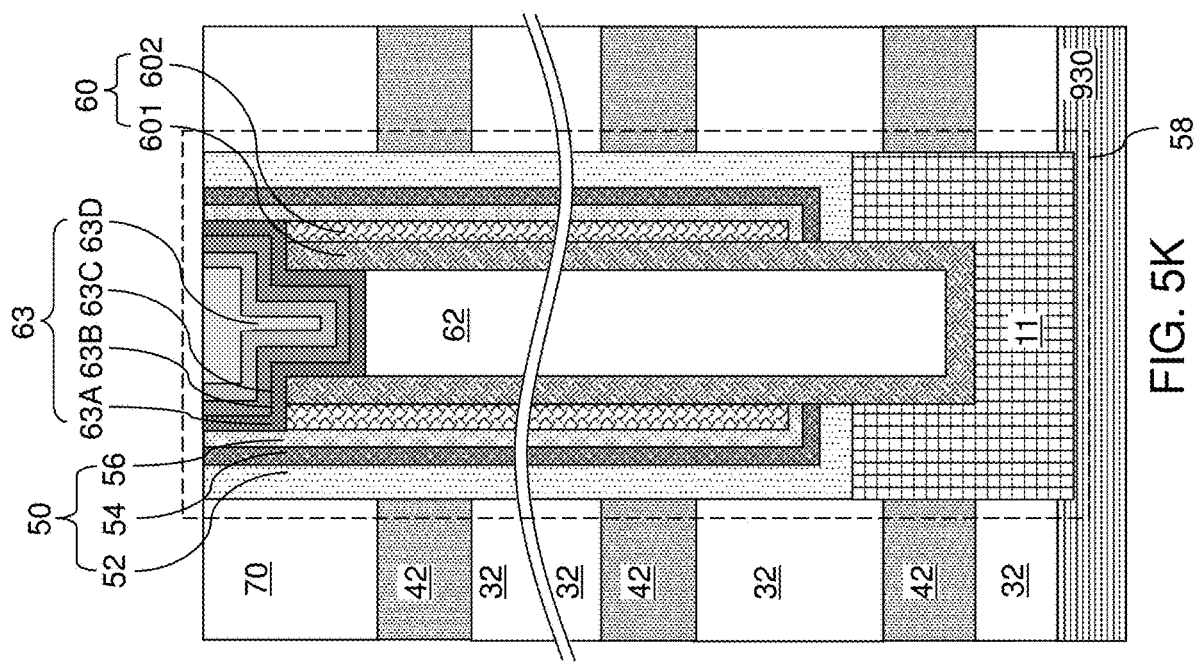

Referring to FIG. 5K, portions of the III-V compound semiconductor material layer 63L located above the horizontal plane including the top surface of the insulating cap layer 70 can be removed by performing a planarization process. For example, a chemical mechanical planarization process can be performed to remove portions of the III-V compound semiconductor material layer 63L located above the horizontal plane including the top surface of the insulating cap layer 70. Each remaining portion of the III-V compound semiconductor material layer 63L that fills a recess region and contacts a respective one of the vertical semiconductor channels 60 comprises a drain region 63. Each drain region 63 can include either plural layers of the III-V compound semiconductor material layers (63A, 63B, 63C, 63D) or one single continuously graded III-V compound semiconductor material layer.

Each drain region 63 is formed at an upper end of a respective vertical semiconductor channel 60. The III-V compound semiconductor pedestals 11, the vertical semiconductor channels 60, and the single-crystalline III-V compound semiconductor layer 930 have a doping of the first conductivity type, and each drain region 63 has a doping of the second conductivity type that is the opposite of the first conductivity type. Each drain region has a compositional gradient therein. The III-V compound semiconductor material layer(s) within each drain region 63 incudes a variable band gap (e.g., different discrete band gaps or a continuously graded band gap) that decrease with a distance from an interface between the drain region 63 and the vertical semiconductor channel 60.

According to an aspect of the present disclosure, the vertical semiconductor channel 60 within each memory opening 49 comprises a III-V compound semiconductor channel material. In one embodiment, the III-V compound semiconductor channel material has a fixed band gap that is uniform throughout the vertical semiconductor channel 60. The drain region 63 within each memory opening 49 has a variable band gap that varies within the drain region 63. In one embodiment, the variable band gap of the drain region 63 can monotonically decrease within the drain region 63 with a distance from an interface with the vertical semiconductor channel 60. The distance may be measured vertically from a horizontal interface, or may be measured horizontally from a vertical interface. As used herein, a quantity "monotonically decreases" with a parament if the value of the quantity does not increase for any increase in the parameter. In one embodiment, the variable band gap of the drain region 63 can decrease continuously or stepwise within the drain region 63 with a distance from an interface with the vertical semiconductor channel 60. As used herein, a quantity "decreases stepwise" with a parament if the value of the quantity decreases in steps as the value of the parameter increases.

In one embodiment, the III-V compound semiconductor channel material comprises a doped gallium arsenide channel material, and the drain region 63 comprises a layer stack including a doped gallium arsenide drain layer (which may comprise a first III-V compound semiconductor material layer 63A) and at least one doped indium gallium arsenide layer (which may be comprise one or more additional III-V compound semiconductor material layers (63B, 63C, 63D). In one embodiment, the drain region 63 comprises a plurality of doped indium gallium arsenide layers including indium atoms at different atomic indium percentages. In one embodiment, the difference between the variable band gap of the drain region 63 and the fixed band gap of the vertical semiconductor channel 60 monotonically increases within the drain region 63 with a distance from an interface with the vertical semiconductor channel 60. In one embodiment, the vertical semiconductor channel 60 comprises a cylindrical inner sidewall, a cylindrical outer sidewall, and an annular top surface extending between the cylindrical inner sidewall and the cylindrical outer sidewall. The drain region 63 contacts the annular top surface and an upper portion of the cylindrical inner sidewall of the vertical semiconductor channel 60. The dopant concentration of dopants of the second conductivity type in the drain region 63 can be in a range from $5.0 \times 10^{18}/cm^3$ to $2.0 \times 10^{21}/cm^3$, although lesser and greater dopant concentrations can also be employed.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements as embodied as portions of the charge storage layer 54, and a blocking dielectric layer 52. Each combination of a III-V compound semiconductor pedestal 11 (if present), a memory stack structure 55, a dielectric core 62, and a drain region 63 within a memory opening 49 is herein referred to as a memory opening fill structure 58. Each combination of a III-V compound semiconductor pedestal 11 (if present), a memory film 50, a vertical semiconductor channel 60, a dielectric core 62, and a drain region 63 within each support opening 19 fills the respective support openings 19, and constitutes a support pillar structure.

Figure 6:
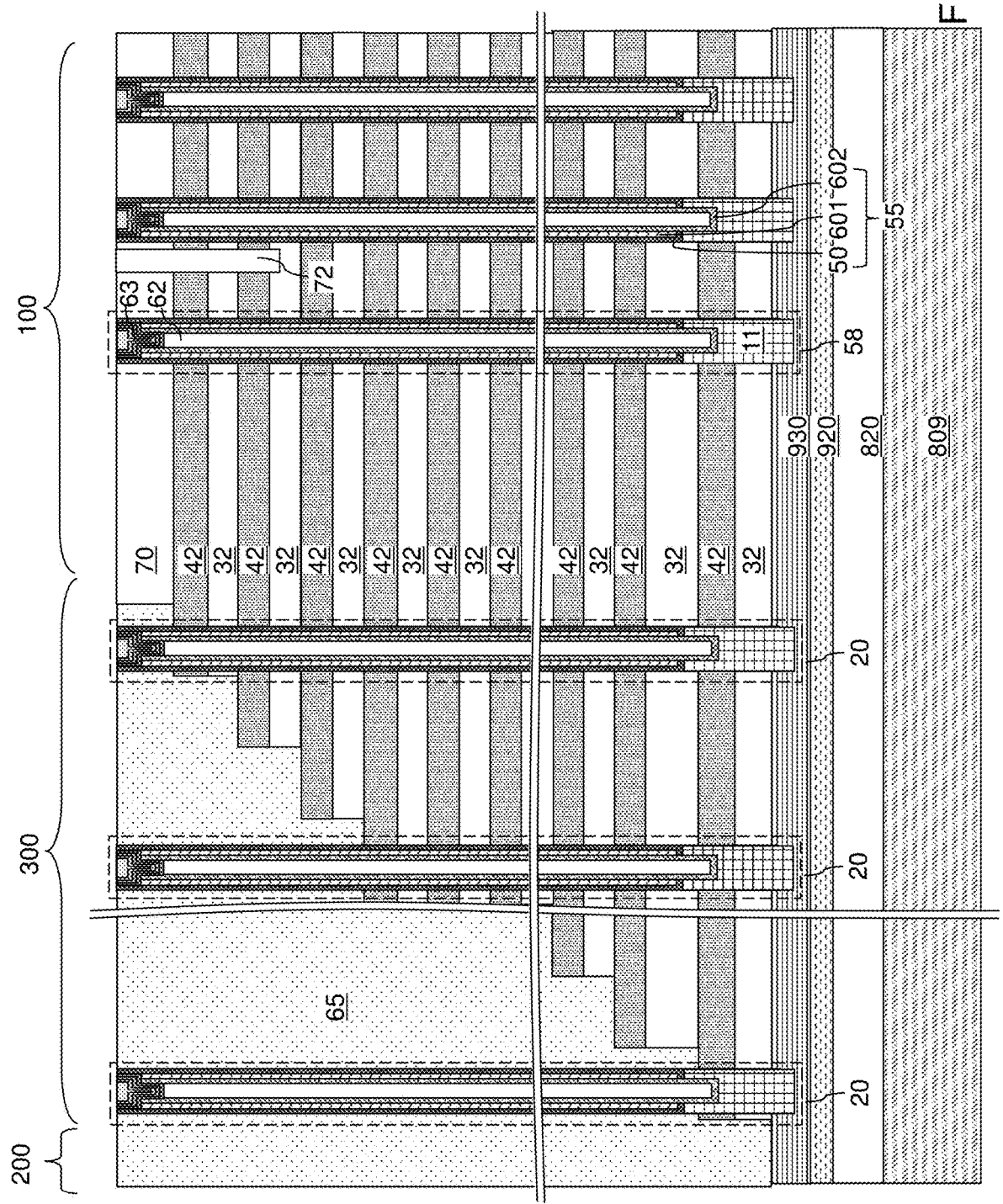
FIG. 6 is a schematic vertical cross-sectional view of the first exemplary structure after formation of memory stack structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 6A and 6B. An instance of the support pillar structure 20 can be formed within each support opening 19 of the structure of FIGS. 6A and 6B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

In one embodiment, each of the memory opening fill structures 58 comprises a III-V compound semiconductor pedestal 11 contacting a bottom end of a respective one of the vertical semiconductor channels 60 and contacting a top surface of the single-crystalline III-V compound semiconductor layer 930. Each III-V compound semiconductor pedestal 11 may be epitaxially aligned to the single-crystalline III-V compound semiconductor layer 930. Each memory film 50 comprises a layer stack including a blocking dielectric layer 52, a charge storage layer 54, and a tunneling dielectric layer 56 that contacts a respective one of the vertical semiconductor channels 60. Each vertical semiconductor channel 60 comprises a III-V compound semiconductor material, such as single crystalline III-V compound semiconductor material, e.g., single crystal GaAs. In one embodiment, each III-V compound semiconductor pedestal 11 and each vertical semiconductor channel 60 have a doping of a first conductivity type. The single-crystalline III-V compound semiconductor layer 930 may have a doping of the first conductivity type. Each vertical semiconductor channel 60 can have a bottom end that is electrically connected to the single-crystalline III-V compound semiconductor layer 930.

Figure 7A:
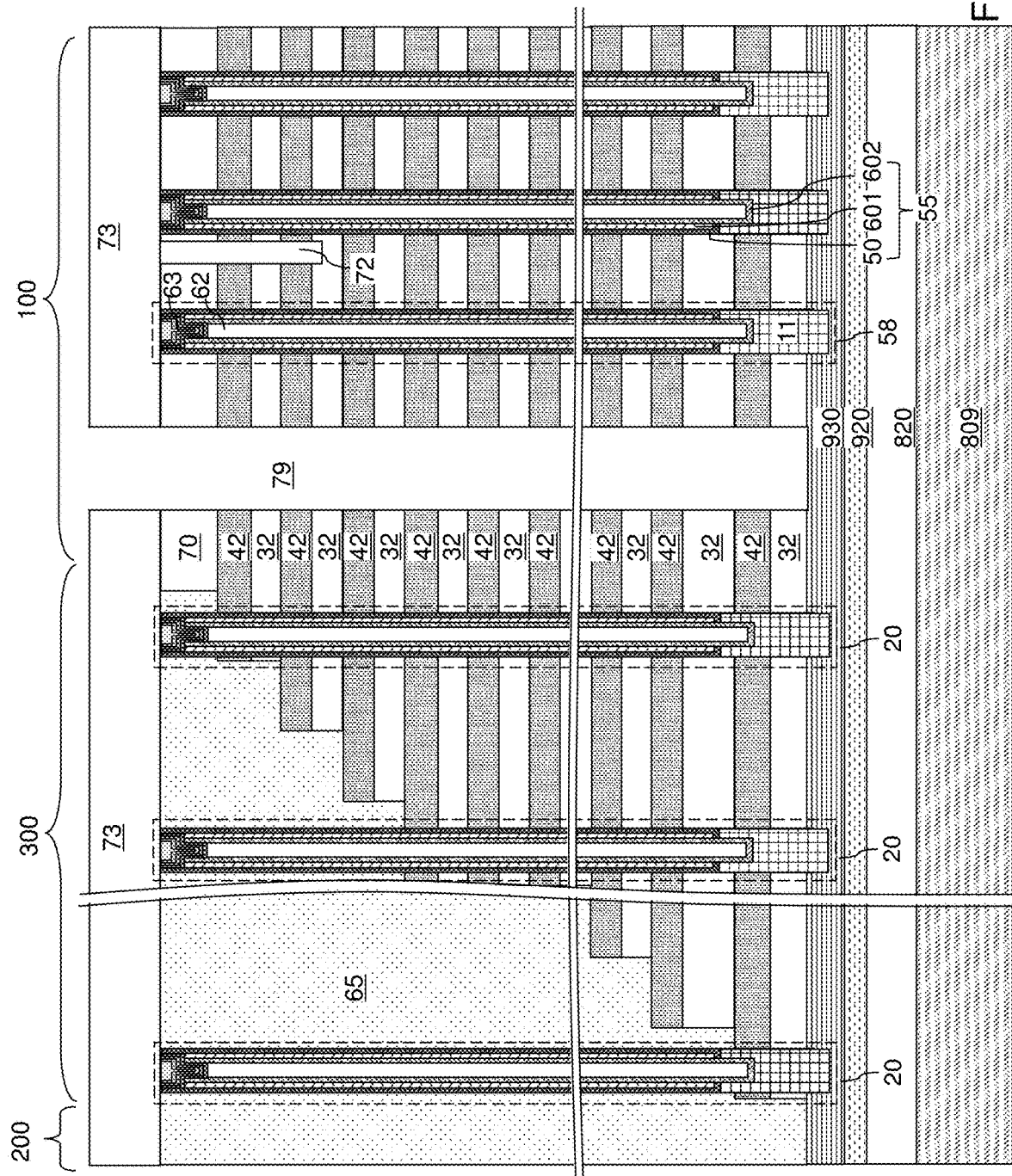
FIG. 7A is a schematic vertical cross-sectional view of the first exemplary structure after formation of backside trenches according to the first embodiment of the present disclosure.
Figure 7C:
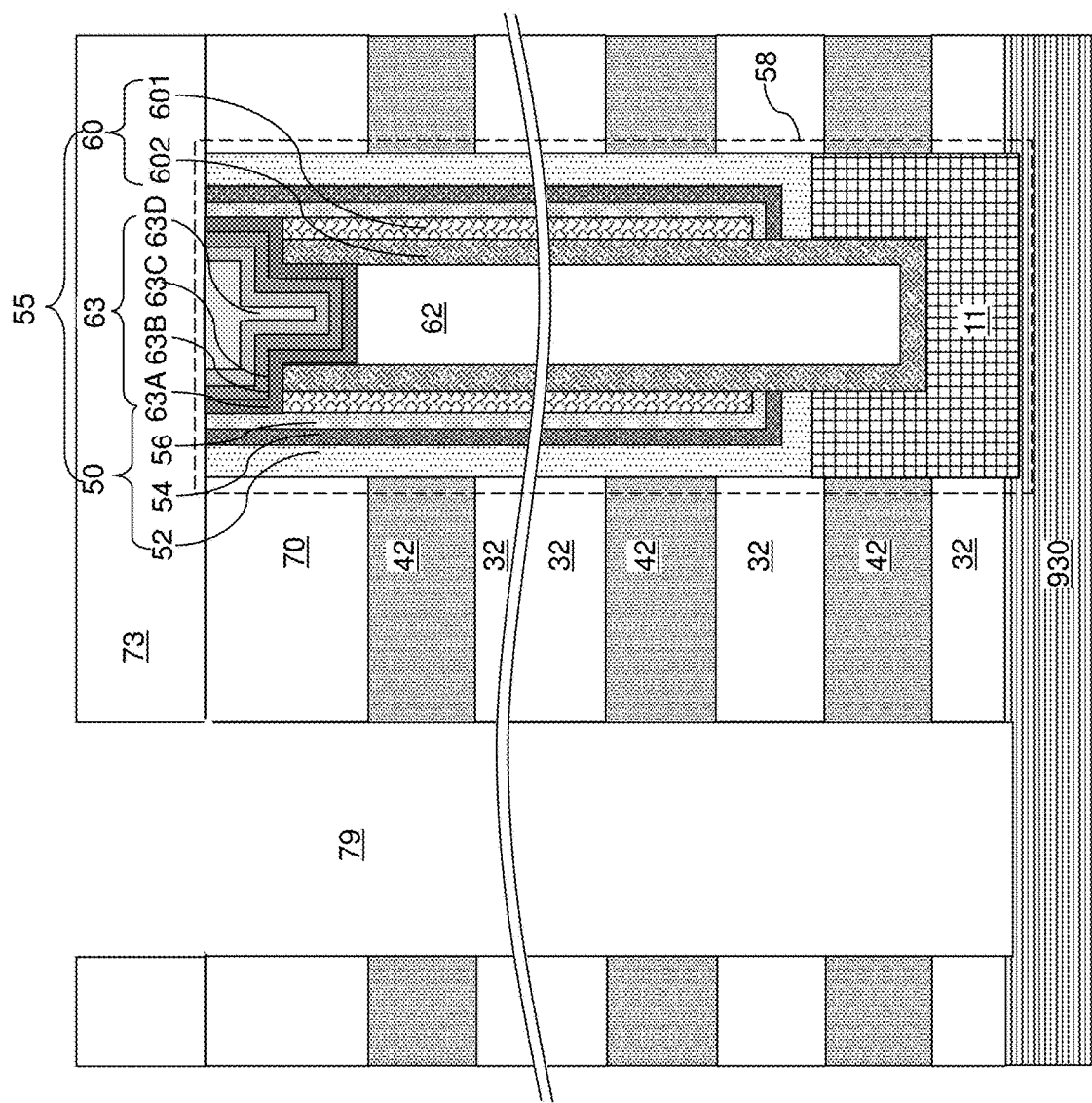
FIG. 7C is a vertical cross-sectional view of the first exemplary structure along the vertical plane C-C' of FIG. 7B.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the single-crystalline III-V compound semiconductor layer 930, and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. A top surface of the single-crystalline III-V compound semiconductor layer 930 is physically exposed at the bottom of each backside trench 79. The photoresist layer can be removed, for example, by ashing.

Figure 8:
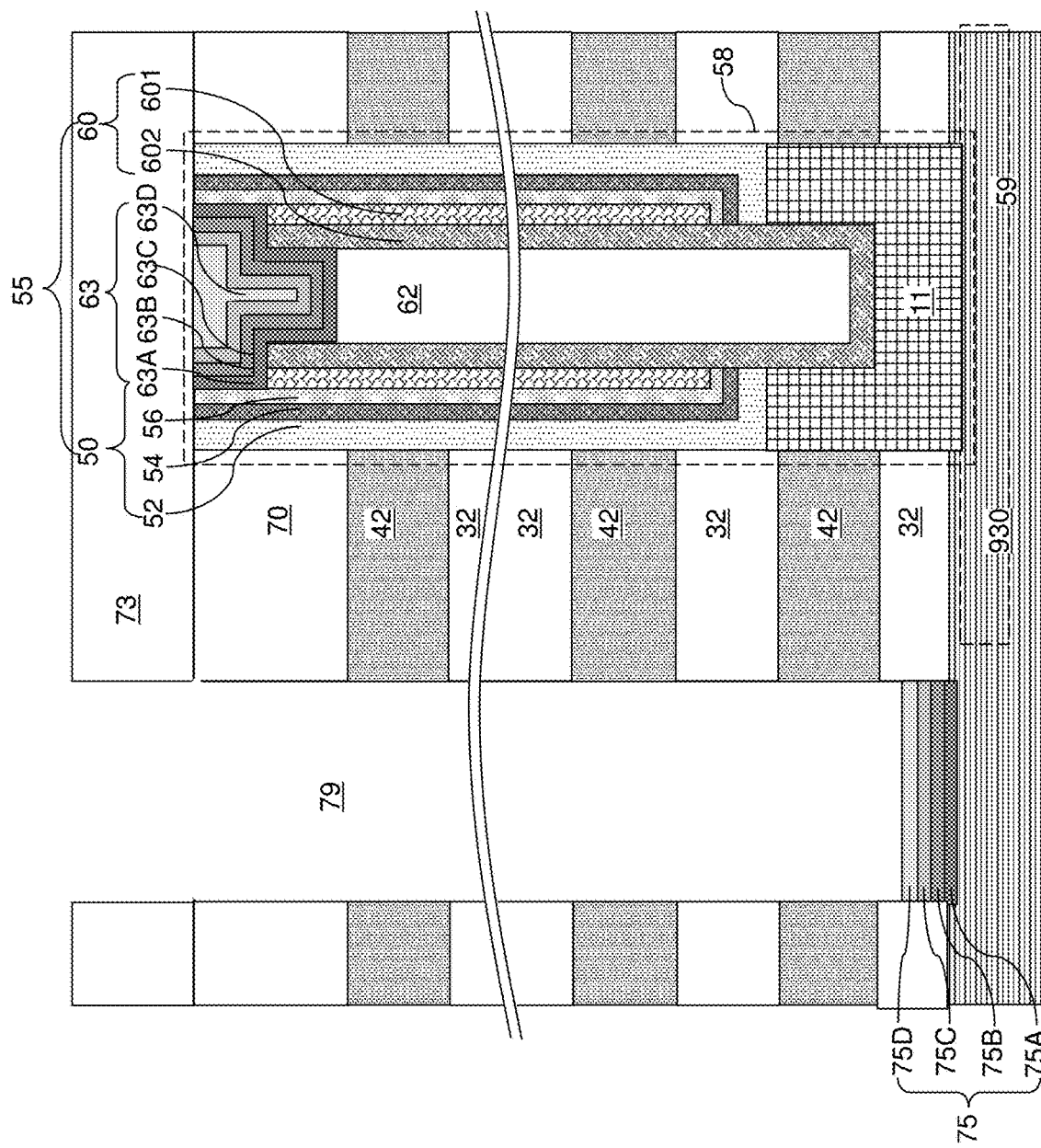
FIG. 8 is a schematic vertical cross-sectional view of the first exemplary structure after formation of a III-V compound semiconductor source region in each backside trench according to the first embodiment of the present disclosure.

Referring to FIG. 8, a III-V compound semiconductor source region 75 can be formed in each backside trench 79 by performing a series of selective III-V compound deposition processes. Each III-V compound semiconductor source region 75 includes a graded III-V compound semiconductor material layer, which may comprise a single continuously graded III-V compound semiconductor material layer or a layer stack including at least two discrete III-V compound semiconductor material layers (75A, 75B, 75C, 75D) having different material compositions and having a doping of the second conductivity type that is the opposite of the first conductivity type. Specifically, the III-V compound semiconductor material layers (75A, 75B, 75C, 75D) may include at least two III-V compound semiconductor material layers such as three or more III-V compound semiconductor material layers having a respective band gap. The band gaps of the III-V compound semiconductor material layers (75A, 75B, 75C, 75D) are selected that the band gap of a first III-V compound semiconductor material layer 75A that is deposited directly on the single-crystalline III-V compound semiconductor layer 930 substantially matches or is slightly smaller than the band gap of the single-crystalline III-V compound semiconductor layer 930. Subsequently deposited III-V compound semiconductor material layers (75B, 75C, 75D) have a respective band gap that is less than the band gap of any previously deposited III-V compound semiconductor material layer. The III-V compound semiconductor material layers (75A, 75B, 75C, 75D) may be deposited by selective III-V compound semiconductor deposition processes (such as chemical vapor deposition processes employing concurrent or alternating flow of an etchant gas).

In an illustrative example, the III-V compound semiconductor channel material of the single-crystalline III-V compound semiconductor layer 930 can include p-doped GaAs or InGaAs, and the III-V compound semiconductor material layers (75A, 75B, 75C, 75D) can include a first III-V compound semiconductor material layer 75A including n-doped GaAs or InGaAs and having the same band gap or substantially the same band gap as the single-crystalline III-V compound semiconductor layer 930. For example, if the single-crystalline III-V compound semiconductor layer 930 comprises p-doped GaAs, then the first III-V compound semiconductor material layer 75A comprises n-doped GaAs or n-doped InGaAs having a formula $In_xGa_{1-x}As$, where $0<x<0.1$. If the single-crystalline III-V compound semiconductor layer 930 comprises p-doped InGaAs having a formula $In_yGa_{1-y}As$, then the first III-V compound semiconductor material layer 75A comprises n-doped InGaAs having a formula $In_xGa_{1-x}As$, where $x>y$. The second III-V compound semiconductor material layer 75B is deposited on the first III-V compound semiconductor material layer 75A. The second III-V compound semiconductor material layer 75B comprises a n-doped InGaAs which contains more indium than the single-crystalline III-V compound semiconductor layer 930 and the first III-V compound semiconductor material layer 75A. For example, if the single-crystalline III-V compound semiconductor layer 930 comprises p-doped GaAs, then the second III-V compound semiconductor material layer 75B comprises n-doped InGaAs having a formula $In_zGa_{1-z}As$, where $z>0.1$, such as $0.1<z<0.3$. If the single-crystalline III-V compound semiconductor layer 930 comprises p-doped InGaAs having a formula $In_yGa_{1-y}As$, then the second III-V compound semiconductor material layer 75B comprises n-doped InGaAs having a formula $In_zGa_{1-z}As$, where $z>x>y$. The third III-V compound semiconductor material layer 75C may be deposited on the second III-V compound semiconductor material layer 75B. The third III-V compound semiconductor material layer 75C comprises a n-doped InGaAs which contains more indium than the second III-V compound semiconductor material layer 75B. The third III-V compound semiconductor material layer 75C may have a formula $In_pGa_{1-p}As$, where $p>z$, for example $0.3<p<0.5$. The fourth III-V compound semiconductor material layer 75D may be deposited on the third III-V compound semiconductor material layer 75C. The fourth III-V compound semiconductor material layer 75D comprises a n-doped InGaAs which contains more indium than the third III-V compound semiconductor material layer 75C. The fourth III-V compound semiconductor material layer 75D may have a formula $In_qGa_{1-q}As$, where $q>p$, for example $0.5<q<0.7$. Generally, the III-V compound semiconductor material of each successive III-V compound semiconductor material layer can be selected such that the band gap of each subsequently deposited III-V compound semiconductor material layer decreases relative to the band gap of an immediately preceding III-V compound semiconductor material layer.

While the present disclosure is described employing an embodiment in which the III-V compound semiconductor material layers (75A, 75B, 75C, 75D) include four III-V compound semiconductor material layers, two, three, four, or more layers can be included in the III-V compound semiconductor material layers (75A, 75B, 75C, 75D). Further, while an example in which each source region 75 includes n-doped GaAs or InGaAs, embodiments are expressly contemplated herein in which each source region 75 includes any III-V compound semiconductor material having a doping of the second conductivity type and having a variable band gap that increases stepwise or continuously with a vertical distance from an interface with the single-crystalline III-V compound semiconductor layer 930. Generally, the III-V compound semiconductor material layers (75A, 75B, 75C, 75D) include any number of III-V compound semiconductor material layers. The first III-V compound semiconductor material layer 75A that contacts the vertical semiconductor channel 60 has the same band gap as, or has substantially the same band gap as, the vertical semiconductor channel 60. Each subsequently deposited layer within the III-V compound semiconductor material layers (75A, 75B, 75C, 75D) has a lesser band gaps relative to the band gap of a respective preceding III-V compound semiconductor material layer. The layers in the III-V compound semiconductor material layers (75A, 75B, 75C, 75D) can have a doping of the second conductivity type. The thickness of each source region 75 can be in a range from 20 nm to 60 nm, and top surface of each source region 75 can be at, or below, the top surface of the bottommost insulating layer 32.

While an embodiment in which the III-V compound semiconductor material layers (75A, 75B, 75C, 75D) are formed as discrete material layers is described above, embodiments are expressly contemplated herein in which a single continuously graded III-V compound semiconductor material layer replaces the III-V compound semiconductor material layers (75A, 75B, 75C, 75D). In this case, the continuously graded III-V compound semiconductor material layer has a composition gradient that provides a continuously decreasing band gap as a function of a distance from the interface with the single-crystalline III-V compound semiconductor layer 930. For example, the continuously graded III-V compound semiconductor material layer may include an InGaAs layer in which the atomic concentration of indium continuously increases as a function of a distance from the interface with the single-crystalline III-V compound semiconductor layer 930. The atomic concentration of indium in the continuously graded III-V compound semiconductor material layer may increase, for example, from 0% to 10% at the interface to a range from 50% to 100% at a distal portion of the continuously graded III-V compound semiconductor material layer.

Generally, each source region 75 can be formed as a III-V compound semiconductor source region comprising a doped III-V compound material, and can be formed on the top surface of the single-crystalline III-V compound semiconductor layer 930. The III-V compound semiconductor source region comprises a graded III-V compound semiconductor material having a vertical compositional gradient that provides a variable band gap (e.g., varying continuously or step wise) that decreases with a vertical distance from an interface with the single-crystalline III-V compound semiconductor layer 930. The vertical composition gradient may be stepwise (i.e., including stepwise changes in composition) or may be gradual (i.e., including a continuous change in composition).

An upper portion of the single-crystalline III-V compound semiconductor layer 930 that extends between the source region 75 and the plurality of III-V compound semiconductor pedestals 11 constitutes a horizontal semiconductor channel 59 for a plurality of field effect transistors. The horizontal semiconductor channel 59 is connected to multiple vertical semiconductor channels 60 through respective III-V compound semiconductor pedestals 11. The horizontal semiconductor channel 59 contacts the source region 75 and the plurality of III-V compound semiconductor pedestals 11.

Figure 9A:
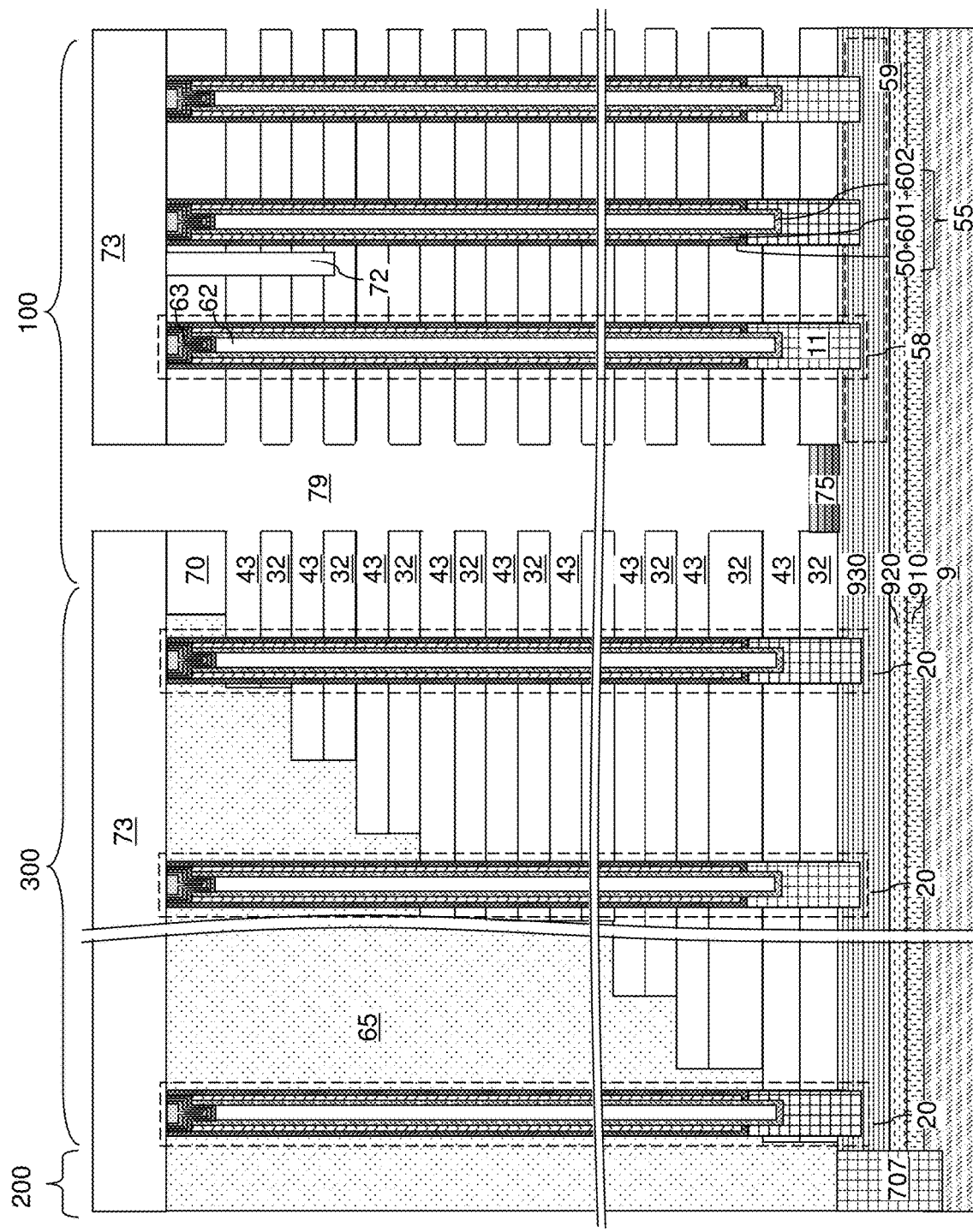
FIG. 9A is a schematic vertical cross-sectional view of the first exemplary structure after formation of backside recesses according to the first embodiment of the present disclosure.
Figure 9B:
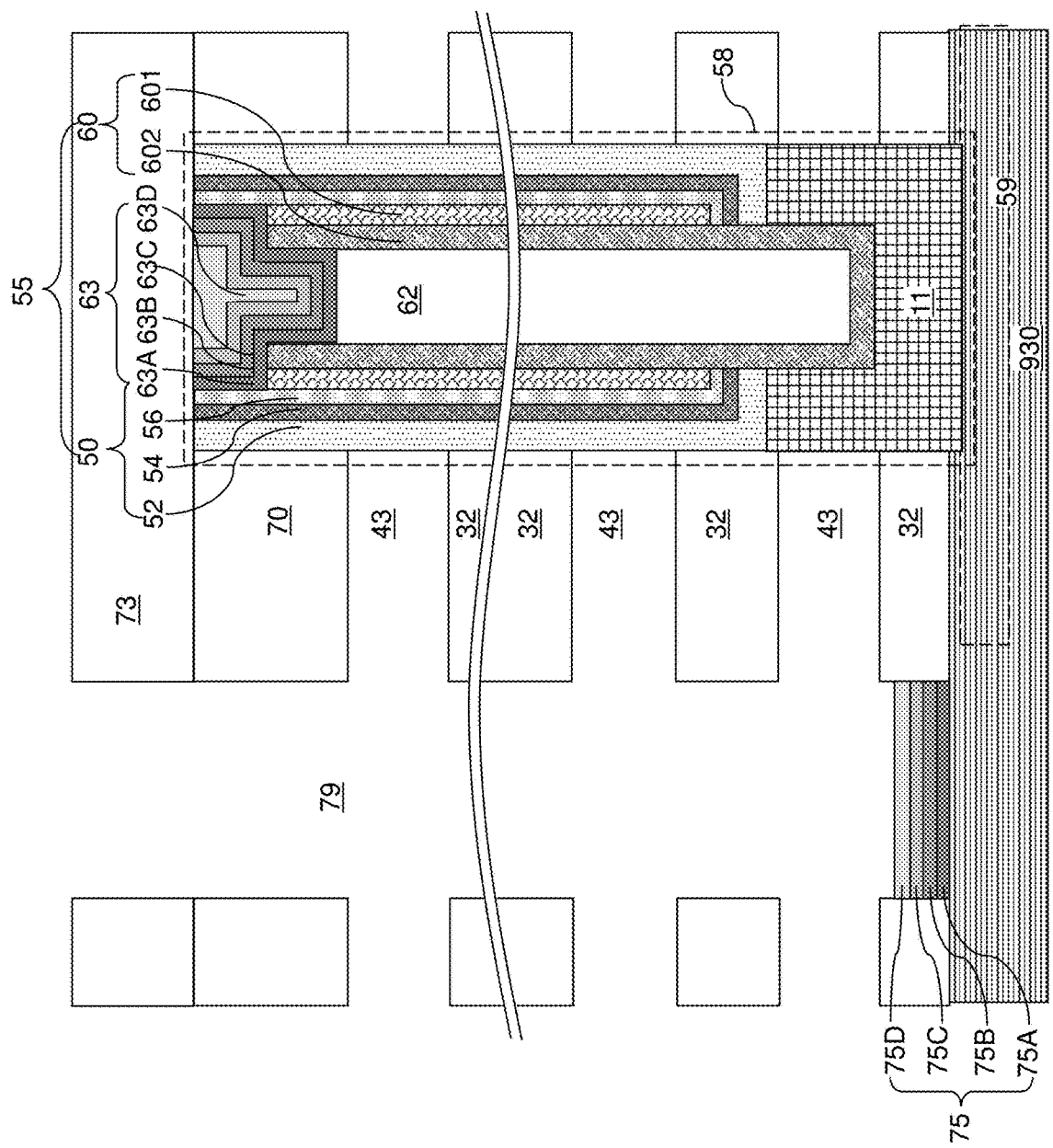
FIG. 9B is a magnified view of the first exemplary structure of FIG. 9A around a memory opening fill structure and a backside trench according to the first embodiment of the present disclosure.

Referring to FIGS. 9A and 9B, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the single-crystalline III-V compound semiconductor layer 930, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material (i.e., the spacer material such as the material of the sacrificial material layers 42) selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the single-crystalline III-V compound semiconductor layer 930. In this case, each backside recess 43 can define a space for receiving a respective word line of the array of monolithic three-dimensional NAND strings.

Each of the plurality of backside recesses 43 can extend substantially parallel to the top surface of the single-crystalline III-V compound semiconductor layer 930. A backside recess 43 can be vertically bounded by a top surface of an underlying insulating layer 32 and a bottom surface of an overlying insulating layer 32. In one embodiment, each backside recess 43 can have a uniform height throughout.

Figure 10:
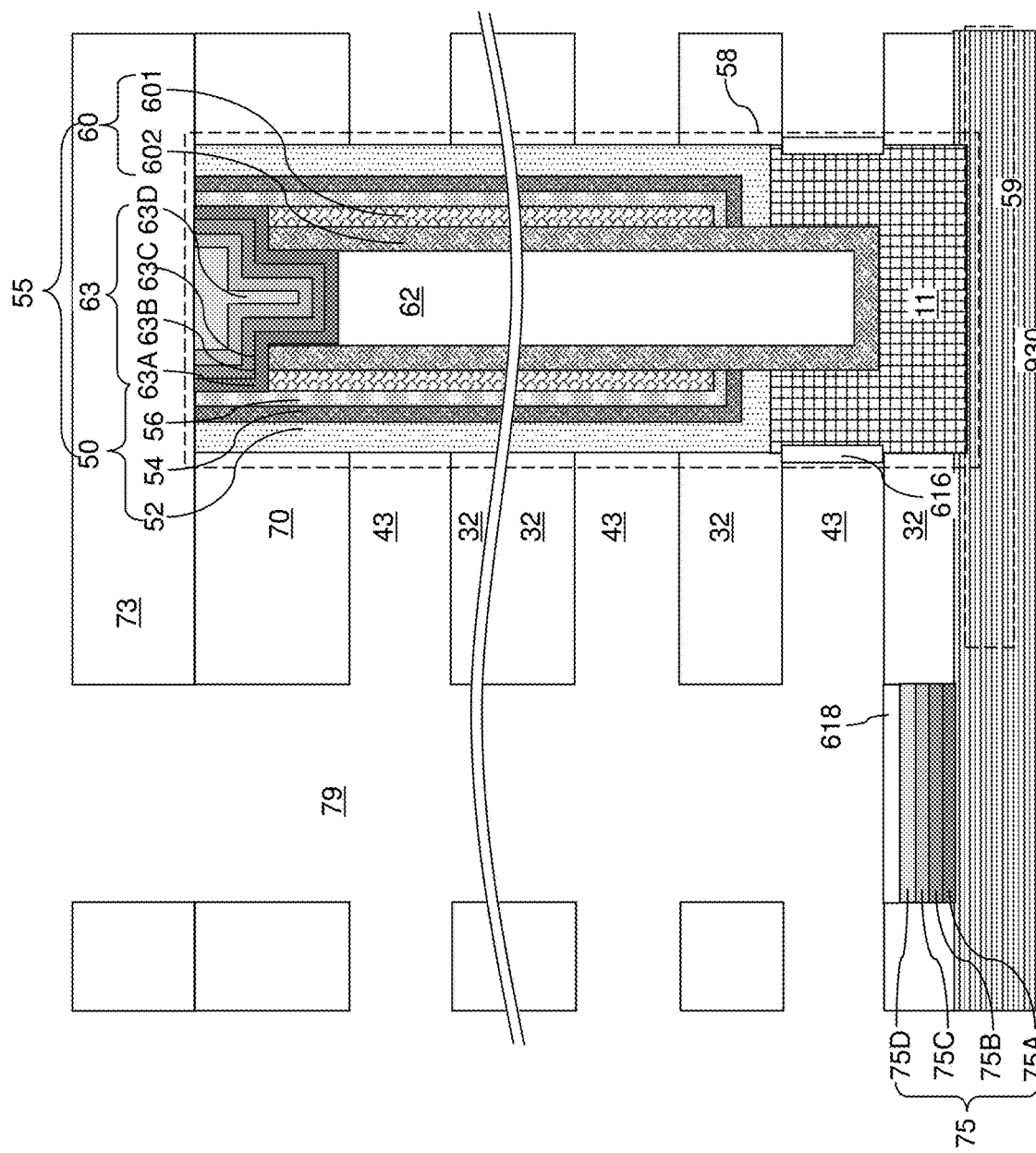
FIG. 10 is a schematic vertical cross-sectional view of the first exemplary structure after formation of semiconductor oxide material portions according to the first embodiment of the present disclosure.

Referring to FIG. 10, physically exposed surface portions of the optional III-V compound semiconductor pedestals 11 and the single-crystalline III-V compound semiconductor layer 930 can be converted into dielectric material portions by thermal conversion and/or plasma conversion of the semiconductor materials into dielectric materials. For example, thermal conversion and/or plasma conversion can be employed to convert a surface portion of each III-V compound semiconductor pedestal 11 into a tubular dielectric spacer 616, and to convert each physically exposed surface portion of the single-crystalline III-V compound semiconductor layer 930 into a planar dielectric portion 618. In one embodiment, each tubular dielectric spacer 616 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 616 include a dielectric material that includes the same semiconductor element as the III-V compound semiconductor pedestals 11 and additionally includes at least one non-metallic element such as oxygen and/or nitrogen such that the material of the tubular dielectric spacers 616 is a dielectric material. In one embodiment, the tubular dielectric spacers 616 can include a dielectric oxide derived from the semiconductor material of the III-V compound semiconductor pedestals 11. For example, the tubular dielectric spacers 616 can comprise, and/or can consist essentially of, gallium oxide. In one embodiment, the planar dielectric portions 616 can include a dielectric oxide derived from the semiconductor material of the single-crystalline III-V compound semiconductor layer 930. For example, the planar dielectric portions 616 can comprise, and/or can consist essentially of, indium oxide or indium gallium oxide. Dopants in the drain regions 63, the source regions 75, and the semiconductor channels 60 can be activated during the anneal process that forms the planar dielectric portions 616 and the tubular dielectric spacers 616. Alternatively, an additional anneal process may be performed to active the electrical dopants in the drain regions 63, the source regions 75, and the semiconductor channels 60.

Figure 11:
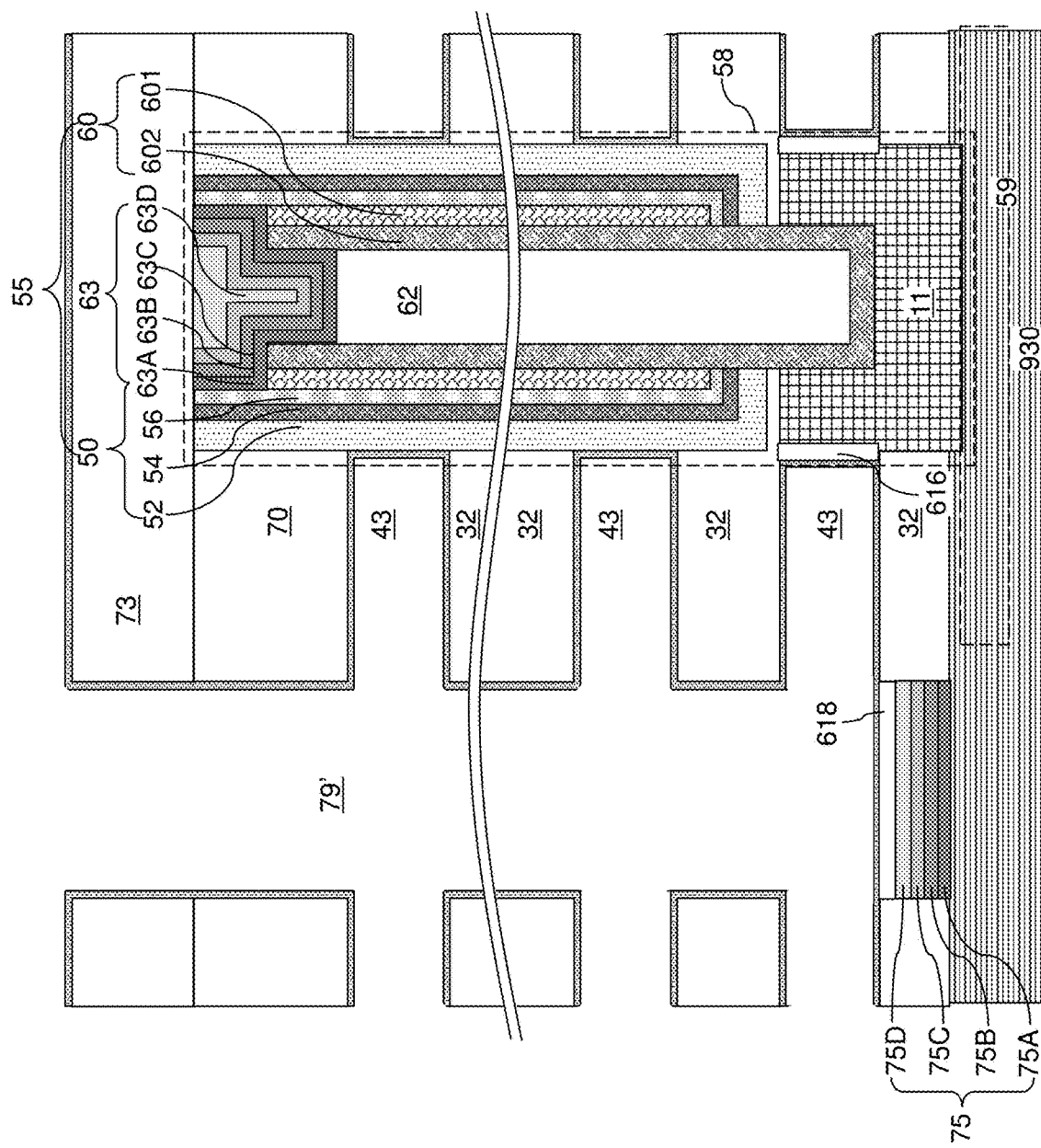
FIG. 11 is a schematic vertical cross-sectional view of the first exemplary structure after formation of a backside blocking dielectric layer according to the first embodiment of the present disclosure.

Referring to FIG. 11, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 616 and the planar dielectric portion 618 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 618. A backside cavity 79' is present within the portion of each backside trench 79 that is not filled with the backside blocking dielectric layer 44.

Figure 12:
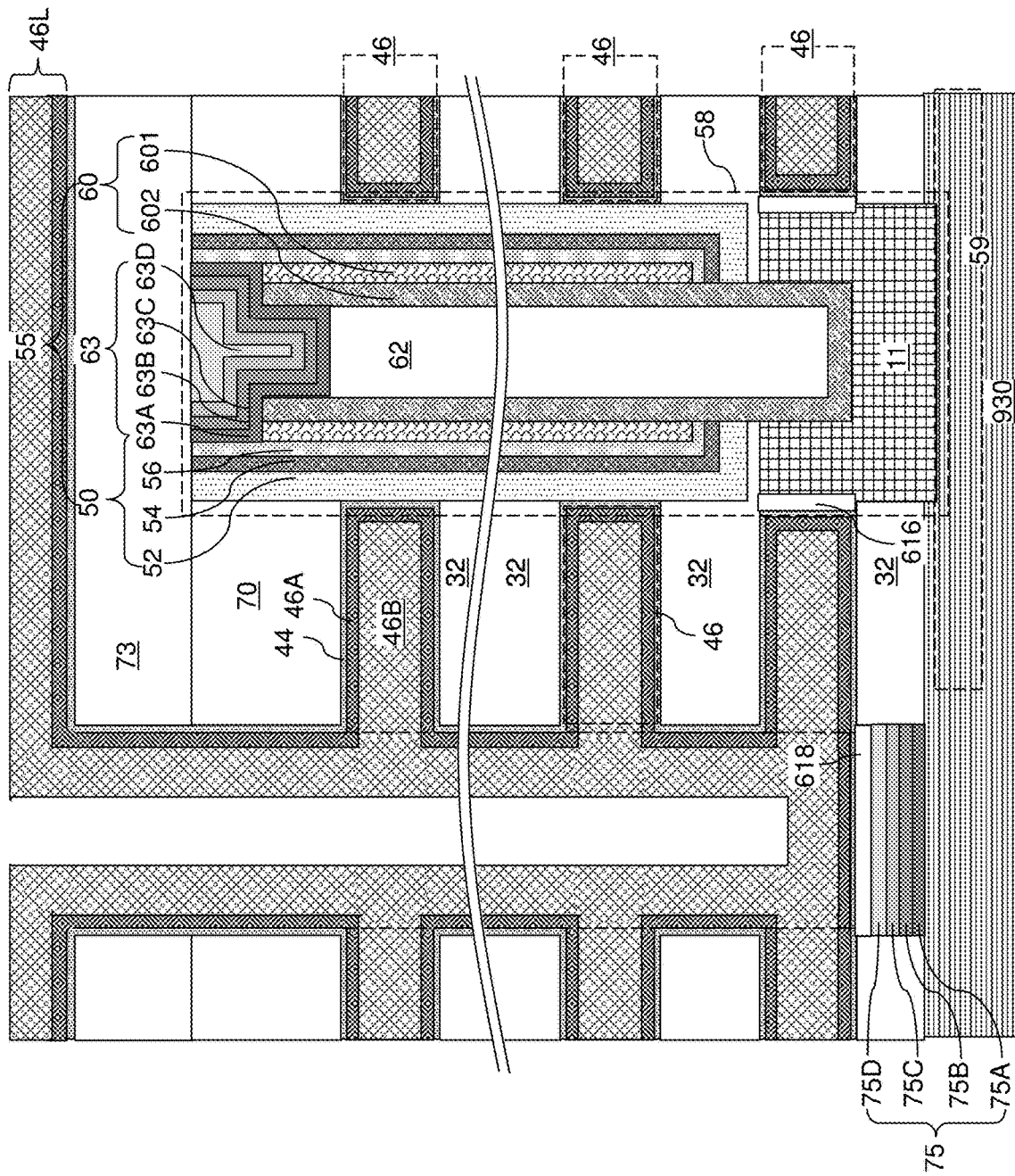
FIG. 12 is a schematic vertical cross-sectional view of the first exemplary structure after formation of electrically conductive layers according to the first embodiment of the present disclosure.

Referring to FIG. 12, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 616 laterally surrounds a III-V compound semiconductor pedestal 11. A bottommost electrically conductive layer 46 laterally surrounds each tubular dielectric spacer 616 upon formation of the electrically conductive layers 46.

Figure 13A:
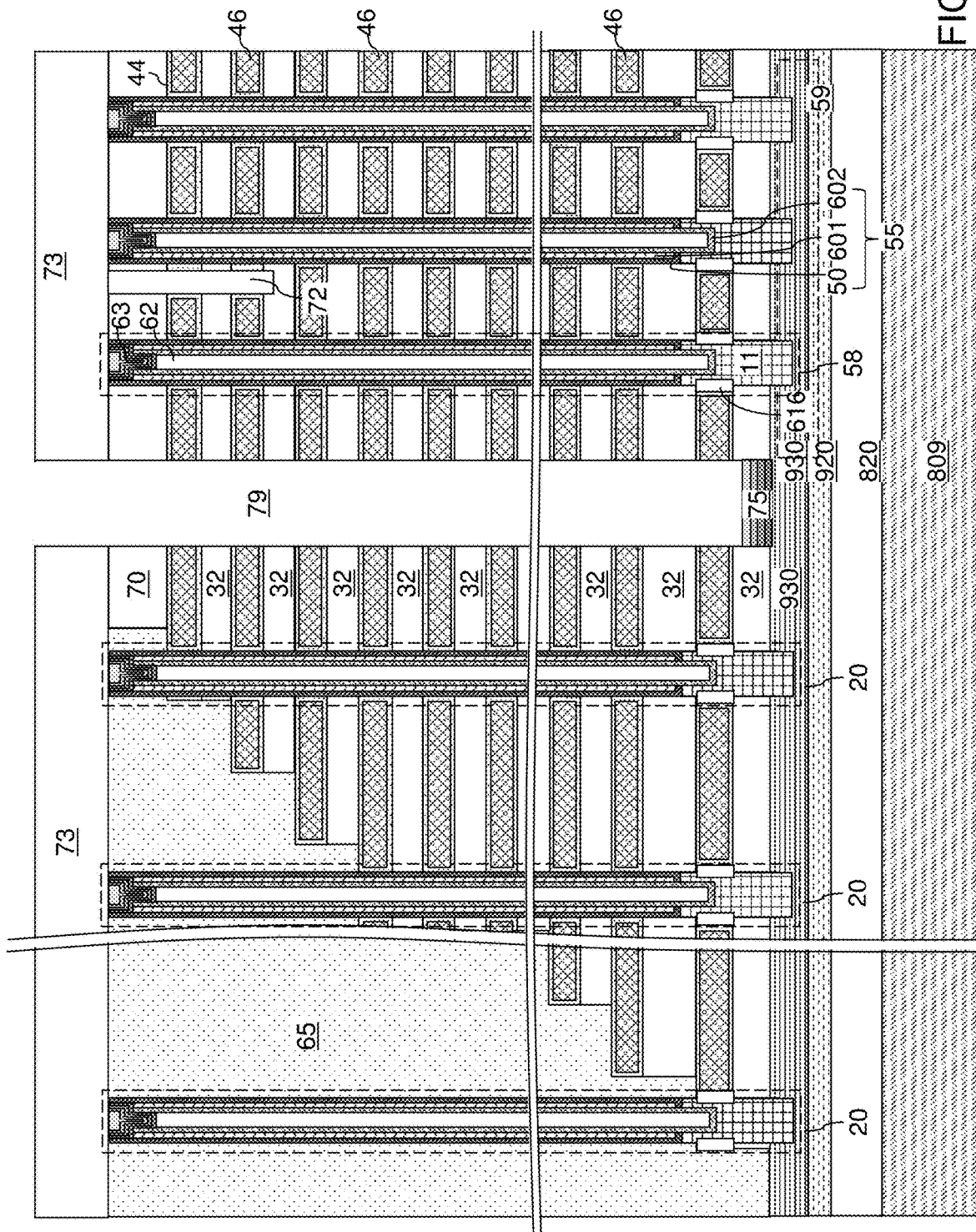
FIG. 13A is a schematic vertical cross-sectional view of the first exemplary structure after removal of an electrically conductive material from within the backside trenches according to the first embodiment of the present disclosure.
Figure 13C:
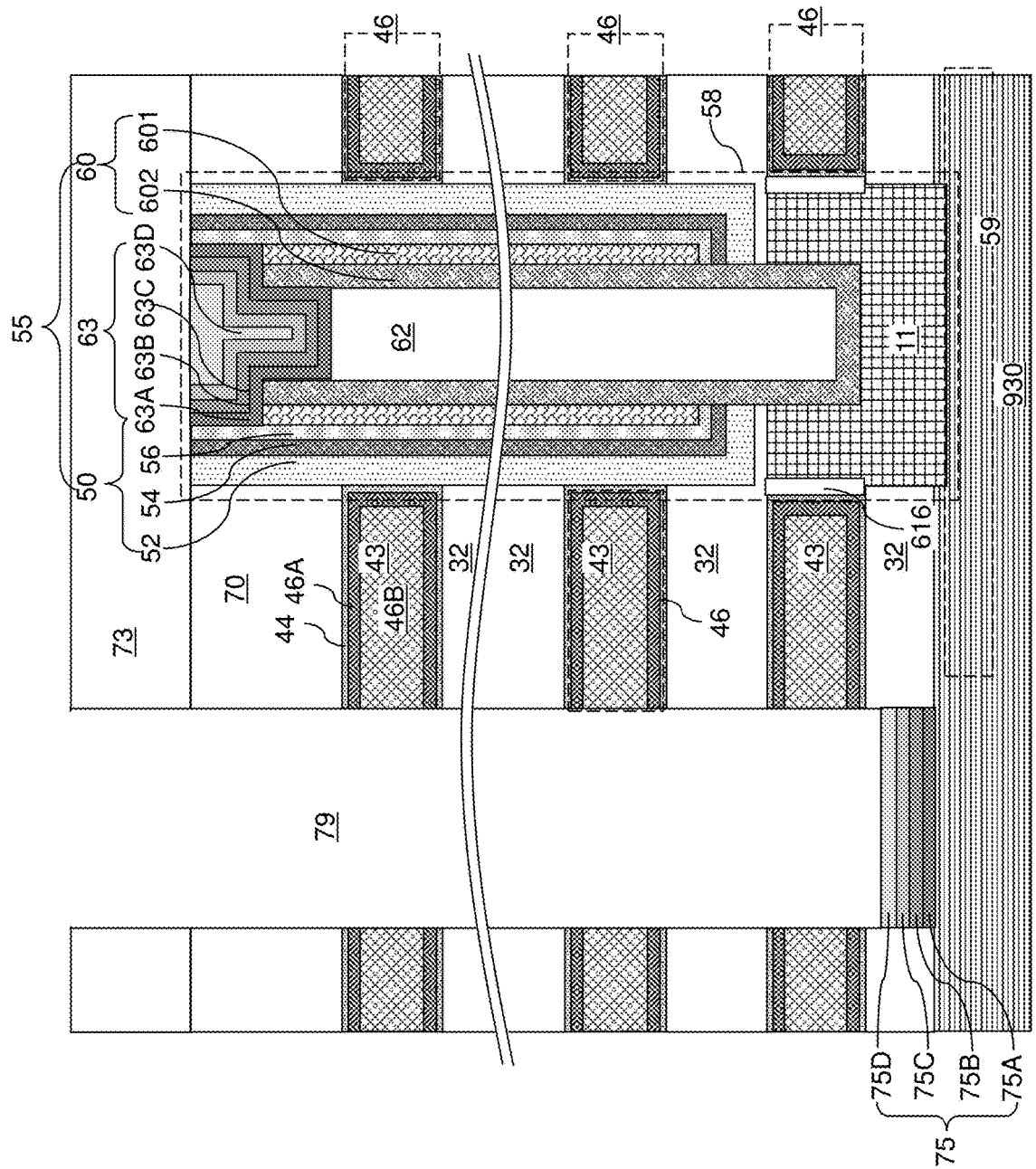
FIG. 13C is a vertical cross-sectional view of the first exemplary structure along the vertical plane C-C' of FIG. 13B.

Referring to FIGS. 13A-13C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 14:
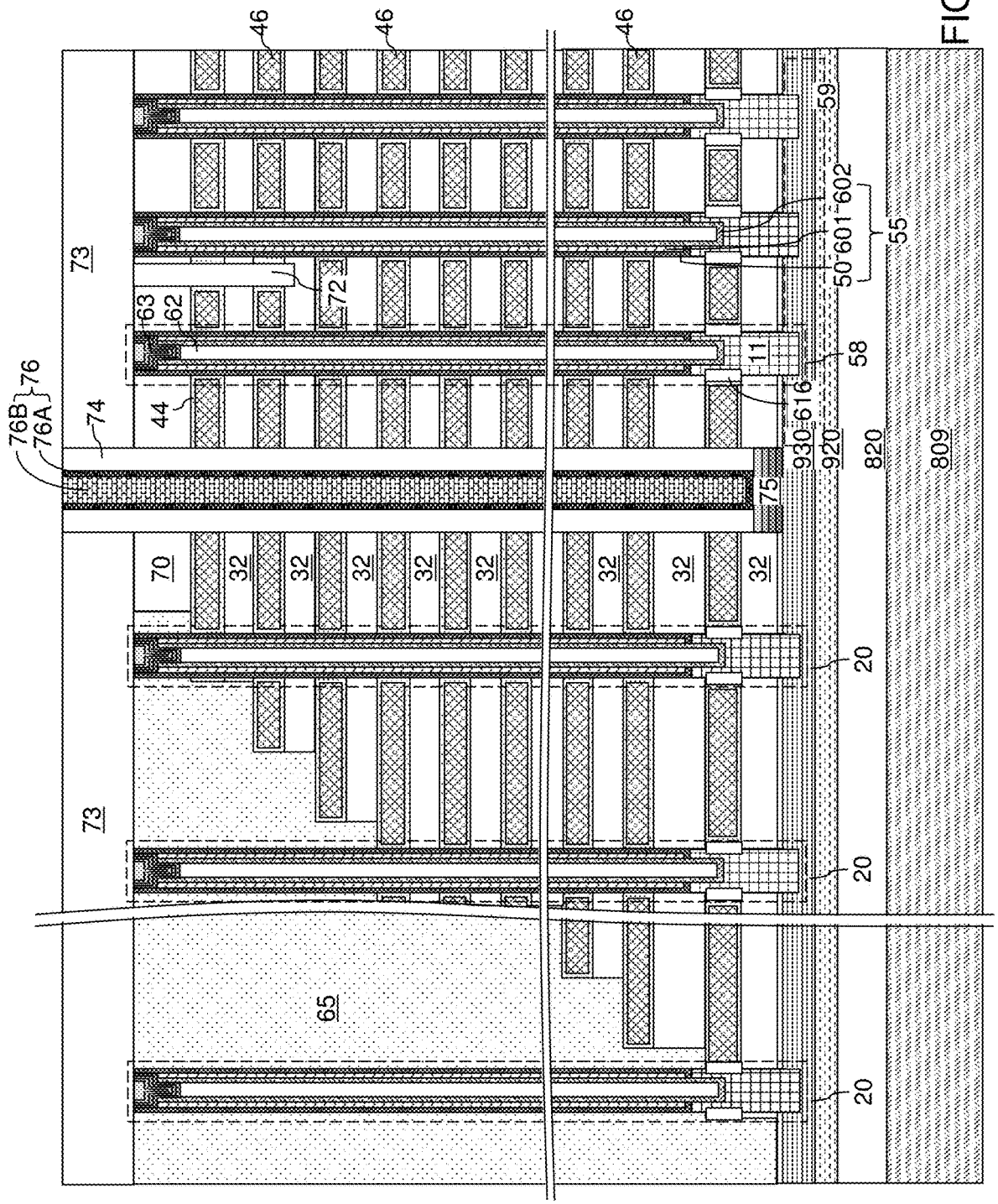
FIG. 14 is a schematic vertical cross-sectional view of the first exemplary structure after formation of an insulating spacer and a backside contact structure according to the first embodiment of the present disclosure.

Referring to FIG. 14, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the single-crystalline III-V compound semiconductor layer 930 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Each source region 75 is formed in an upper portion of the single-crystalline III-V compound semiconductor layer 930. Semiconductor channels (59, 11, 60) extend between each source region 75 and a respective set of drain regions 63. The semiconductor channels (59, 11, 60) include the vertical semiconductor channels 60 of the memory stack structures 55.

A backside contact via structure 76 can be formed within each backside cavity 79'. Each backside contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metal silicide and/or germanide, such as nickel germanosilicide, and/or a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 75. If a backside blocking dielectric layer 44 is employed, the backside contact via structure 76 can contact a sidewall of the backside blocking dielectric layer 44.

Figure 15A:
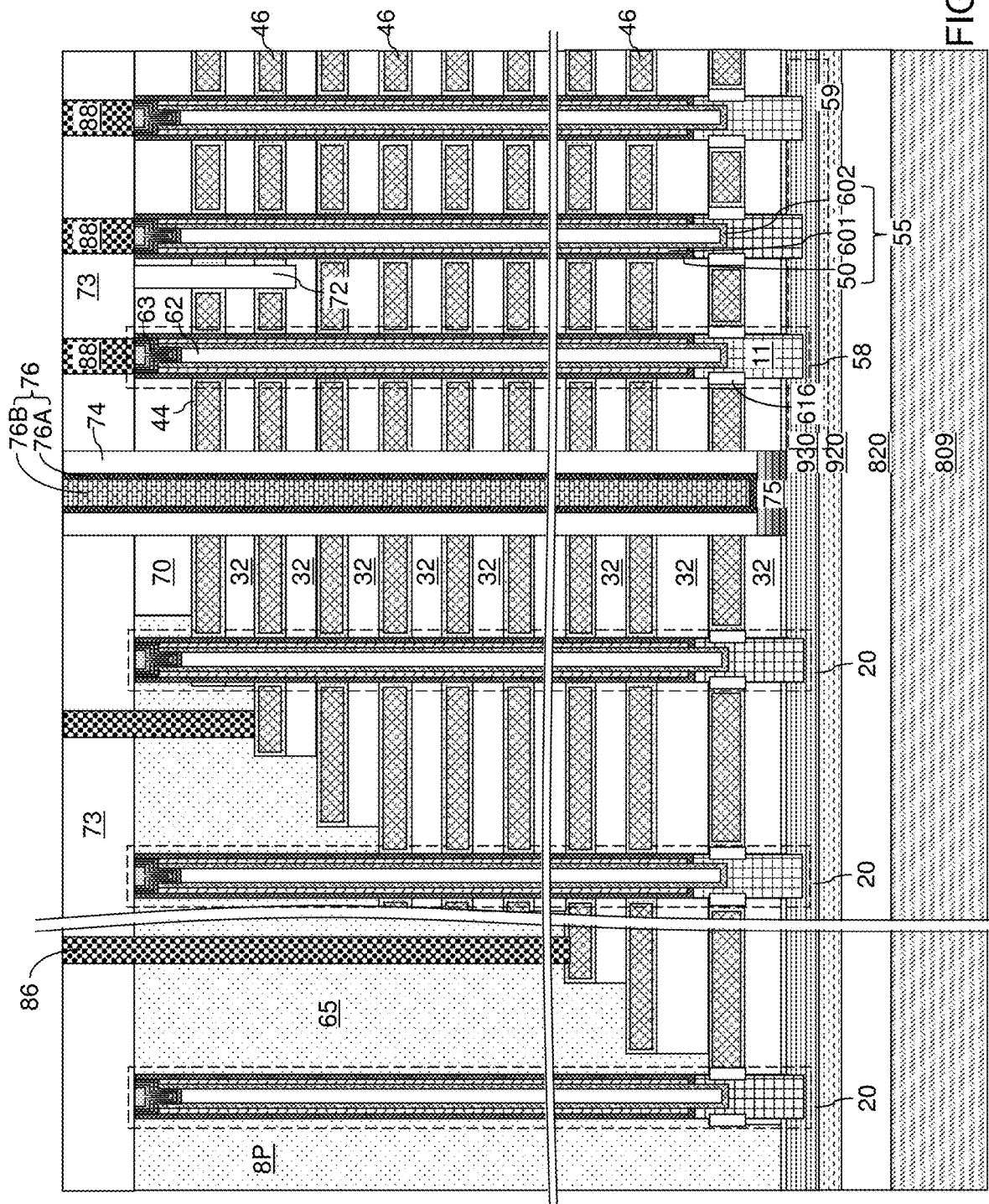
FIG. 15A is a schematic vertical cross-sectional view of the first exemplary structure after formation of additional contact via structures according to the first embodiment of the present disclosure.
Figure 15B:
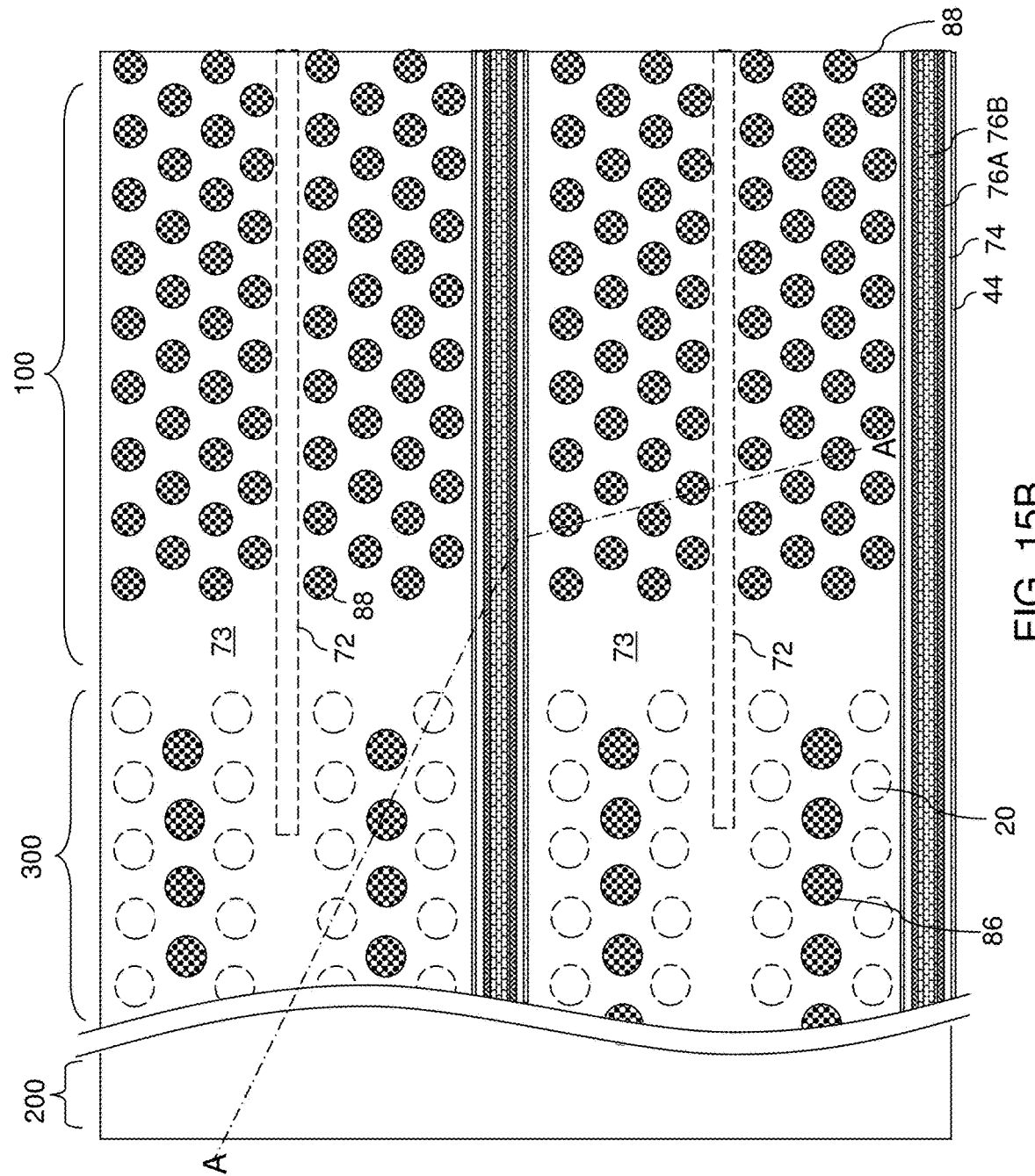
FIG. 15B is a partial see-through top-down view of the first exemplary structure of FIG. 15A. The vertical plane A-A' is the plane of the schematic vertical cross-sectional view of FIG. 15A.

Referring to FIGS. 15A and 15B, additional contact via structures (88, 86) can be formed through the contact level dielectric layer 73, and optionally through the retro-stepped dielectric material portion 65. For example, drain contact via structures 88 can be formed through the contact level dielectric layer 73 on each drain region 63. The drain contact via structures 88 may comprise a nickel germanosilicide layer which contacts the drain region 63 and a tungsten fill layer located on the nickel germanosilicide layer. Word line contact via structures 86 can be formed on the electrically conductive layers 46 through the contact level dielectric layer 73, and through the retro-stepped dielectric material portion 65.

Figures 16A, 16B:
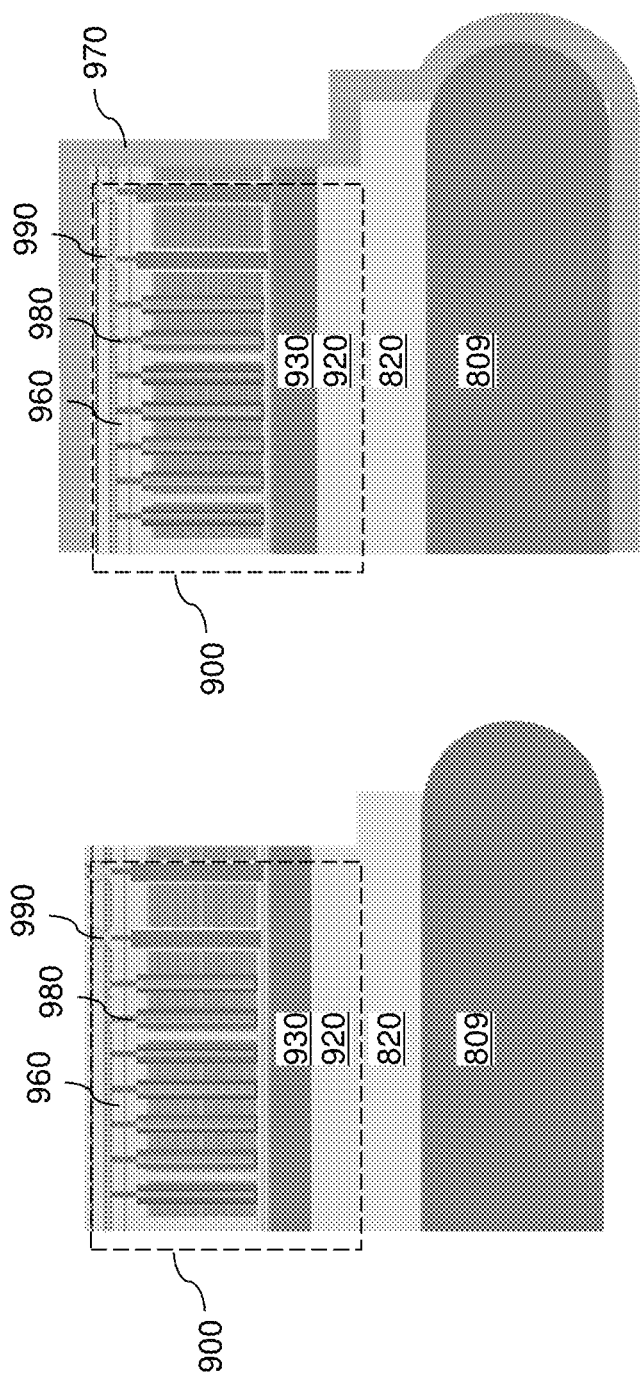
FIGS. 16A-16C are sequential vertical cross-sectional views of an edge region of the first exemplary structure during formation of a first silicon nitride diffusion barrier layer according to the first embodiment of the present disclosure.

Referring to FIG. 16A, an edge region of the first exemplary structure is illustrated. The substrate (e.g., the substrate material layer) 809 of the first exemplary structure may be comprise a wafer, such as a silicon wafer, having a curved (e.g., tapered) edge. A portion of the silicon oxide layer 820, such as the second silicon oxide component layer 822 portion of layer 802, may be conformal to the substrate 809 and may curve around the curved edge of the substrate 809 (shown in FIG. 35A but not shown in FIG. 16A for clarity). However, another portion of the silicon oxide layer 820, such as the first silicon oxide component layer 922 is not conformal to the curved edge of the substrate 809 because layer 922 is initially formed over a different substrate (e.g., transfer substrate 909) and then bonded to layer 822 located over the substrate 809. Therefore, the portion of the silicon oxide layer 820 which initially comprised layer 922 may have a non-conformal, substantially vertical sidewall at the curved edge of the substrate 809. First dielectric material layers 960 embedding first metal interconnect structures 980 and first bonding pads 990 can be formed over the alternating stack (32, 46) and the memory opening fill structures 58 to provide electrical connection to various nodes of the memory opening fill structures 58 and the electrically conductive layers 46 (which function as word lines for the three-dimensional array of memory elements located within the two-dimensional array of memory opening fill structures 58). A plurality of first semiconductor dies 900 can be provided over the transfer substrate 909. Generally, the first metal interconnect structures 980 can be electrically connected to nodes of the memory opening fill structures 58 and/or the electrically conductive layers 46.

The various material layers located above the silicon oxide layer 820 can be anisotropically etched, for example, by covering a center portion of the first exemplary structure with an etch mask layer such as a patterned photoresist layer, and by anisotropically etching unmasked portions of the first exemplary structure above the silicon oxide layer 820. Peripheral portions of the silicon oxide layer 820 can be physically exposed after the anisotropic etch process.

Referring to FIG. 16B, a first silicon nitride diffusion barrier layer 970 can be formed on the physically exposed surfaces of the first exemplary structure by a conformal deposition process. For example, a chemical vapor deposition process can be performed to deposit the first silicon nitride diffusion barrier layer 970. The first silicon nitride diffusion barrier layer 970 can be formed on sidewalls of the first dielectric material layers 960 and a peripheral surface of the silicon oxide layer 820. The thickness of the first silicon nitride diffusion barrier layer 970 can be in a range from 30 nm to 600 nm, although lesser and greater thicknesses can also be employed.

Figure 16C:
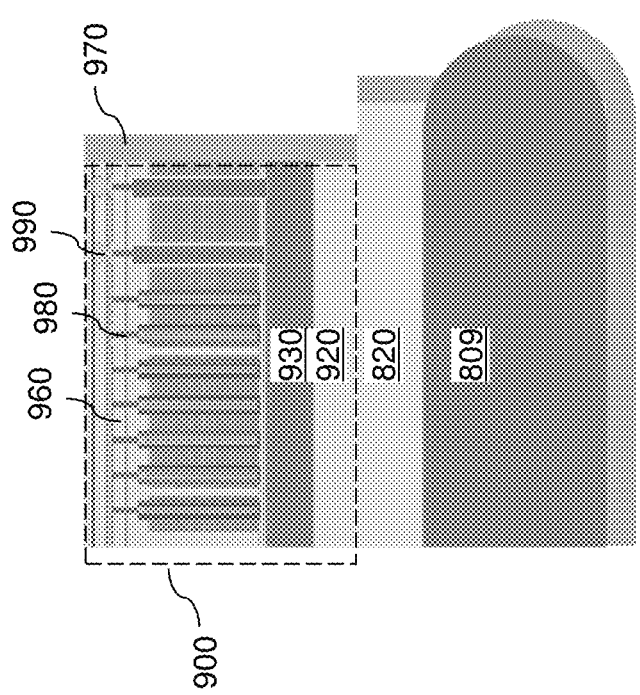

Referring to FIG. 16C, an anisotropic etch process can be performed to remove horizontal portions of the first silicon nitride diffusion barrier layer 970. The first bonding pads are physically exposed. The etch process may be a bevel and RIE etch process. An annular top surface of the peripheral portion of the silicon oxide layer 820 at the edge of the substrate 809 can be physically exposed after the anisotropic etch process.

Referring to FIG. 17A, a peripheral circuit (e.g., driver circuit) including semiconductor devices for controlling operation of the three-dimensional array of memory elements can be formed over a semiconductor substrate 709. For example, the semiconductor substrate 709 can be a commercially available single-crystalline silicon wafer. The peripheral circuit can include various semiconductor devices such as field effect transistors (e.g., transistors in a CMOS configuration), resistors, capacitors, inductors, diodes, and/or additional semiconductor devices known in the art. A plurality of second semiconductor dies 700 can be formed over the semiconductor substrate 709. The size of each second semiconductor die 700 can be the same as the size of each first semiconductor die 900. Second dielectric material layers 760 embedding second metal interconnect structures 780 and second bonding pads 790 can be formed over the peripheral circuit that includes at least field effect transistors. The second metal interconnect structures are electrically connected to nodes of the field effect transistors.

Referring to FIG. 17B, a second silicon nitride diffusion barrier layer 770 can be formed on the physically exposed surfaces of the semiconductor substrate 709 and the second dielectric material layers 760 by a conformal deposition process. For example, a chemical vapor deposition process can be performed to deposit the second silicon nitride diffusion barrier layer 770. The thickness of the second silicon nitride diffusion barrier layer 770 can be in a range from 30 nm to 600 nm, although lesser and greater thicknesses can also be employed.

Figure 17C:
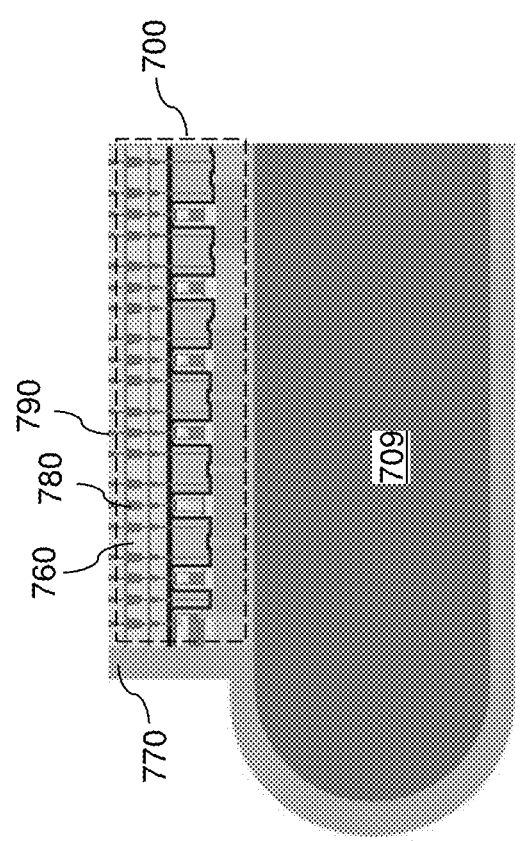

Referring to FIG. 17C, an anisotropic etch process can be performed to remove horizontal portions of the second silicon nitride diffusion barrier layer 770. The second bonding pads 790 are physically exposed. The second silicon nitride diffusion barrier layer 770 is located on sidewalls of the second dielectric material layers 760.

Figure 18A:
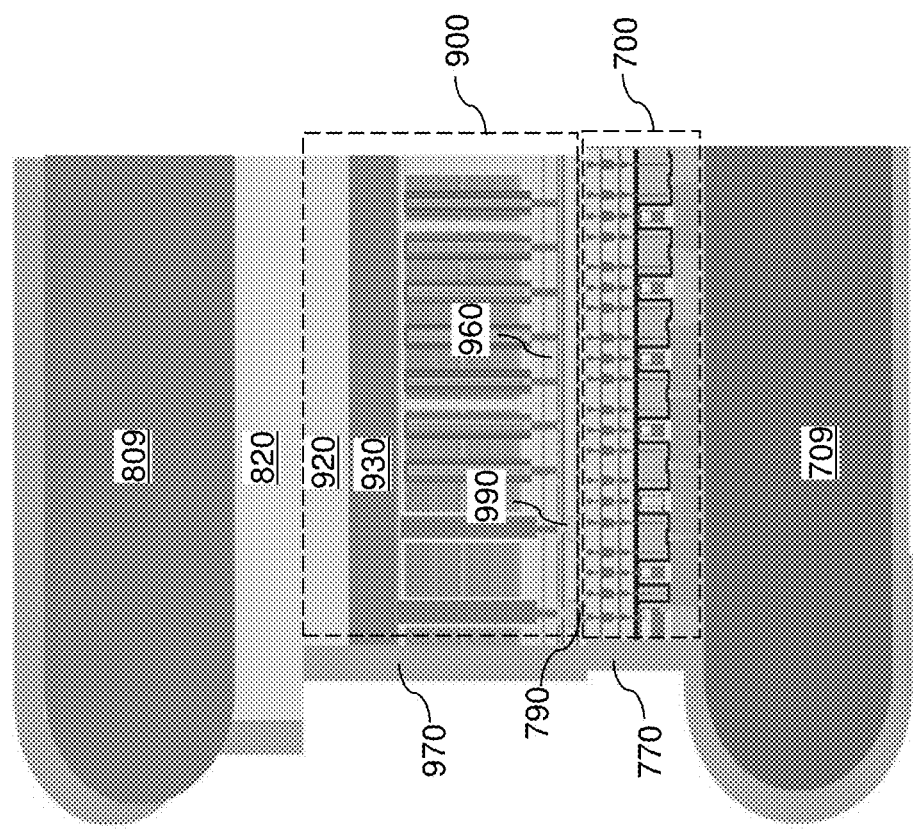
FIGS. 18A-18C are sequential vertical cross-sectional views of an edge region of a bonded assembly during separation at a silicon oxide layer according to the first embodiment of the present disclosure.

Referring to FIG. 18A, the second metal pads 790 that are embedded in the second dielectric material layers 760 can be bonded to the first metal pads 990 that are embedded in the first dielectric material layers 960. The assembly including the substrate 809, the silicon oxide layer 820, and the plurality of first semiconductor dies 900 can be bonded to the assembly including the semiconductor substrate 709 and the plurality of second semiconductor dies 700. The field effect transistors in each second semiconductor die 700 can comprise components of a peripheral circuit configured to control operation of memory elements in the memory opening fill structures 58 within a respective first semiconductor die 900 that is bonded to the second semiconductor die 700. An annular surface of the silicon oxide layer 820 is physically exposed after the bonding process.

Figure 18B:
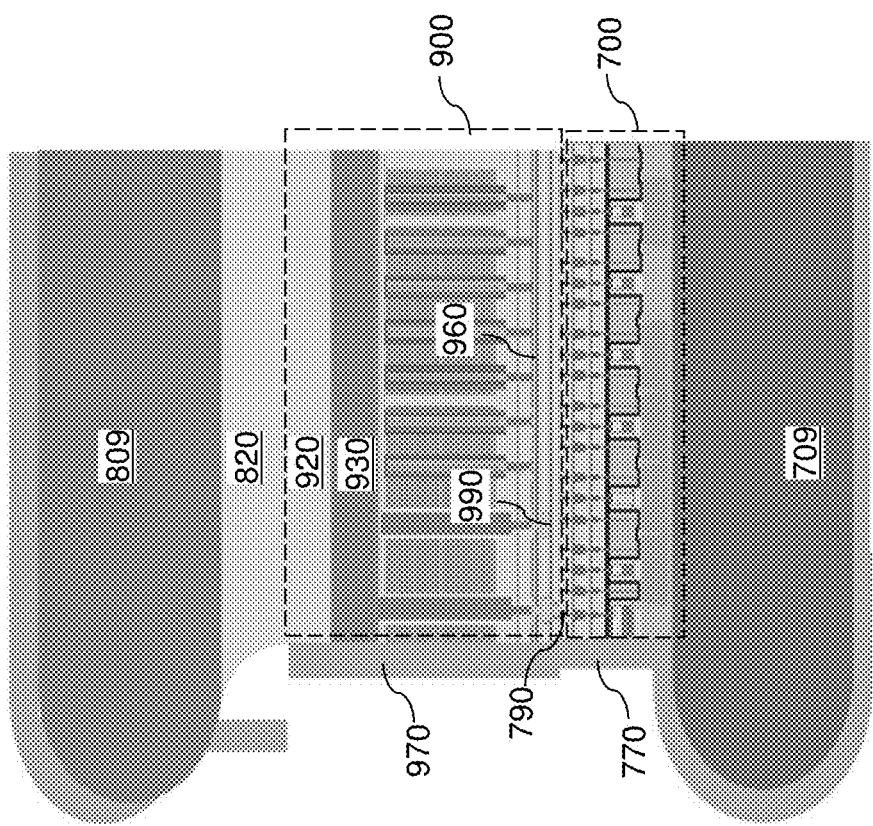

Referring to FIG. 18B, an isotropic etch process can be performed to isotropically etch peripheral portions of the silicon oxide layer 820. For example, a wet etch process employing dilute hydrofluoric acid can be performed to isotropically etch the peripheral portions of the silicon oxide layer 820. In case grooves 923 (illustrated in FIG. 1B) are present in the silicon oxide layer 820, the grooves 923 may function as a conduit for transporting the isotropic etchant of the isotropic etch process from peripheral regions of the bonded structure to a center region of the bonded structure, and to induce isotropic etching of the silicon oxide layer 820 around the interface between the first silicon oxide component layer 922 and the second silicon oxide component layer 822 (illustrated in FIG. 1D).

Figure 18C:
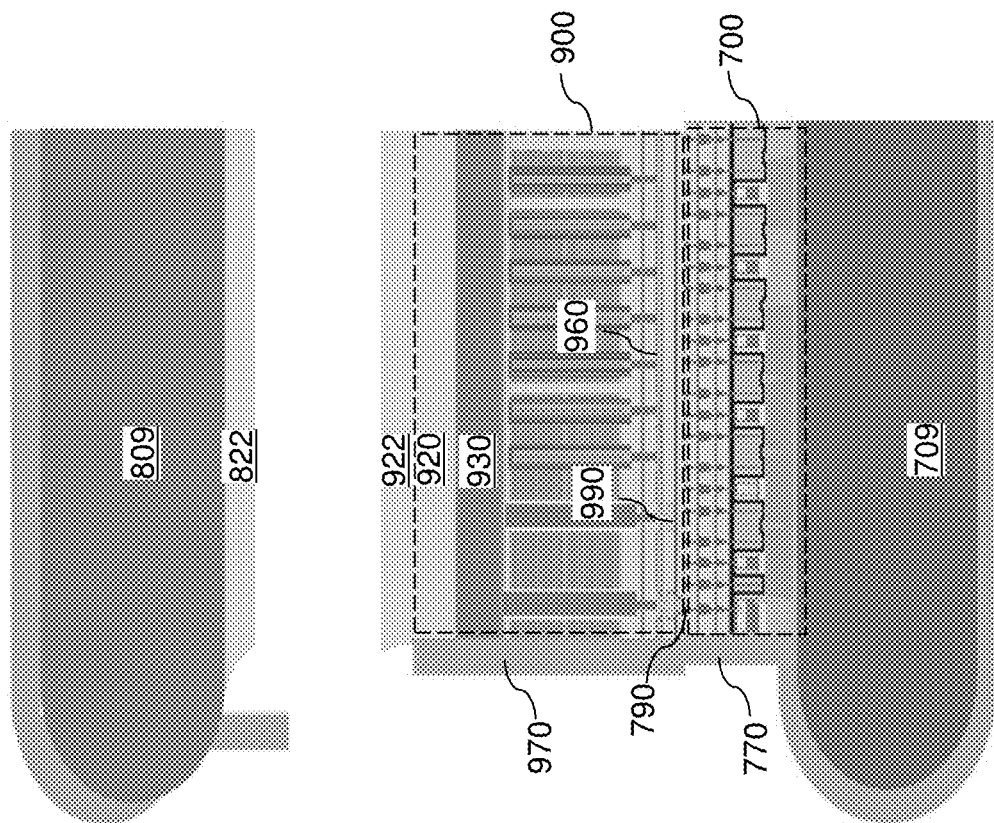

Referring to FIG. 18C, the assembly including the single-crystalline germanium-containing layer 920, the single-crystalline III-V compound semiconductor layer 930, the alternating stack (32, 46), and the memory opening fill structures 58 can be separated from the substrate 809 at a separation surface that extends through the silicon oxide layer 820, such as a bonded surface (i.e., interface) between the first silicon oxide component layer 922 and the second silicon oxide component layer 822. The separation may be performed by attaching electrostatic chucks to opposing substrates (809, 909) and then pulling the chucks apart to separate the pre-etched silicon oxide layer 820 along the separation surface. After separation, the first silicon oxide component layer 922 may remain over the memory die 900 located over the semiconductor substrate 709, while the second silicon oxide component layer 822 may remain over the substrate 809. The second silicon oxide component layer 822 may be removed from the substrate 809 after the separation and the substrate may be reused to form additional memory die 900 starting at the step shown in FIG. 1C.

Generally, the assembly including the single-crystalline germanium-containing layer 920, the single-crystalline III-V compound semiconductor layer 930, the alternating stack (32, 46), and the memory opening fill structures 58 can be pulled apart from the substrate 809 by applying mechanical force. The silicon oxide layer 820 can be separated within or at an interface with the substrate 809 or at an interface with the single-crystalline germanium-containing layer 920. In one embodiment, the separation surface may comprises an interface between the first silicon oxide component layer 922 and the second silicon oxide component layer 822. Generally, the assembly including the single-crystalline germanium-containing layer 920, the single-crystalline III-V compound semiconductor layer 930, the alternating stack (32, 46), and the memory opening fill structures 58 can be cleaved from the substrate 809 after the second metal pads 790 are bonded to the first metal pads 990. Generally, peripheral portions of the silicon oxide layer 820 can be isotropically etched prior to cleaving the assembly including the single-crystalline germanium-containing layer 920, the single-crystalline III-V compound semiconductor layer 930, the alternating stack (32, 46), and the memory opening fill structures 58 from the substrate 809. Subsequently, the bonded assembly may be processed to thin the semiconductor substrate 709 and/or to form through-substrate via structures (i.e., through silicon vias, TSV), and can be subsequently diced to form semiconductor chips including a respective bonded pair of a first semiconductor die 900 and a second semiconductor die 700.

Referring to FIGS. 1A-18C, a semiconductor structure is provided, which comprises: a single-crystalline germanium-containing layer 920; a single-crystalline III-V compound semiconductor layer 930 that is epitaxially aligned to the single-crystalline germanium-containing layer 920; an alternating stack of insulating layers 32 and electrically conductive layers 46 located on the single-crystalline III-V compound semiconductor layer 930; memory stack structures 55 vertically extending through the alternating stack (32, 46); first dielectric material layers 960 embedding first metal interconnect structures 980 and first metal pads 990, wherein the first dielectric material layers are located over the alternating stack (32, 46), and wherein the first metal interconnect structures 980 are electrically connected to nodes of the memory stack structures 55; second dielectric material layers 760 embedding second metal interconnect structures 780 and second metal pads 790, wherein the second dielectric material layers are located over the first dielectric material layers 960, wherein the second metal pads 790 are bonded to the first metal pads 990; and field effect transistors located over the second dielectric material layers and electrically connected to the second metal interconnect structures.

In one embodiment, the memory stack structures 55 are located within memory openings 49 that vertically extend through the alternating stack (32, 46); and each of the memory stack structures 55 comprises a respective vertical semiconductor channel 60 and a memory film 50. In one embodiment, the vertical semiconductor channels 60 comprises a III-V compound semiconductor channel material. In one embodiment, III-V compound semiconductor pedestals 11 can be provided, which comprise a respective single-crystalline III-V compound semiconductor material and are epitaxially aligned to the single-crystalline III-V compound semiconductor layer 930.

In one embodiment, the three-dimensional memory device comprises: a silicon oxide layer 922 located on the single-crystalline germanium-containing layer 920; a first silicon nitride diffusion barrier layer 970 laterally surrounding sidewalls of the first dielectric material layers 960; and a second silicon nitride diffusion barrier layer 770 laterally surrounding sidewalls of the second dielectric material layer.

Figure 19:
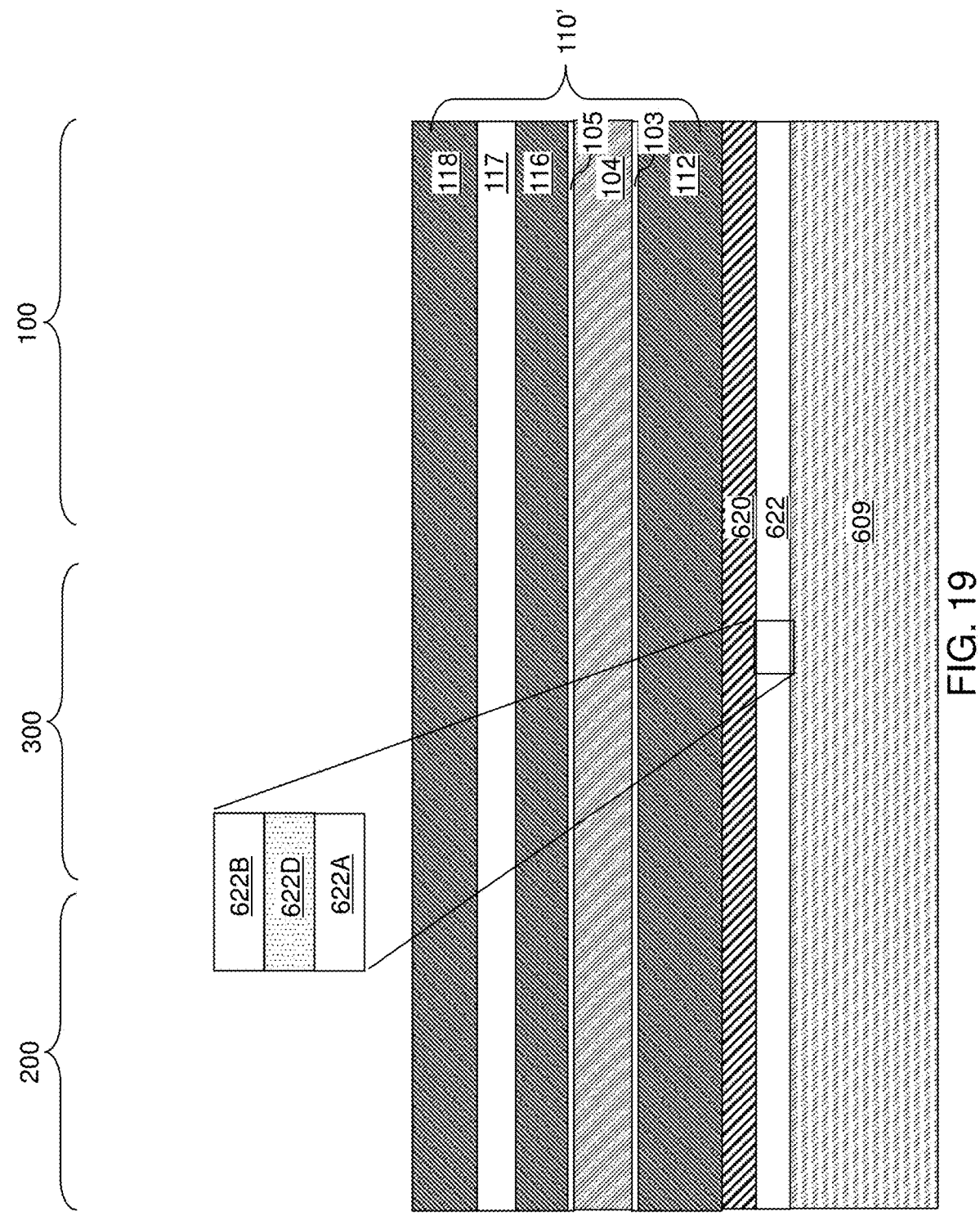
FIG. 19 is a vertical cross-sectional view of a second exemplary semiconductor structure after formation of a silicon oxide layer, an optional source-level metallic layer, and in-process source-level material layers over a substrate according to a second embodiment of the present disclosure.

Referring to FIG. 19, a second exemplary structure according to a second embodiment of the present disclosure is illustrated. The second exemplary structure includes a substrate containing a substrate material layer 609. In one embodiment, the substrate material layer 609 may comprise a commercially available single-crystalline silicon wafer. A silicon oxide layer 622 can be formed on a top surface of the substrate material layer 609. The silicon oxide layer 622 may be formed by thermal oxidation of a surface portion of the substrate material layer 609 if the substrate material layer 609 includes silicon, and/or by deposition of a silicon oxide material by chemical vapor deposition. In one embodiment, the silicon oxide layer 622 has a uniform composition throughout its thickness of 200 nm to 600 nm, such as 300 nm to 400 nm. In an alternative embodiment, the silicon oxide layer 622 may include a layer stack of a proximal silicon oxide layer 622A including undoped silicate glass, a doped silicate glass layer 622D including a doped silicate glass such as borosilicate glass, and a distal silicon oxide layer 622B including undoped silicate glass. The material composition of the doped silicate glass layer 622D can be selected such that the doped silicate glass layer 622D provides an etch rate in dilute hydrofluoric acid that is at least 100 times, such as at least 1,000 times, the etch rate of the undoped silicate glass materials of the proximal silicon oxide layer 622A and the distal silicon oxide layer 622B. In one embodiment, the proximal silicon oxide layer 622A and the distal silicon oxide layer 622B can be substantially free of any dopant atoms, and the doped silicate glass layer 622D may include boron atoms in an atomic concentration in a range from 4% to 8%, although lesser and greater atomic percentages may also be employed. The thickness of each of the proximal silicon oxide layer 622A and the distal silicon oxide layer 622B may be in a range from 100 nm to 300 nm, and the thickness of the doped silicate glass layer 622D may be in a range from 50 nm to 100 nm, although lesser and greater thicknesses may be employed for each.

A germanium-containing semiconductor material may be deposited over the silicon oxide layer 622 to form a polycrystalline germanium-containing layer 620. The polycrystalline germanium-containing layer 620 includes a germanium-containing material that includes germanium at an atomic concentration in a range from 50% to 100%, such as from 80% to 100%. The polycrystalline germanium-containing layer 620 may be deposited by chemical vapor deposition or physical vapor deposition. In one embodiment, the polycrystalline germanium-containing layer 620 may consist essentially of germanium. The thickness of the polycrystalline germanium-containing layer 620 may be in a range from 100 nm to 300 nm, such as 150 nm to 200 nm, although lesser and greater thicknesses may also be used.

In-process source-level material layers 110' can be subsequently deposited. The in-process source-level material layers 110' may include various layers that are subsequently modified to form source-level material layers. The source-level material layers, upon formation, include a source contact layer that functions as a common source region for vertical three-dimensional memory device. In one embodiment, the in-process source-level material layers 110' may include, from bottom to top, a lower polycrystalline III-V compound semiconductor layer 112, a lower sacrificial liner 103, a source-level sacrificial layer 104, an upper sacrificial liner 105, an upper polycrystalline III-V compound semiconductor layer 116, a source-level insulating layer 117, and an source-select-level conductive layer 118.

The lower polycrystalline III-V compound semiconductor layer 112 and the upper polycrystalline III-V compound semiconductor layer 116 include a respective polycrystalline doped III=V compound semiconductor material. Each of the lower polycrystalline III-V compound semiconductor layer 112 and the upper polycrystalline III-V compound semiconductor layer 116 can include a respective III-V compound semiconductor material such as AlP, AlAs, AlSb, GaN, GaP, GaAs, GaSb, InN, InP, InAs, InGaAs, InSb, AlGaN, AlGaP, AlGaAs, AlGaSb, GaInN, GaInP, GaInAs, GaInSb, etc.

In one embodiment, each of the lower polycrystalline III-V compound semiconductor layer 112 and the upper polycrystalline III-V compound semiconductor layer 116 comprises, and/or consists essentially of, GaN, GaAs, or $GaN_xAs_{1-x}$. The lower polycrystalline III-V compound semiconductor layer 112 and the upper polycrystalline III-V compound semiconductor layer 116 can be formed by chemical vapor deposition. Each of the lower polycrystalline III-V compound semiconductor layer 112 and the upper polycrystalline III-V compound semiconductor layer 116 can have a thickness in a range from 50 nm to 300 nm, such as 100 nm to 200 nm, although lesser and greater thicknesses may also be employed.

The conductivity type of the lower polycrystalline III-V compound semiconductor layer 112 and the upper polycrystalline III-V compound semiconductor layer 116 may be the opposite of the conductivity of vertical semiconductor channels to be subsequently formed. For example, if the vertical semiconductor channels to be subsequently formed have a doping of a first conductivity type, the lower polycrystalline III-V compound semiconductor layer 112 and the upper polycrystalline III-V compound semiconductor layer 116 have a doping of a second conductivity type that is the opposite of the first conductivity type. The atomic concentration of dopants of the second conductivity type in the lower polycrystalline III-V compound semiconductor layer 112 and the upper polycrystalline III-V compound semiconductor layer 116 may be in a range from $1.0 \times 10^{18}/cm^3$ to $1.0 \times 10^{21}/cm^3$, such as from $3.0 \times 10^{19}/cm^3$ to $3.0 \times 10^{20}/cm^3$, although lesser and greater atomic concentrations can also be employed.

The source-level sacrificial layer 104 includes a sacrificial material that may be removed selective to the lower sacrificial liner 103 and the upper sacrificial liner 105. In one embodiment, the source-level sacrificial layer 104 may include silicon nitride, amorphous carbon, an organic polymer, silicon (e.g., amorphous silicon or polysilicon), germanium, a silicon-germanium alloy, or a III-V compound semiconductor material having a different doping and/or composition from the doping or composition of layers 112 and 116. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The source-select-level conductive layer 118 may include a conductive material that may be used as a source-select-level gate electrode. For example, the source-select-level conductive layer 118 may include a doped semiconductor material such as doped polysilicon or doped amorphous silicon that may be subsequently converted into doped polysilicon by an anneal process. The thickness of the source-select-level conductive layer 118 may be in a range from 30 nm to 200 nm, such as from 60 nm to 100 nm, although lesser and greater thicknesses may also be used.

The second exemplary structure may include a memory array region 100 in which a memory array is to be subsequently formed, a staircase region 300 in which contact via structures to word lines are to be subsequently formed, and an optional peripheral region 200.

Figure 20:
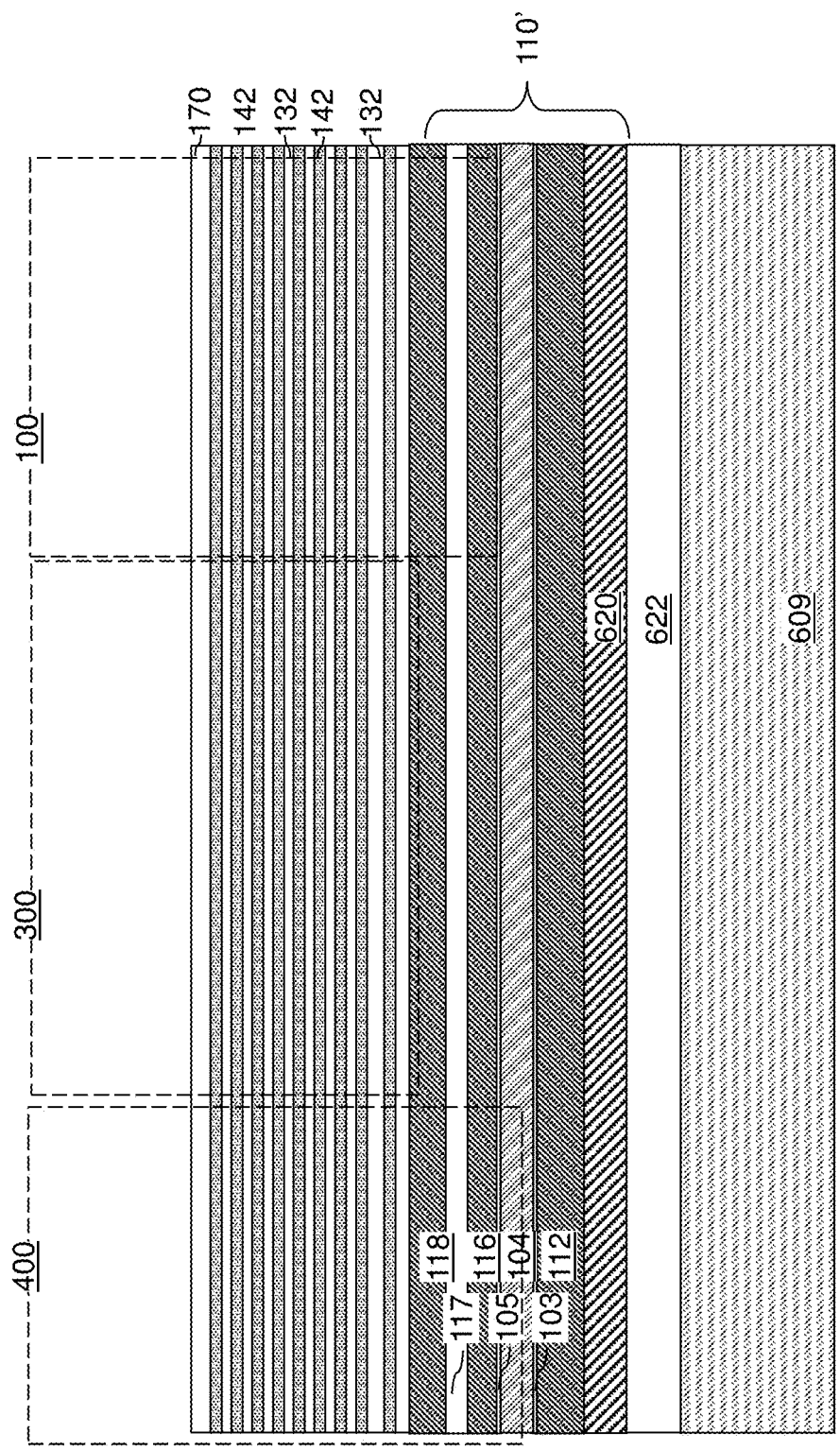
FIG. 20 is a vertical cross-sectional view of the second exemplary semiconductor structure after formation of a first alternating stack of first insulating layers and first spacer material layers according to the second embodiment of the present disclosure.

Referring to FIG. 20, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 21:
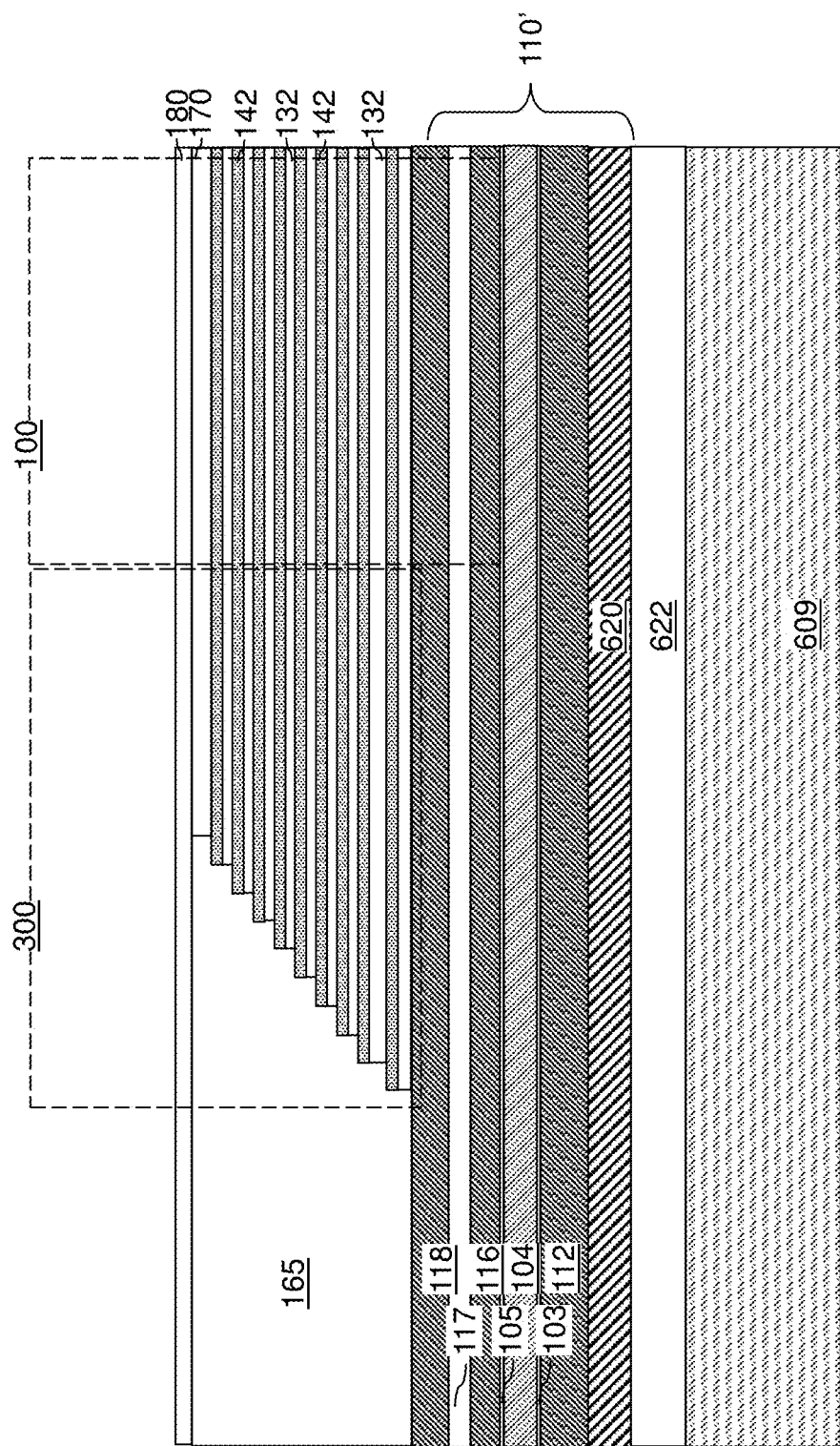
FIG. 21 is a vertical cross-sectional view of the second exemplary structure after formation of a first retro-stepped dielectric material portion and an inter-tier dielectric layer according to the second embodiment of the present disclosure.

Referring to FIG. 21, the first insulating cap layer 170 and the first-tier alternating stack (132, 142) may be patterned to form first stepped surfaces in the staircase region 300. The staircase region 300 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may bely deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 22A:
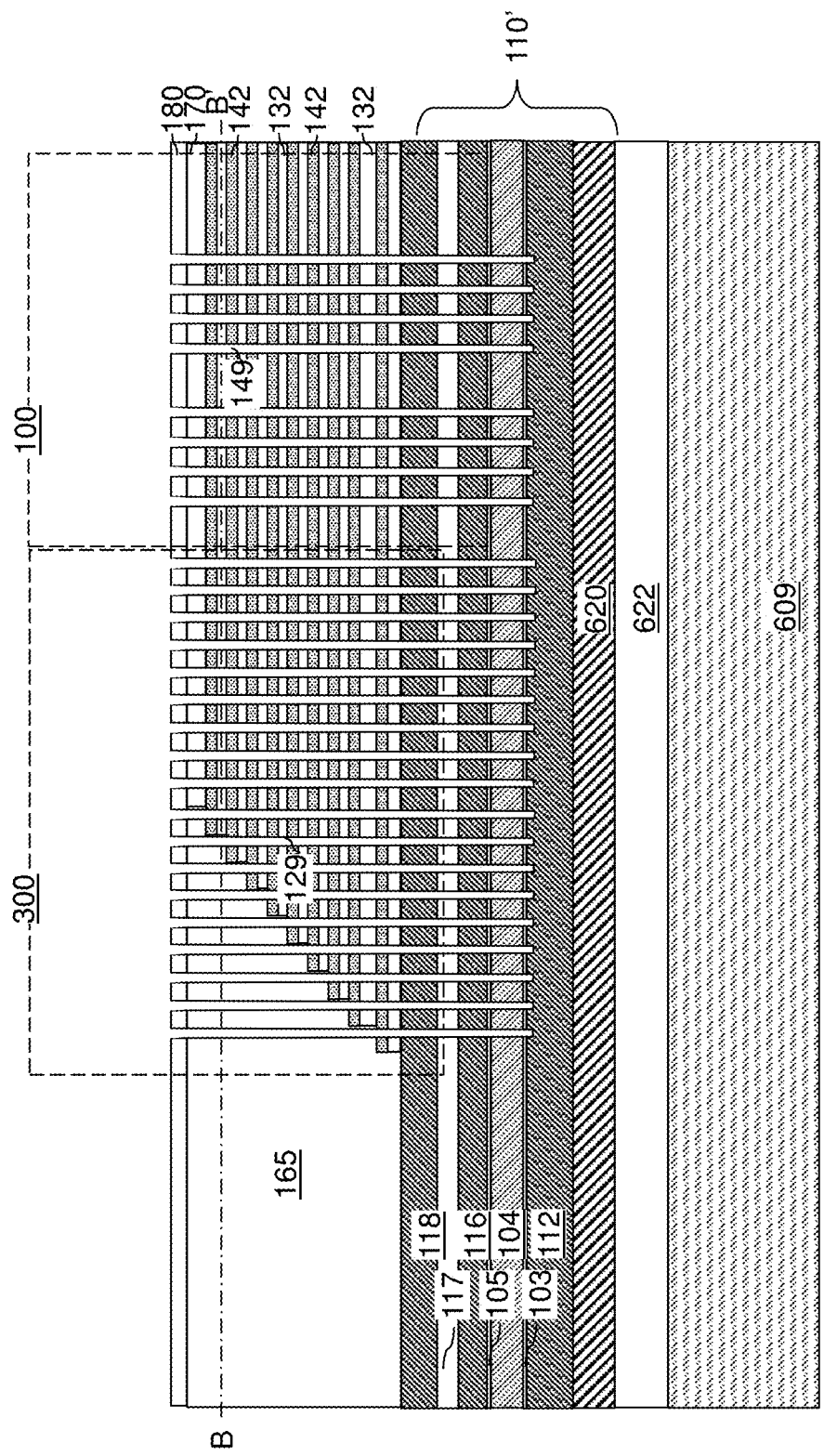
FIG. 22A is a vertical cross-sectional view of the second exemplary structure after formation of first-tier memory openings and first-tier support openings according to the second embodiment of the present disclosure.

Referring to FIGS. 22A and 22B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 22B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 300, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

In one embodiment, the terminal portion of the first anisotropic etch process may etch through the source-select-level conductive layer 118, the source-level insulating layer 117, the upper polycrystalline III-V compound semiconductor layer 116, the upper sacrificial liner 105, the source-level sacrificial layer 104, and the lower sacrificial liner 103, and at least partly into the lower polycrystalline III-V compound semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may bely widened to provide a larger landing pad for second-tier memory openings to be subsequently formed through a second-tier alternating stack (to be subsequently formed prior to formation of the second-tier memory openings).

Figure 23:
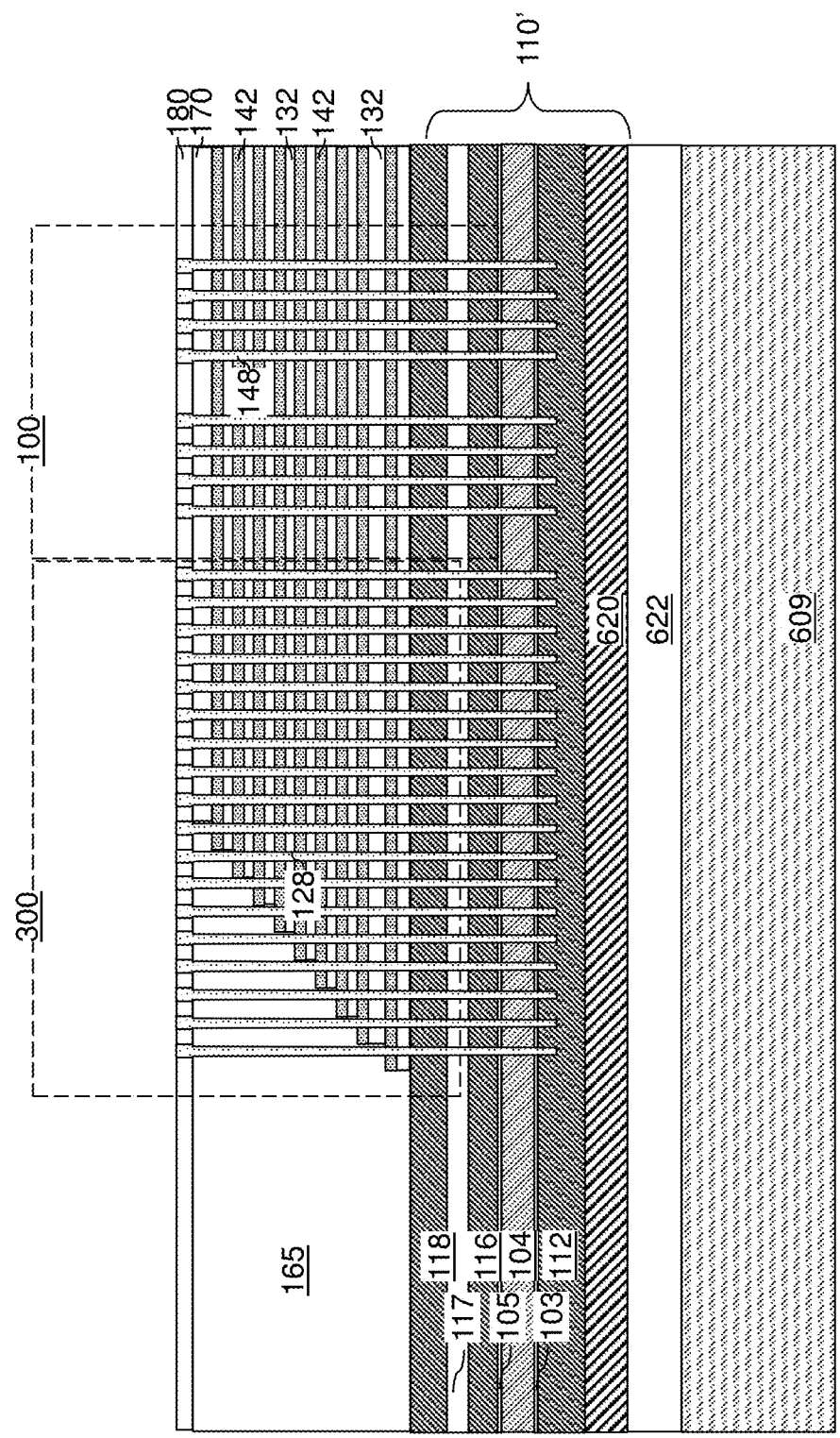
FIG. 23 is a vertical cross-sectional view of the second exemplary structure after formation of sacrificial memory opening fill portions and sacrificial support opening fill portions according to the second embodiment of the present disclosure.

Referring to FIG. 23, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 24:
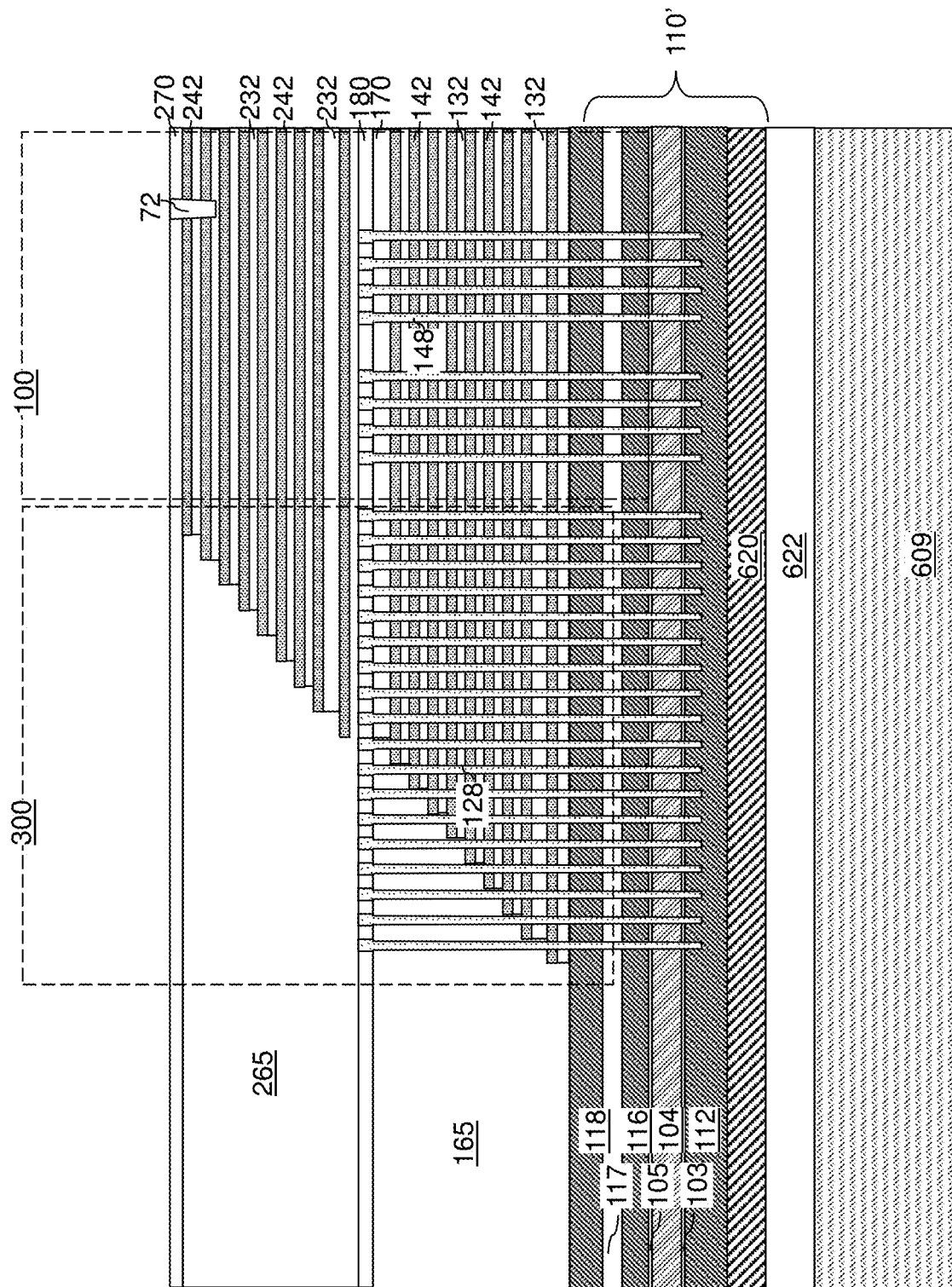
FIG. 24 is a vertical cross-sectional view of the second exemplary structure after formation of a second-tier alternating stack of second insulating layers and second spacer material layers, and a second retro-stepped dielectric material portion according to the second embodiment of the present disclosure.

Referring to FIG. 24, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 300 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 300.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the drain-select-level isolation structures 72 collectively constitute a second-tier structure (232, 242, 265, 270, 72).

Figure 25A:
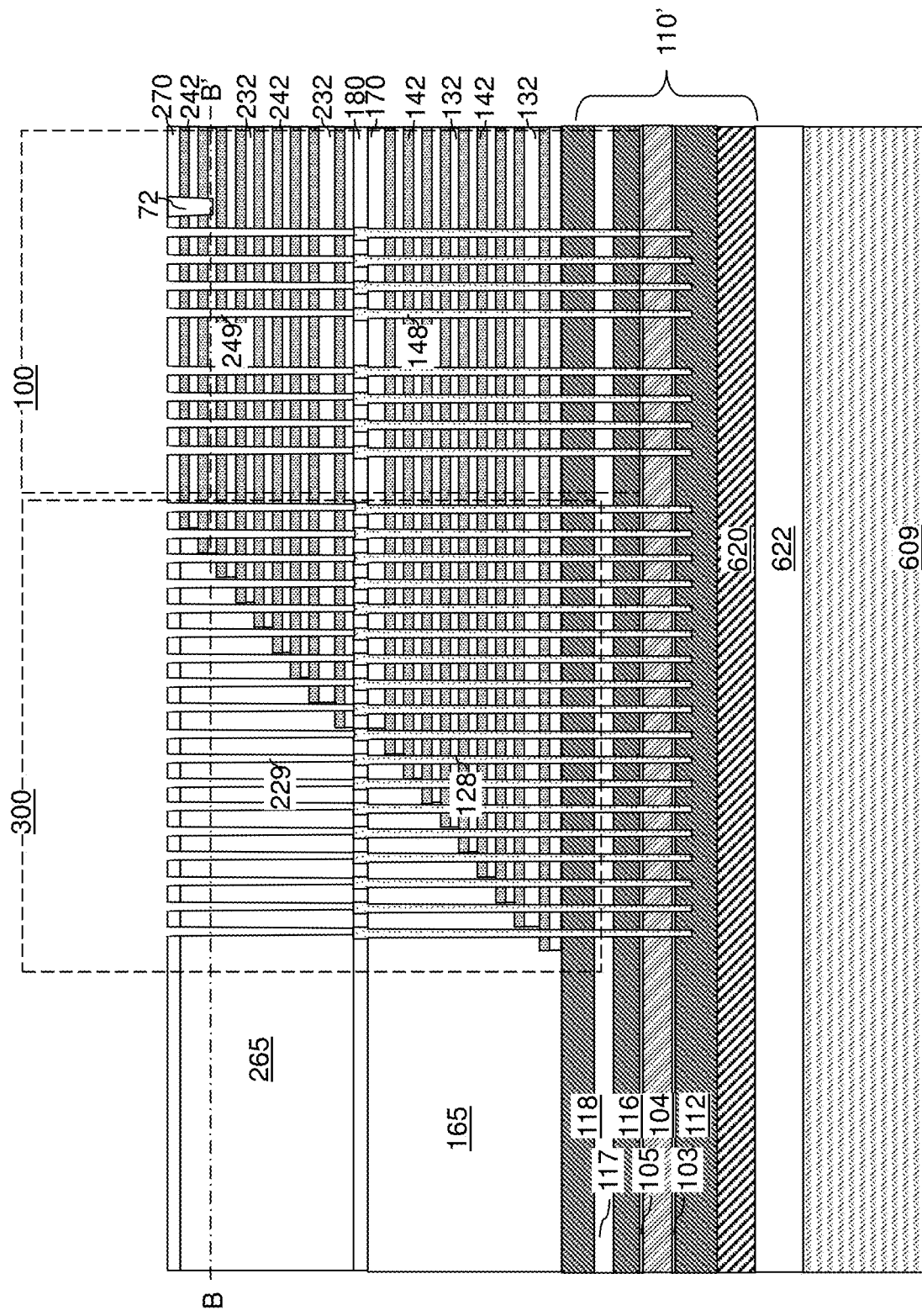
FIG. 25A is a vertical cross-sectional view of the second exemplary structure after formation of second-tier memory openings and second-tier support openings according to the second embodiment of the present disclosure.
Figure 25B:
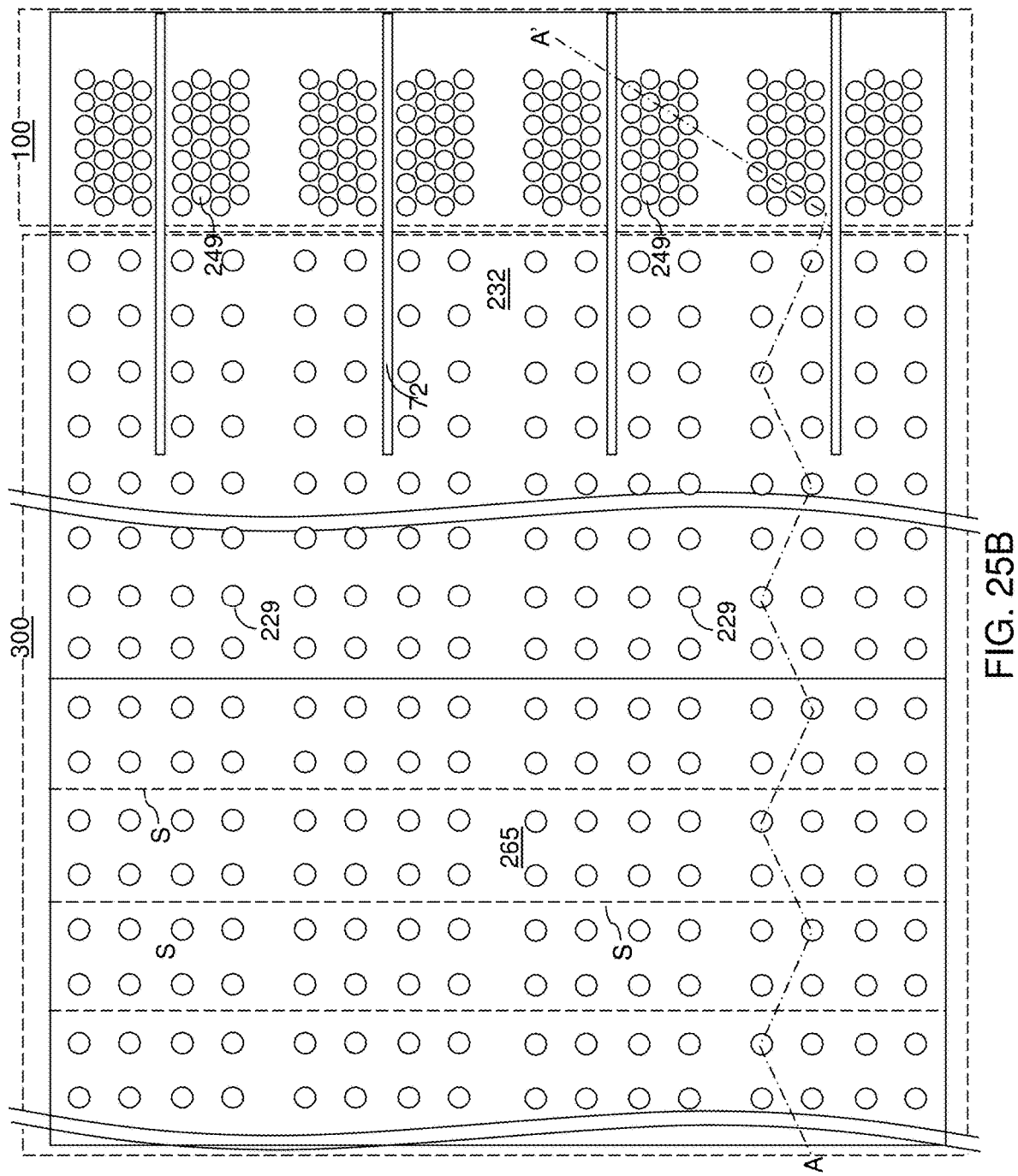
FIG. 25B is a horizontal cross-sectional view of the second exemplary structure along the horizontal plane B-B' of FIG. 25A. The hinged vertical plane A-A' corresponds to the plane of the vertical cross-sectional view of FIG. 25A.

Referring to FIGS. 25A and 25B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 26:
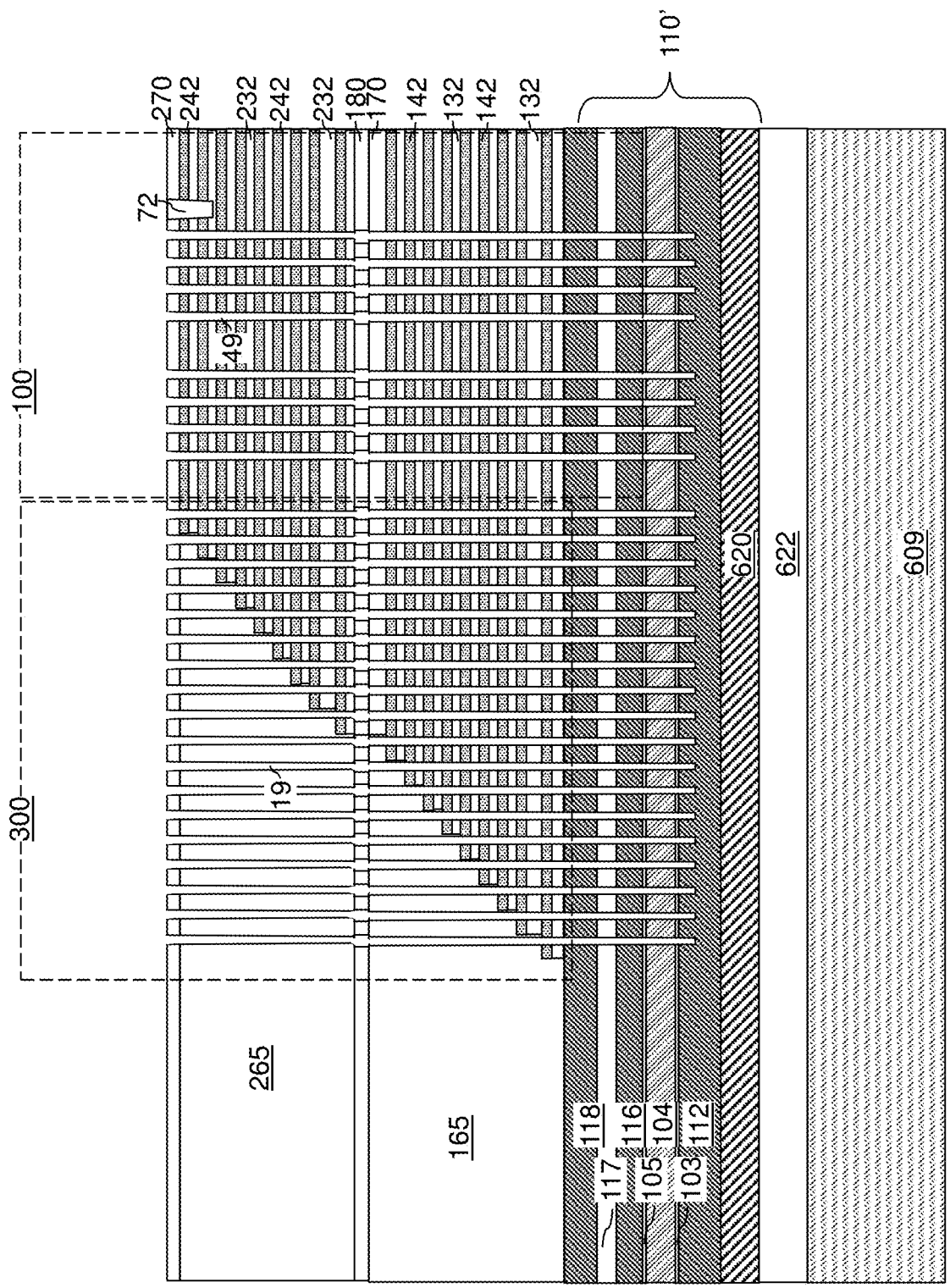
FIG. 26 is a vertical cross-sectional view of the second exemplary structure after formation of inter-tier memory openings and inter-tier support openings according to the second embodiment of the present disclosure.

Referring to FIG. 26, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 27A-27D provide sequential cross-sectional views of a memory opening 49 during formation of a memory opening fill structure. The same structural change occurs in each of the memory openings 49 and the support openings 19.

Referring to FIG. 27A, a memory opening 49 in the first exemplary device structure of FIG. 26 is illustrated. The memory opening 49 extends through the first-tier structure and the second-tier structure.

Referring to FIG. 27B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes as at least one III-V compound semiconductor material. The at least one III-V compound semiconductor material has a doping of the first conductivity type, which is the opposite of the conductivity type of the doping in the lower polycrystalline III-V compound semiconductor layer 112 and the upper polycrystalline III-V compound semiconductor layer 116. In one embodiment, the semiconductor channel material layer 60L includes p-doped GaAs or InGaAs. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 27C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 27D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 28:
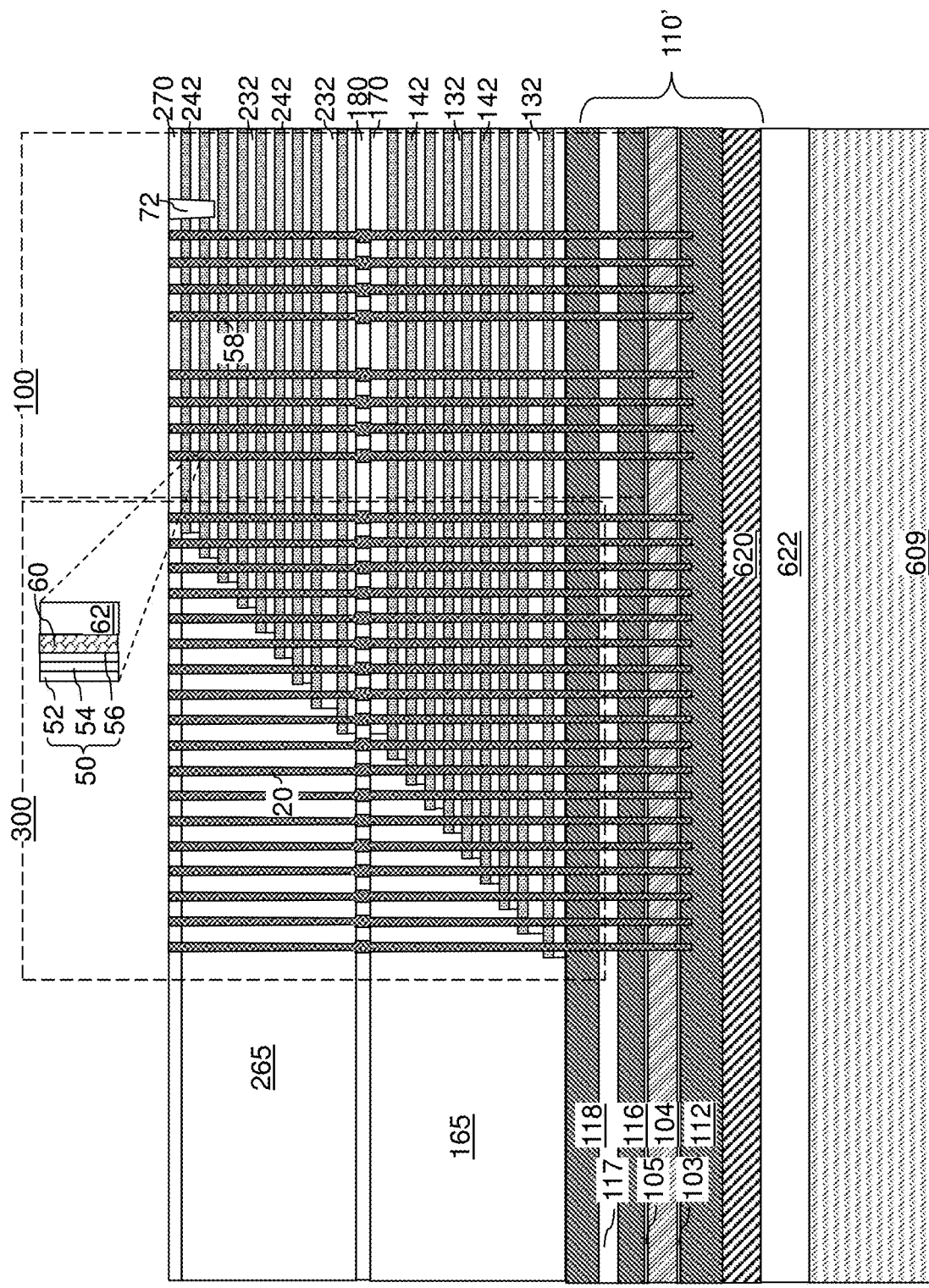
FIG. 28 is a vertical cross-sectional view of the second exemplary structure after formation of memory opening fill structures and support pillar structures according to the second embodiment of the present disclosure.

Referring to FIG. 28, the second exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 29A:
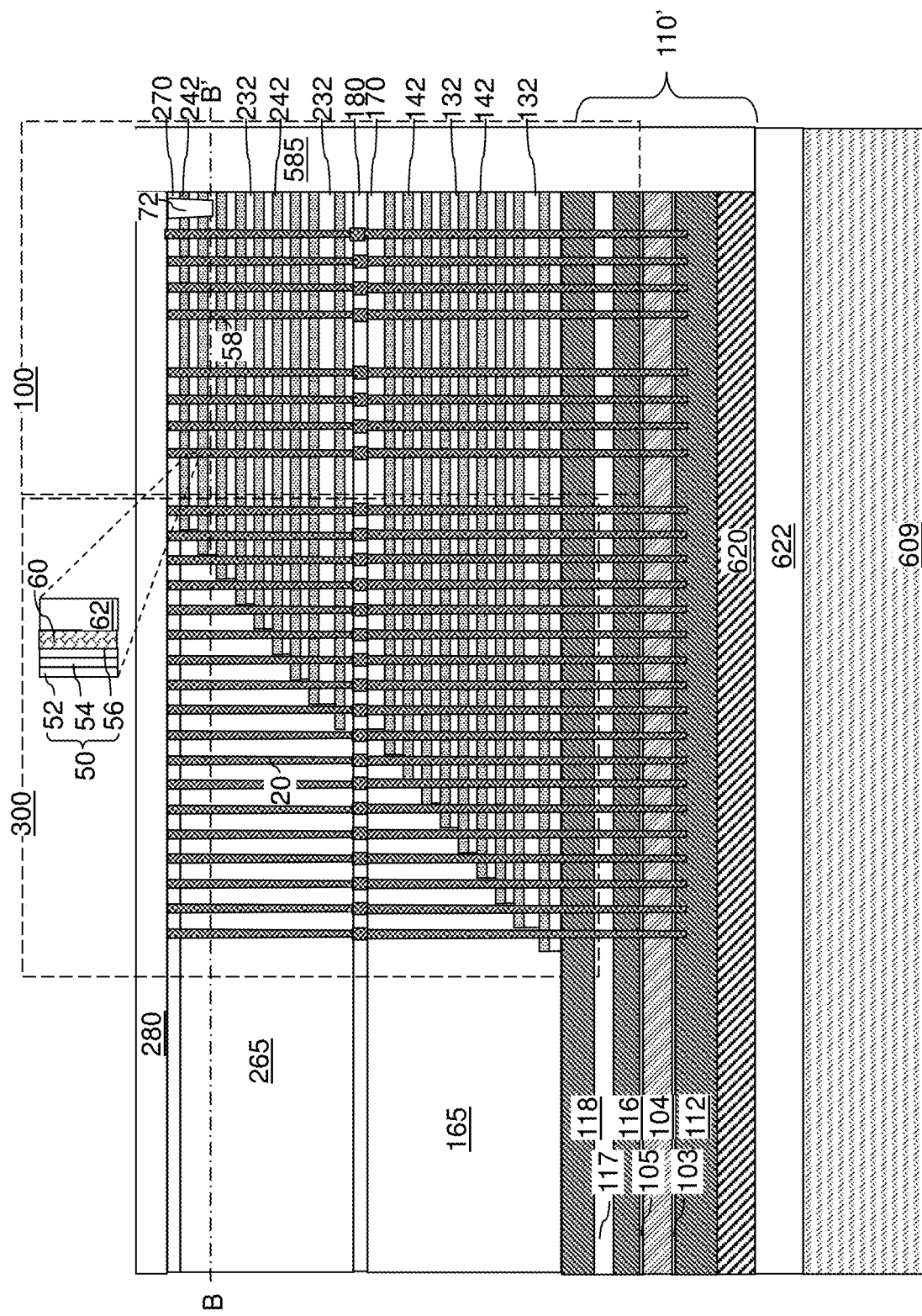
FIG. 29A is a vertical cross-sectional view of the second exemplary structure after formation of pillar cavities according to the second embodiment of the present disclosure.
Figure 29B:
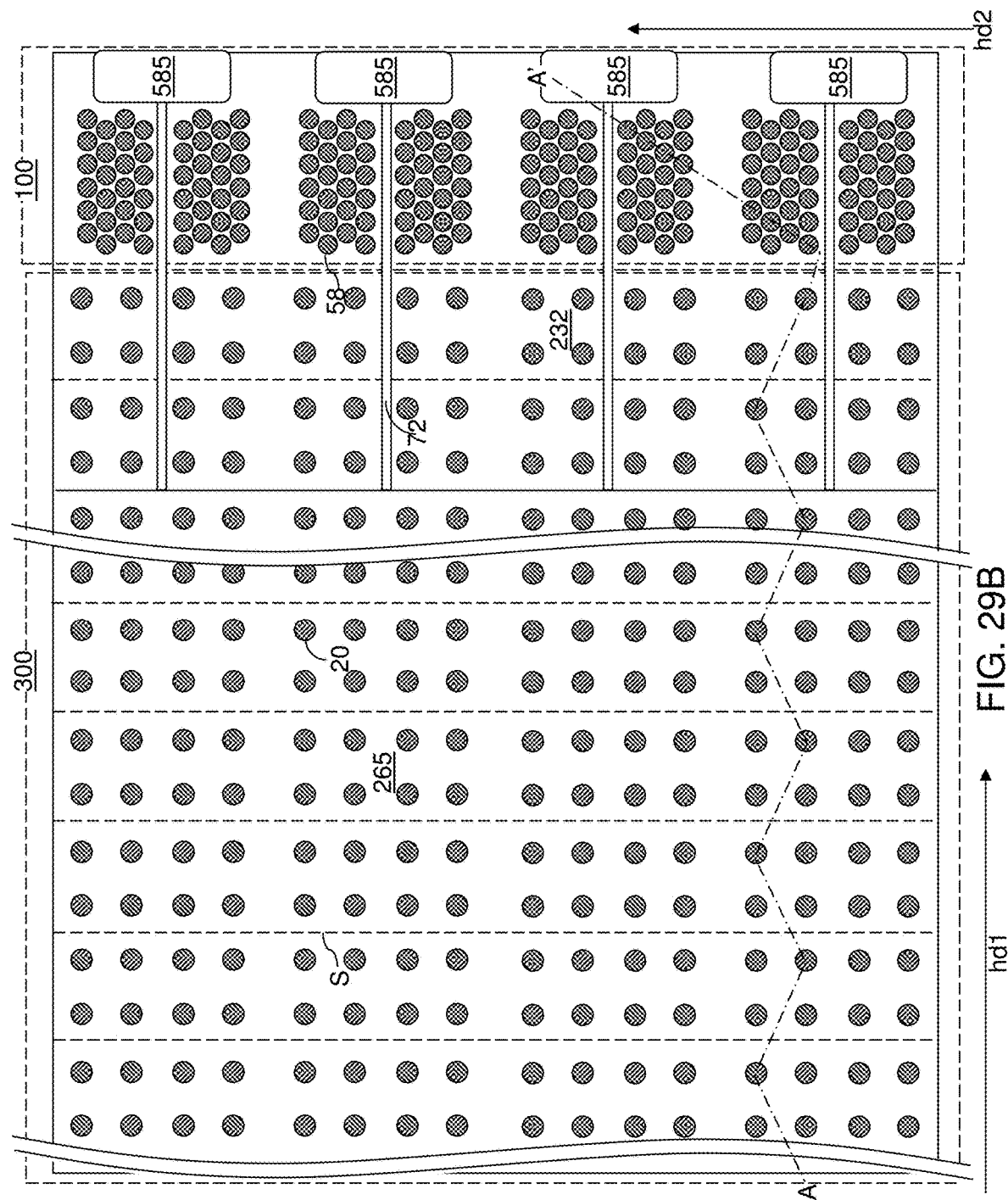
FIG. 29B is a horizontal cross-sectional view of the second exemplary structure along the horizontal plane B-B' of FIG. 29A. The hinged vertical plane A-A' corresponds to the plane of the vertical cross-sectional view of FIG. 29A.

Referring to FIGS. 29A and 29B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 30:
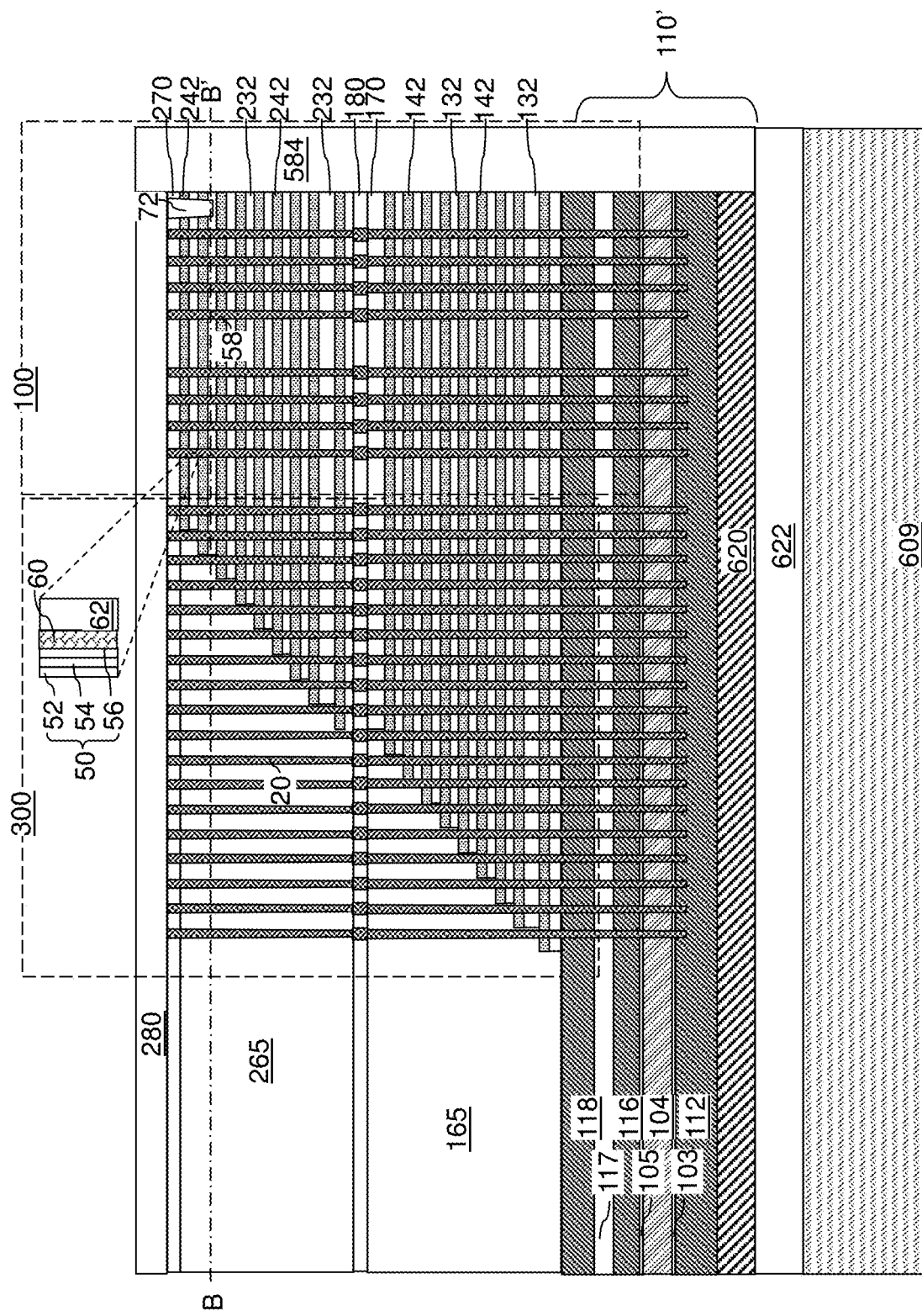
FIG. 30 is a vertical cross-sectional view of the second exemplary structure after formation of dielectric pillar structures according to the second embodiment of the present disclosure.

Referring to FIG. 30, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 31A:
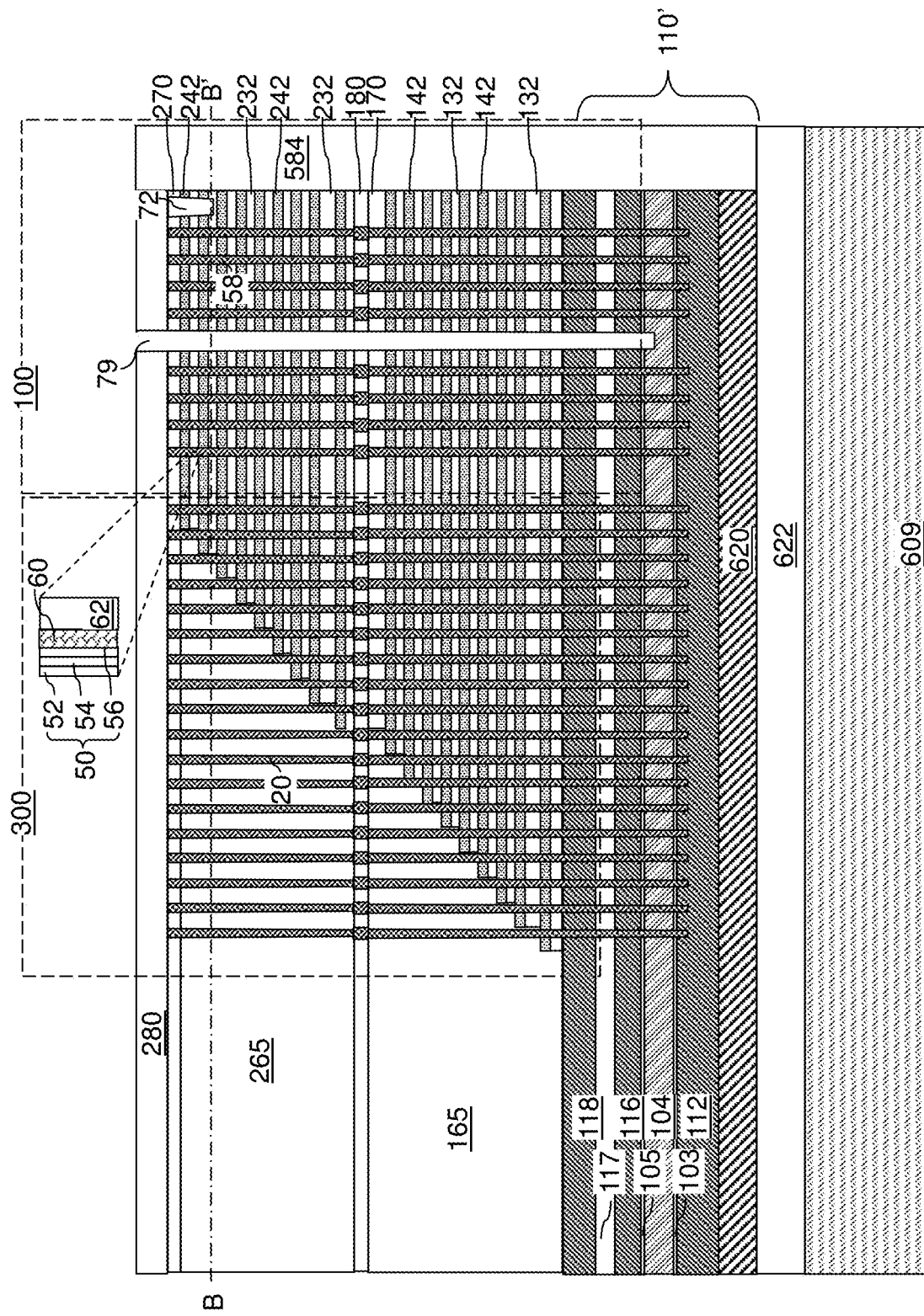
FIG. 31A is a vertical cross-sectional view of the second exemplary structure after formation of a second contact-level dielectric layer and backside trenches according to the second embodiment of the present disclosure.
Figure 31B:
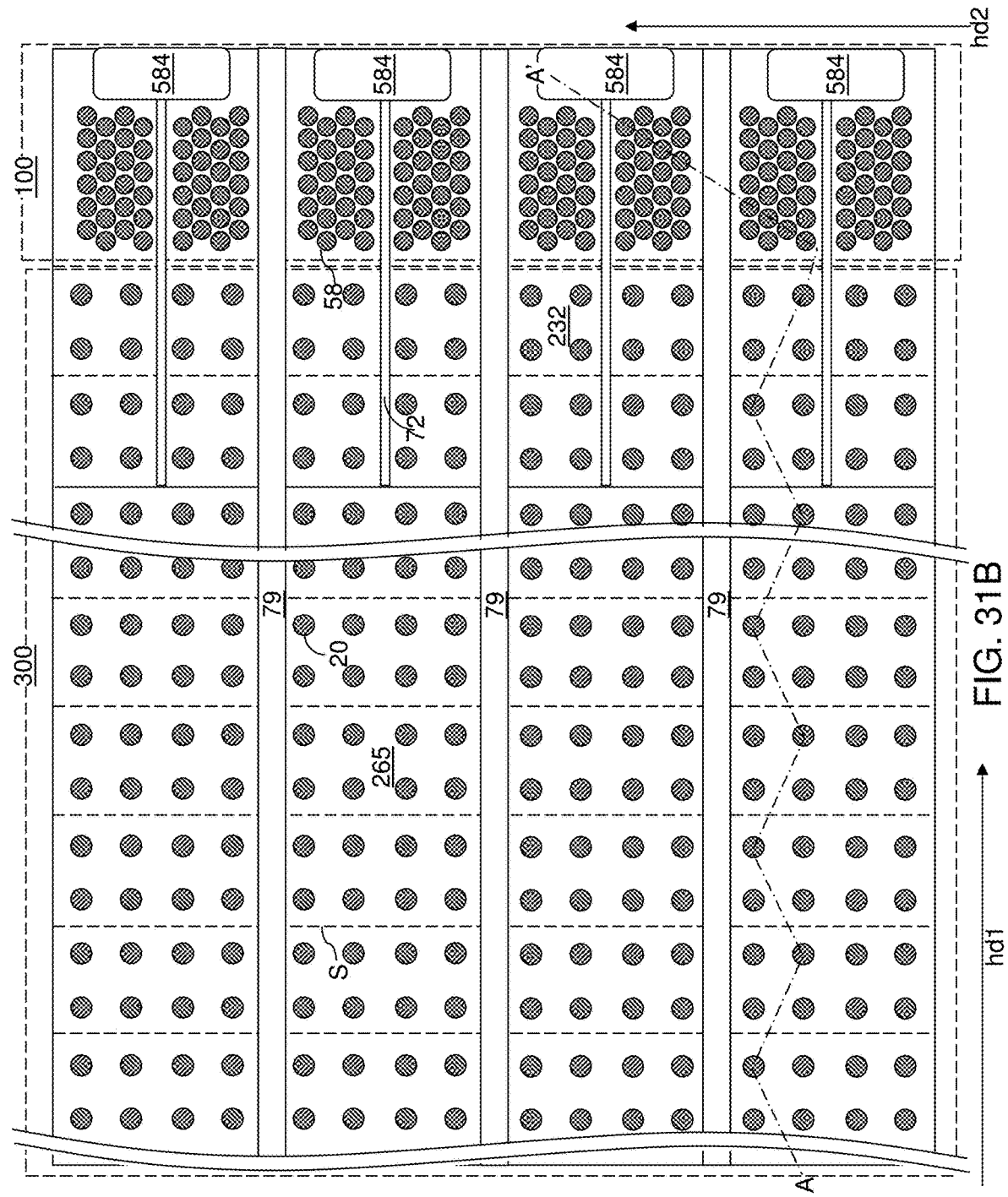
FIG. 31B is a horizontal cross-sectional view of the second exemplary structure along the horizontal plane B-B' of FIG. 31A. The hinged vertical plane A-A' corresponds to the plane of the vertical cross-sectional view of FIG. 31A.

Referring to FIGS. 31A and 31B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 32:
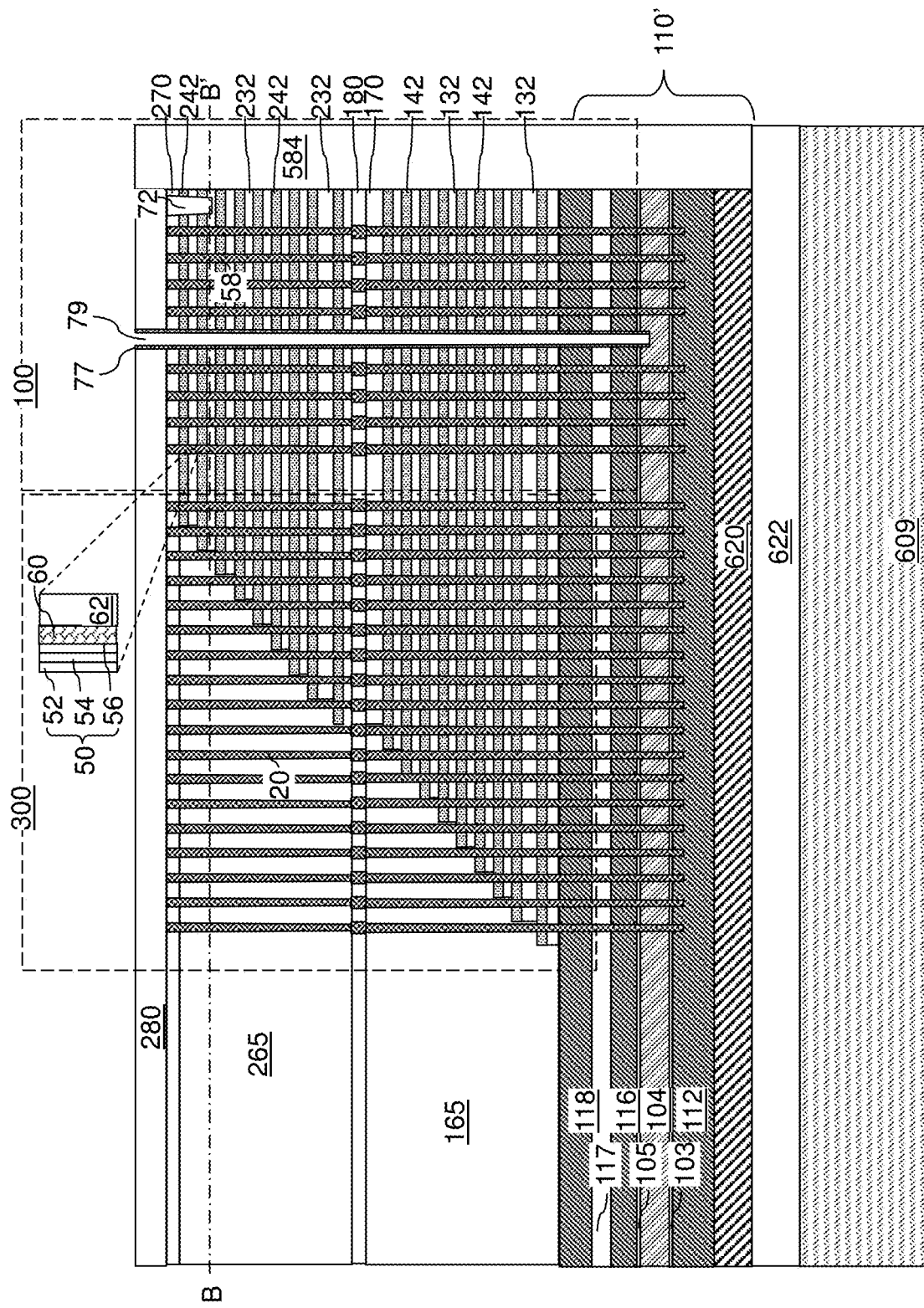
FIG. 32 is a vertical cross-sectional view of the second exemplary structure after formation of backside trench spacers according to the second embodiment of the present disclosure.
Figure 33A:
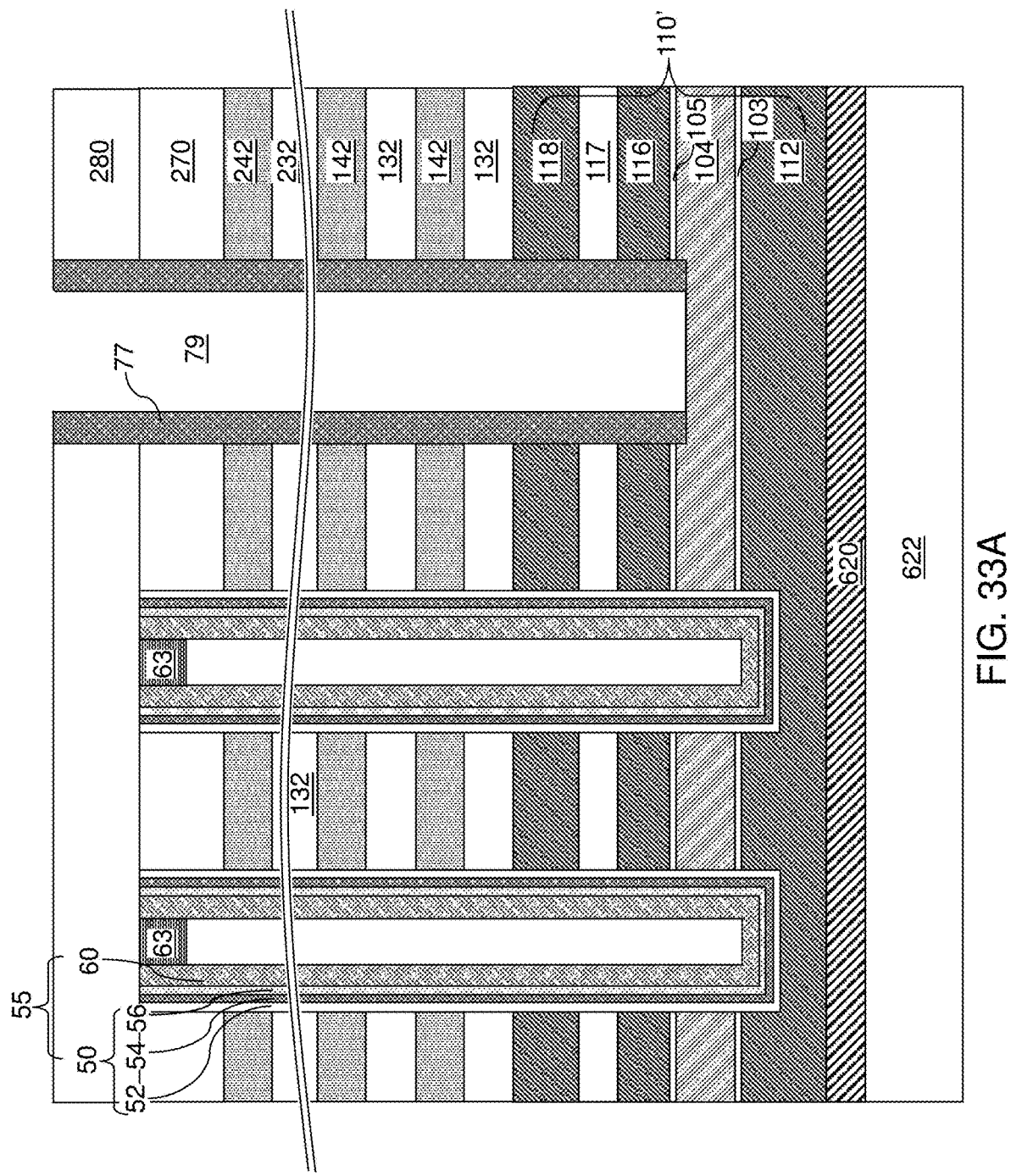
FIGS. 33A-33E illustrate sequential vertical cross-sectional views of memory opening fill structures and a backside trench during formation of a source cavity, a III-V compound semiconductor source region, and an annular metal germanosilicide portion according to the second embodiment of the present disclosure.

Referring to FIGS. 32 and 33A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon oxide or silicon nitride.

Figure 33B:
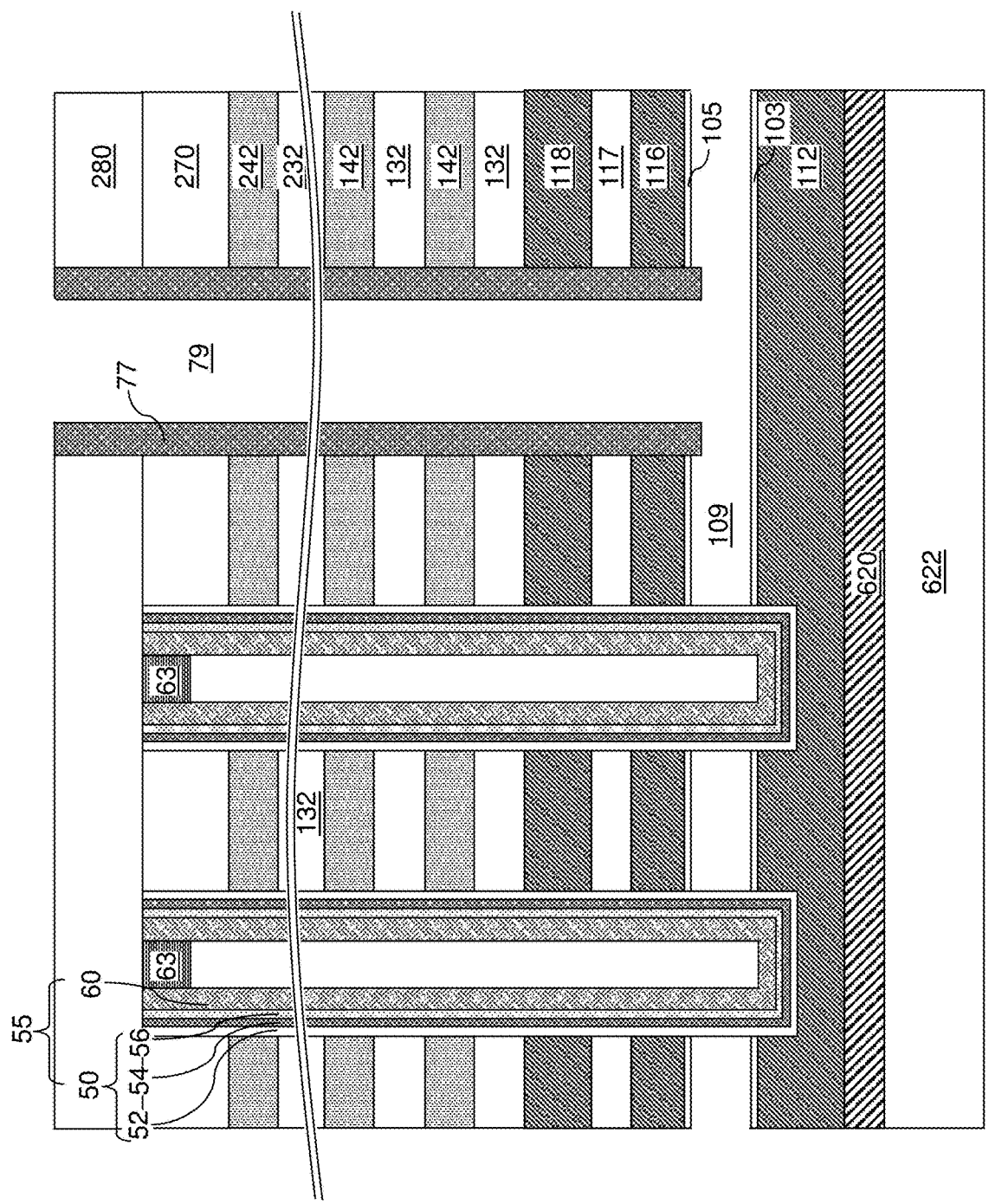

Referring to FIG. 33B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes amorphous carbon, an ashing process can be employed to remove the source-level sacrificial layer 104. If the source-level sacrificial layer 104 includes silicon nitride, a wet etch process employing hot phosphoric acid can be employed to remove the source-level sacrificial layer 104. If the source-level sacrificial layer 104 includes germanium, a wet etch process employing a combination of dilute hydrofluoric acid and hydrogen peroxide can be used. If the source-level sacrificial layer 104 includes silicon, a wet etch process employing hot trimethyl-2 hydroxyethyl ammonium hydroxide ("hot TMY") or tetramethyl ammonium hydroxide (TMAH) may be used. If the source-level sacrificial layer 104 includes a III-V compound semiconductor material, a wet etch process that selectively etches such material may be used, such as a wet etch process employing hydrogen peroxide, water and at least one of phosphoric, sulfuric or hydrochloric acid may be used to etch GaAs. A source cavity 109 is formed in the volume from which the source-level sacrificial layer 104 is removed.

Figure 33C:
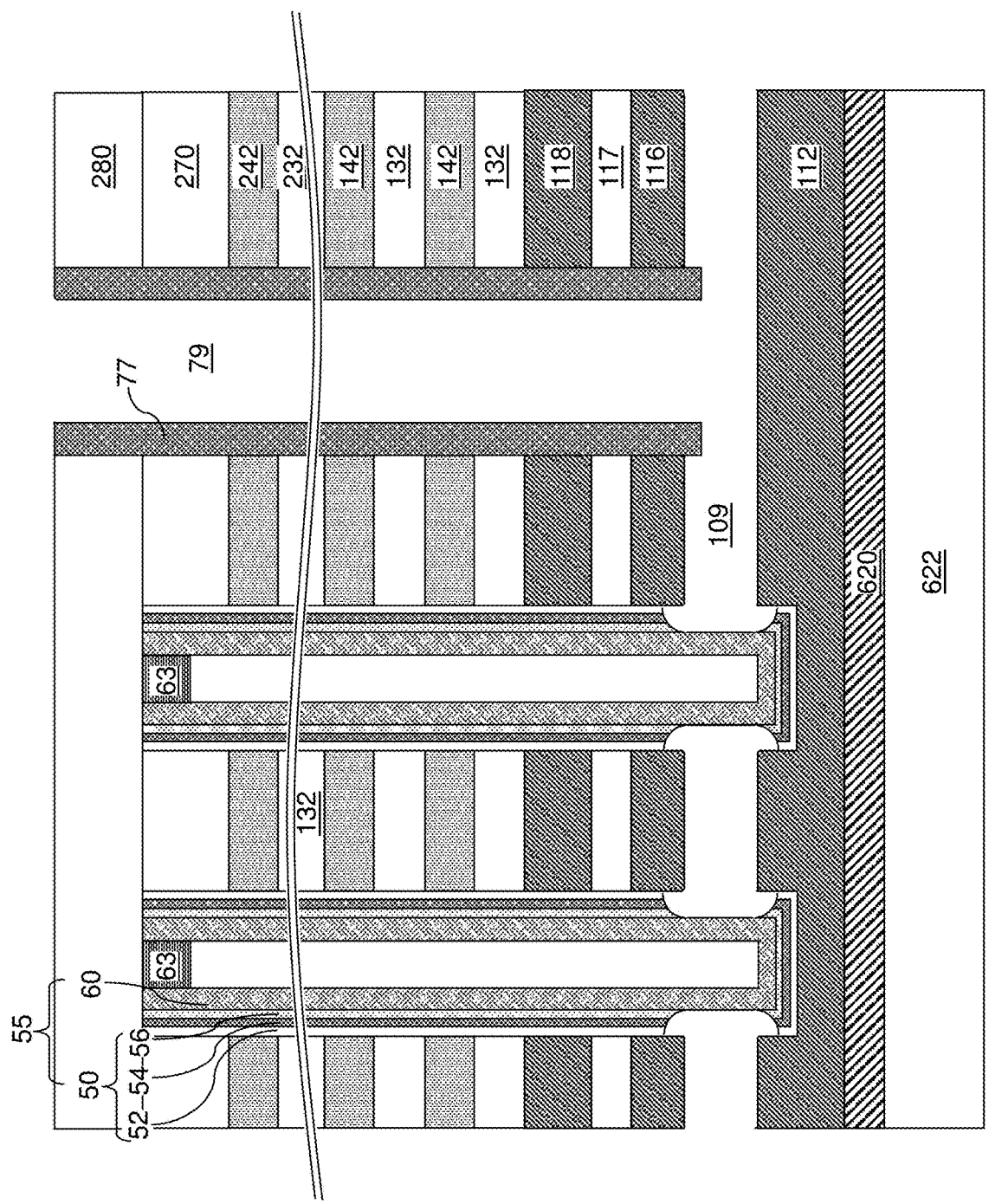

Referring to FIG. 33C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower polycrystalline III-V compound semiconductor layer 112 and a bottom surface of the upper polycrystalline III-V compound semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower polycrystalline III-V compound semiconductor layer 112 and the upper polycrystalline III-V compound semiconductor layer 116) and the vertical semiconductor channels 60.

Figure 33D:
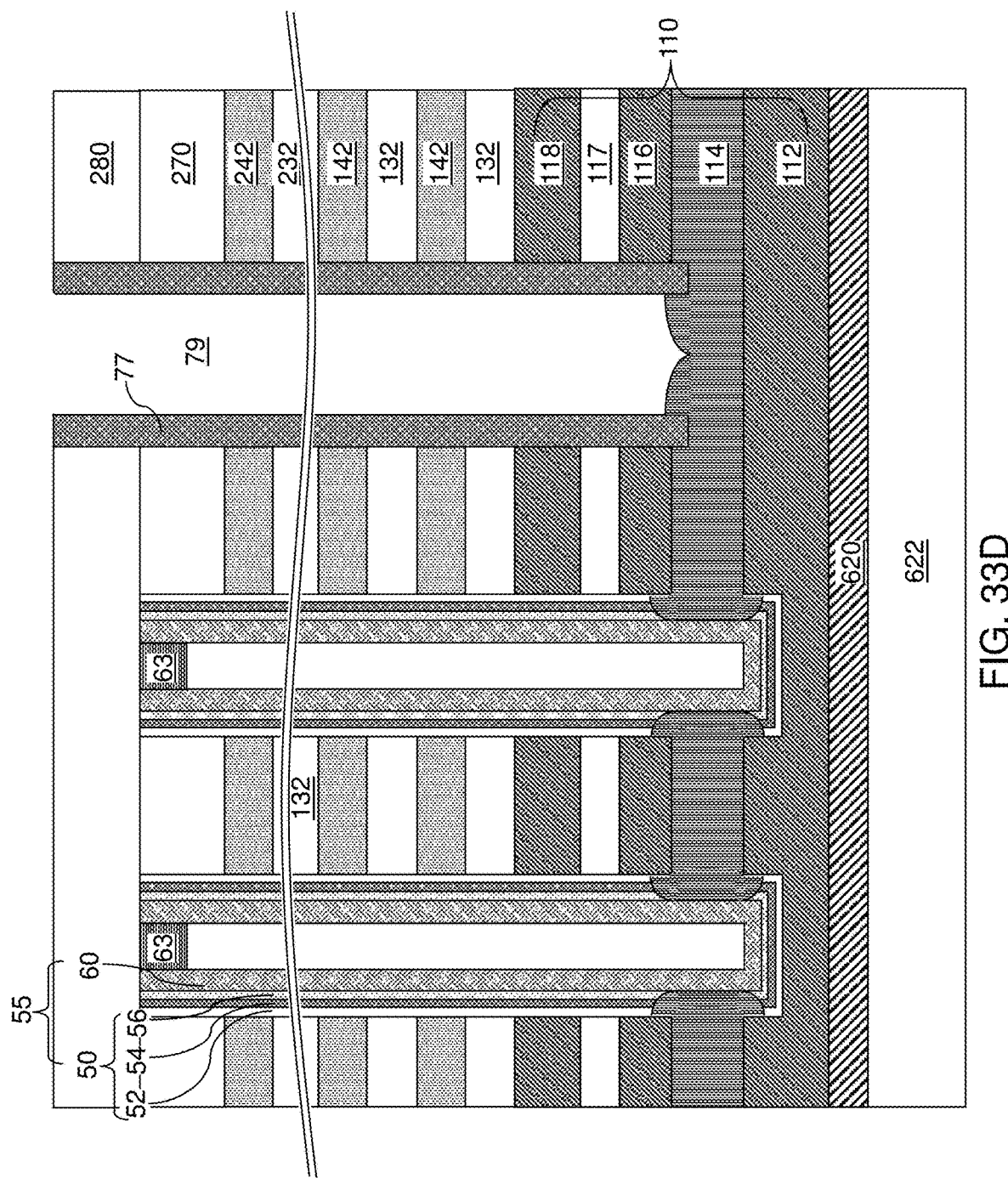

Referring to FIG. 33D, a III-V compound semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper polycrystalline III-V compound semiconductor layer 116 and/or a top surface of the lower polycrystalline III-V compound semiconductor layer 112). For example, the physically exposed semiconductor surfaces may include the bottom portions of outer sidewalls of the vertical semiconductor channels 60, the top horizontal surface of the lower polycrystalline III-V compound semiconductor layer 112, and the bottom surface of the upper polycrystalline III-V compound semiconductor layer 116.

In one embodiment, the doped semiconductor material of the second conductivity type may be deposited on the physically exposed semiconductor surfaces around the source cavity 109 by a selective semiconductor deposition process. The selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60.

The source contact layer 114 includes a respective polycrystalline doped III=V compound semiconductor material. The source contact layer 114 can include a III-V compound semiconductor material such as AlP, AlAs, AlSb, GaN, GaP, GaAs, GaSb, InN, InP, InAs, InGaAs, InSb, AlGaN, AlGaP, AlGaAs, AlGaSb, GaInN, GaInP, GaInAs, GaInSb, etc. In one embodiment, the source contact layer 114 comprises, and/or consists essentially of GaAs. The atomic concentration of the dopants of the second conductivity type in the deposited semiconductor material may be in a range from $1.0\times10^{19}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. In this case, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. Thus, the source-level sacrificial layer 104 may be replaced with the source contact layer 114.

The layer stack including the lower polycrystalline III-V compound semiconductor layer 112, the source contact layer 114, and the upper polycrystalline III-V compound semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 33E:
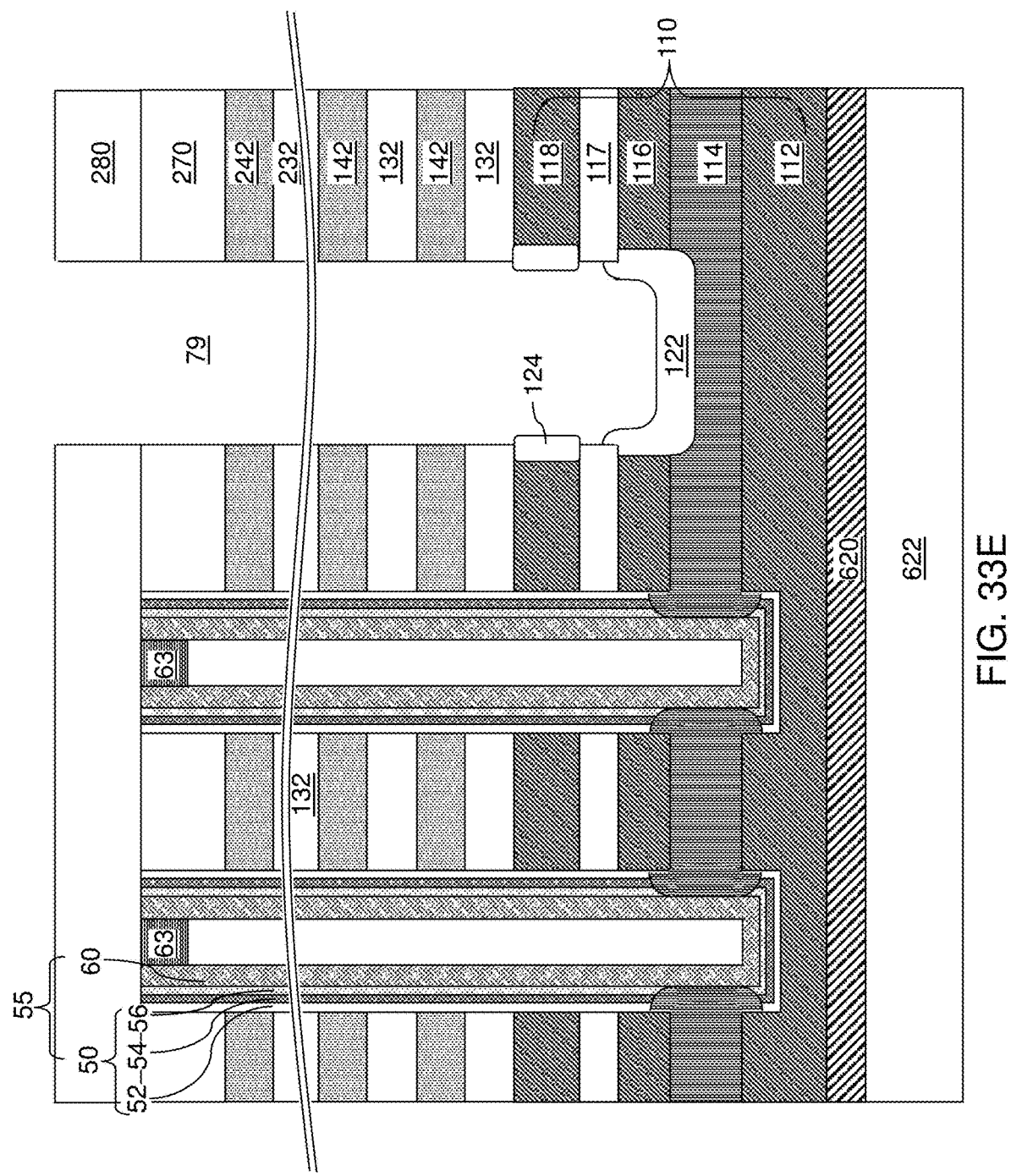

Referring to FIG. 33E, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper polycrystalline III-V compound semiconductor layer 116 may be converted into dielectric semiconductor oxide plates 122, and surface portions of the source-select-level conductive layer 118 may be converted into annular dielectric semiconductor oxide spacers 124.

Figure 34:
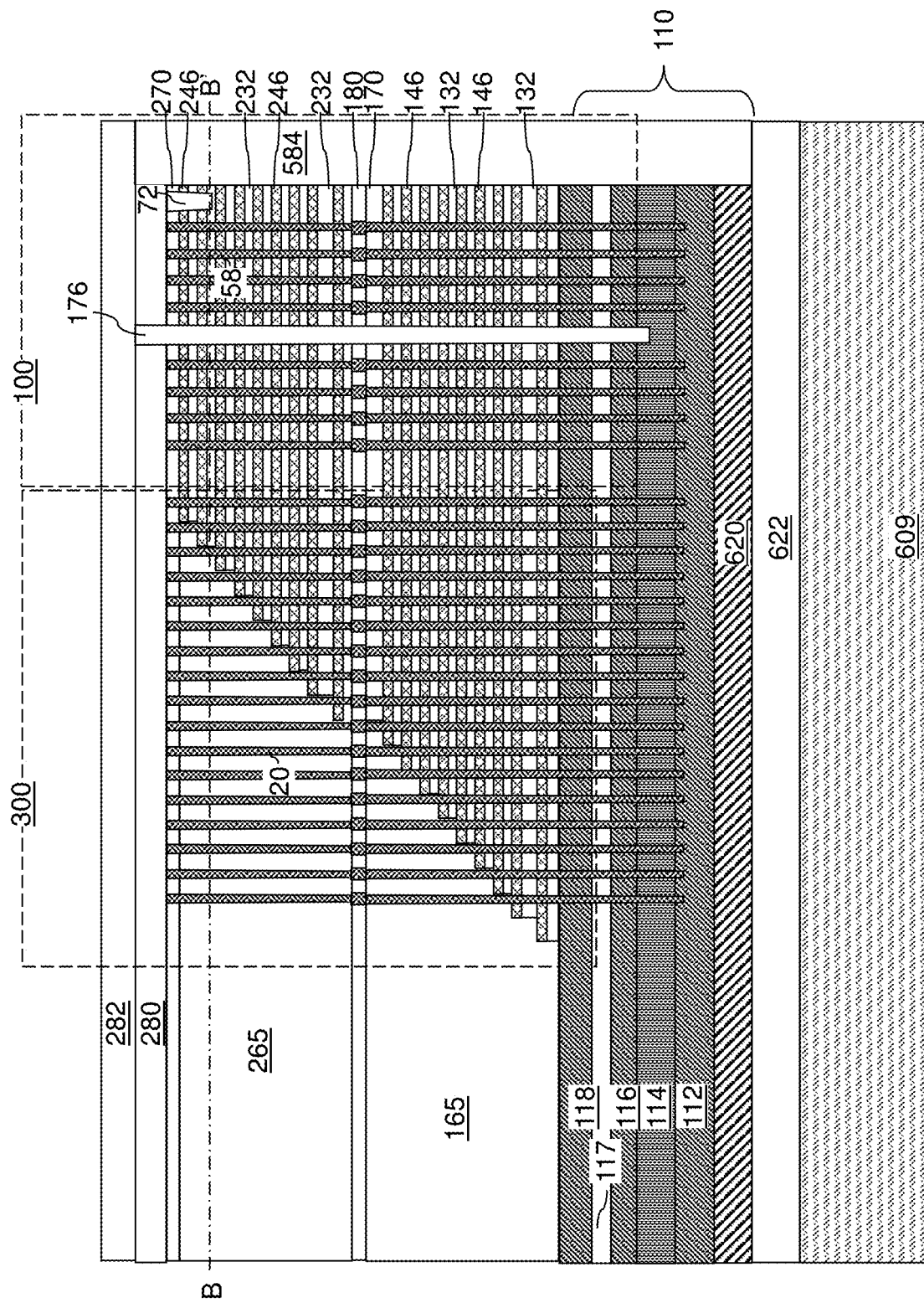
FIG. 34 illustrates a vertical cross-sectional view of the second exemplary structure after replacement of the sacrificial material layers with electrically conductive layers according to the second embodiment of the present disclosure.

Referring to FIG. 34, the sacrificial material layers (142, 242) are may be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the second exemplary structure is immersed within a wet etch tank including phosphoric acid, which etches silicon nitride selective to silicon oxide, silicon, and various other materials used in the art.

Backside recesses are formed in volumes from which the sacrificial material layers (142, 242) are removed. The backside recesses include first backside recesses that are formed in volumes from which the first sacrificial material layers 142 are removed and second backside recesses that are formed in volumes from which the second sacrificial material layers 242 are removed. Each of the backside recesses may be a laterally extending cavity having a lateral dimension that is greater than the vertical extent of the cavity. In other words, the lateral dimension of each of the backside recesses may be greater than the height of the respective backside recess. A plurality of backside recesses may be formed in the volumes from which the material of the sacrificial material layers (142, 242) is removed. Each of the backside recesses may extend substantially parallel to the top surface of the polycrystalline germanium-containing layer 620. A backside recess may be vertically bounded by a top surface of an underlying insulating layer (132, 232) and a bottom surface of an overlying insulating layer (132, 232). In one embodiment, each of the backside recesses may have a uniform height throughout.

A backside blocking dielectric layer (not shown) may be optionally deposited in the backside recesses and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses, on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses by deposition of the at least one conductive material. A plurality of first electrically conductive layers 146 may be formed in the plurality of first backside recesses, a plurality of second electrically conductive layers 246 may be formed in the plurality of second backside recesses, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiments, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over polycrystalline germanium-containing layer 620. The memory-level assembly includes at least one alternating stack (132, 146, 232, 246) and memory stack structures 55 vertically extending through the at least one alternating stack (132, 146, 232, 246).

A dielectric material layer may be conformally deposited in the backside trenches 79 and over the first contact-level dielectric layer 280 by a conformal deposition process. The dielectric material layer may include, for example, silicon oxide. Each portion of the dielectric material that fills a backside trench 79 comprises a backside trench fill structure 176, and the horizontally-extending portion of the dielectric material layer overlying the contact-level dielectric layer 280 comprises an interconnect-level dielectric layer 282.

Various contact via structures (not shown) can be formed to the electrically conductive layers (146, 246) and to the drain regions 63.

Figures 35A, 35B:
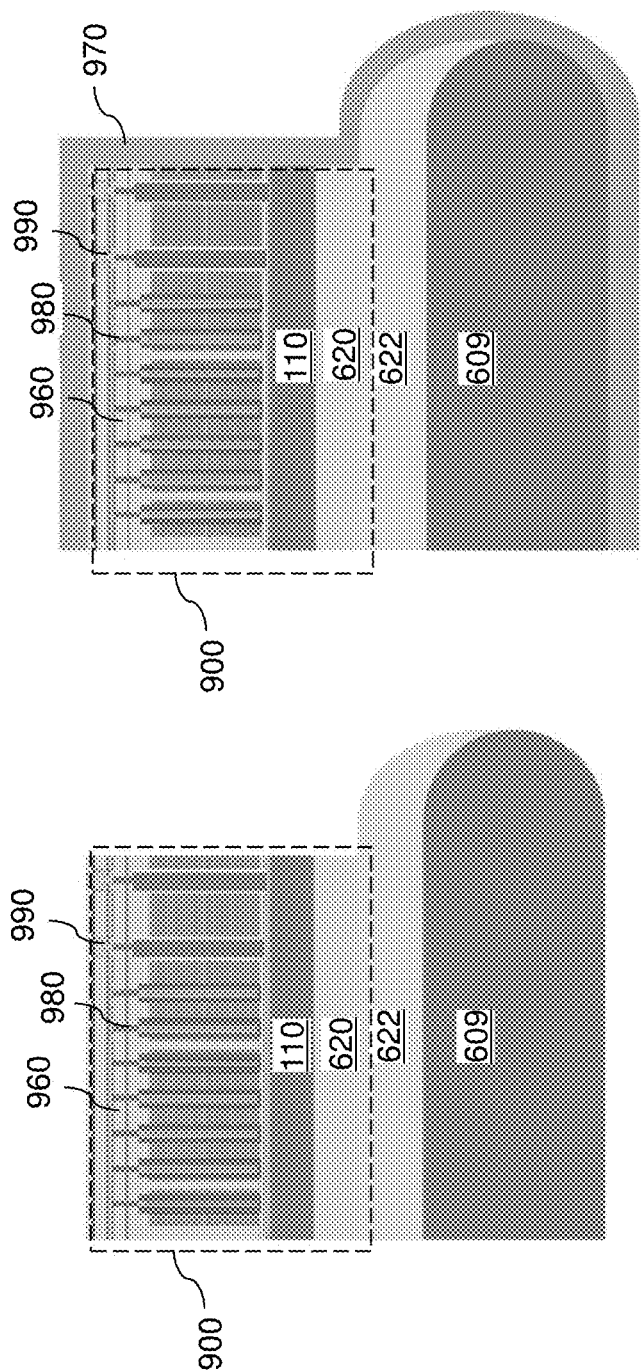
FIGS. 35A-35C are sequential vertical cross-sectional views of an edge region of the second exemplary structure during formation of a first silicon nitride diffusion barrier layer according to the second embodiment of the present disclosure.

Referring to FIG. 35A, an edge region of the second exemplary structure is illustrated. The substrate material layer 609 may comprise a semiconductor wafer, such as a silicon wafer. First dielectric material layers 960 embedding first metal interconnect structures and first bonding pads 990 can be formed over the alternating stack {(132, 146), (232, 246)} and the memory opening fill structures 58 to provide electrical connection to various nodes of the memory opening fill structures 58 and the electrically conductive layers (146, 246) (which function as word lines for the three-dimensional array of memory elements located within the two-dimensional array of memory opening fill structures 58). A plurality of first semiconductor dies 900 can be provided over the substrate material layer 609. Generally, the first metal interconnect structures 980 can be electrically connected to nodes of the memory opening fill structures 58 and/or the electrically conductive layers 46.

The various material layers located above the silicon oxide layer 622 can be anisotropically etched, for example, by covering a center portion of the second exemplary structure with an etch mask layer such as a patterned photoresist layer, and by anisotropically etching unmasked portions of the second exemplary structure above the silicon oxide layer 622. Peripheral portions of the silicon oxide layer 622 can be physically exposed after the anisotropic etch process.

Referring to FIG. 35B, a first silicon nitride diffusion barrier layer 970 can be formed on the physically exposed surfaces of the second exemplary structure by a conformal deposition process. For example, a chemical vapor deposition process can be performed to deposit the first silicon nitride diffusion barrier layer 970. The first silicon nitride diffusion barrier layer 970 can be formed on sidewalls of the first dielectric material layers 960 and a peripheral surface of the silicon oxide layer 622. The thickness of the first silicon nitride diffusion barrier layer 970 can be in a range from 30 nm to 600 nm, although lesser and greater thicknesses can also be employed.

Figure 35C:
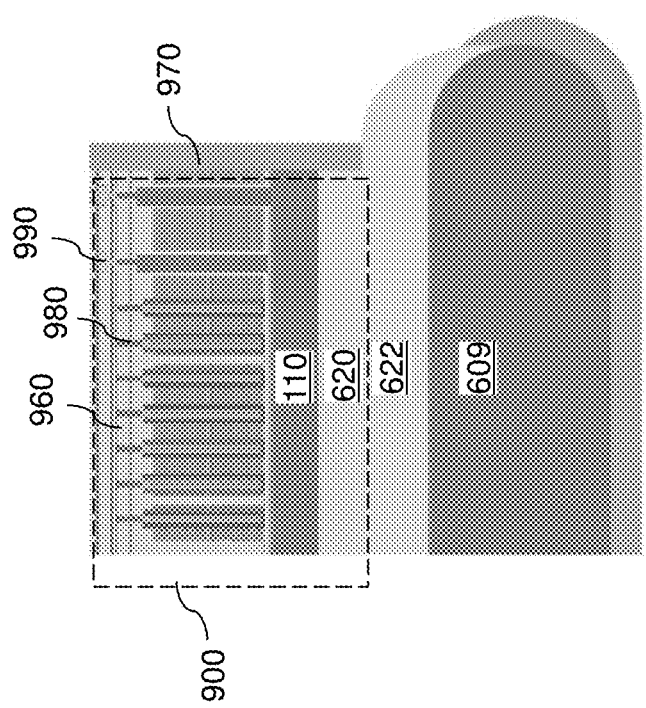

Referring to FIG. 35C, an anisotropic etch process can be performed to remove horizontal portions of the first silicon nitride diffusion barrier layer 970. The first bonding pads 990 are physically exposed. An annular top surface of the silicon oxide layer 622 can be physically exposed after the anisotropic etch process.

Figure 36B:
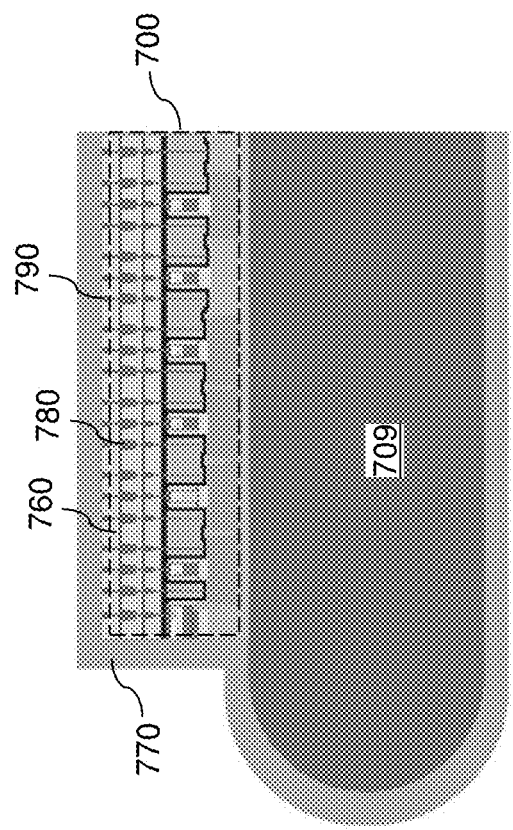
FIGS. 36A-36C are sequential vertical cross-sectional views of an edge region of a semiconductor substrate with a peripheral circuit thereupon during formation of a second silicon nitride diffusion barrier layer according to the second embodiment of the present disclosure.
Figure 36A:
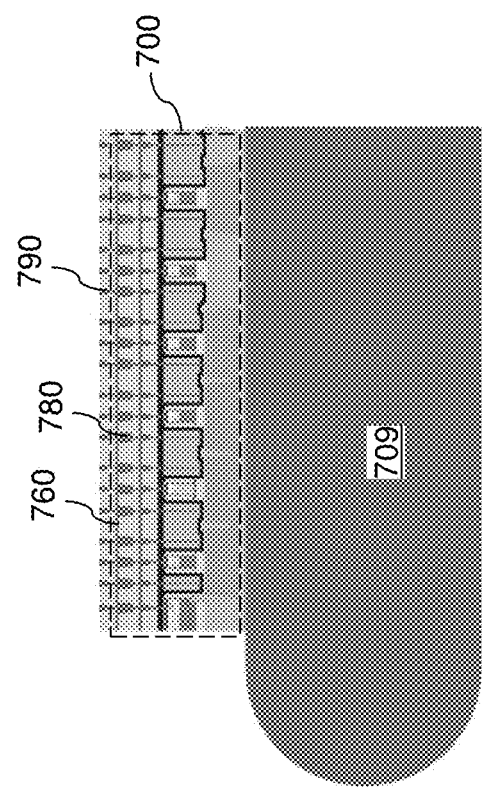

Referring to FIG. 36A, a peripheral circuit including semiconductor devices for controlling operation of the three-dimensional array of memory elements can be formed over a semiconductor substrate 709. For example, the semiconductor substrate 709 can be a commercially available single-crystalline silicon substrate. The peripheral circuit can include various semiconductor devices such as field effect transistors, resistors, capacitors, inductors, diodes, and/or additional semiconductor devices known in the art located in the peripheral circuit. A plurality of second semiconductor dies 700 can be formed over the semiconductor substrate 709. The size of each second semiconductor die 700 can be the same as the size of each first semiconductor die 900. Second dielectric material layers 760 embedding second metal interconnect structures 780 and second bonding pads 790 can be formed over the peripheral circuit that includes at least field effect transistors. The second metal interconnect structures 780 are electrically connected to nodes of the field effect transistors.

Referring to FIG. 36B, a second silicon nitride diffusion barrier layer 770 can be formed on the physically exposed surfaces of the semiconductor substrate 709 and the second dielectric material layers 760 by a conformal deposition process. For example, a chemical vapor deposition process can be performed to deposit the second silicon nitride diffusion barrier layer 770. The thickness of the second silicon nitride diffusion barrier layer 770 can be in a range from 30 nm to 600 nm, although lesser and greater thicknesses can also be employed.

Figure 36C:
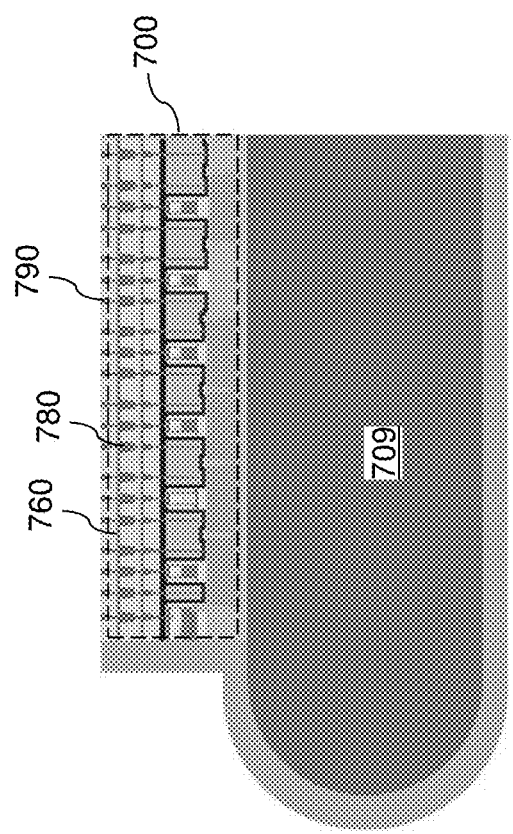

Referring to FIG. 36C, an anisotropic etch process can be performed to remove horizontal portions of the second silicon nitride diffusion barrier layer 770. The second bonding pads 790 are physically exposed. The second silicon nitride diffusion barrier layer 770 is located on sidewalls of the second dielectric material layers 760.

Referring to FIG. 37A, the second metal pads 790 that are embedded in the second dielectric material layers 760 can be bonded to the first metal pads 990 that are embedded in the first dielectric material layers 960. The assembly including the substrate material layer 809, the silicon oxide layer 622, and the plurality of first semiconductor dies 900 can be bonded to the assembly including the semiconductor substrate 709 and the plurality of second semiconductor dies 700. The field effect transistors in each second semiconductor die 700 can be located in a peripheral circuit configured to control operation of memory elements in the memory opening fill structures 58 within a respective first semiconductor die 900 that is bonded to the second semiconductor die 700. An annular surface of the silicon oxide layer 622 is physically exposed after the bonding process.

Figure 37B:
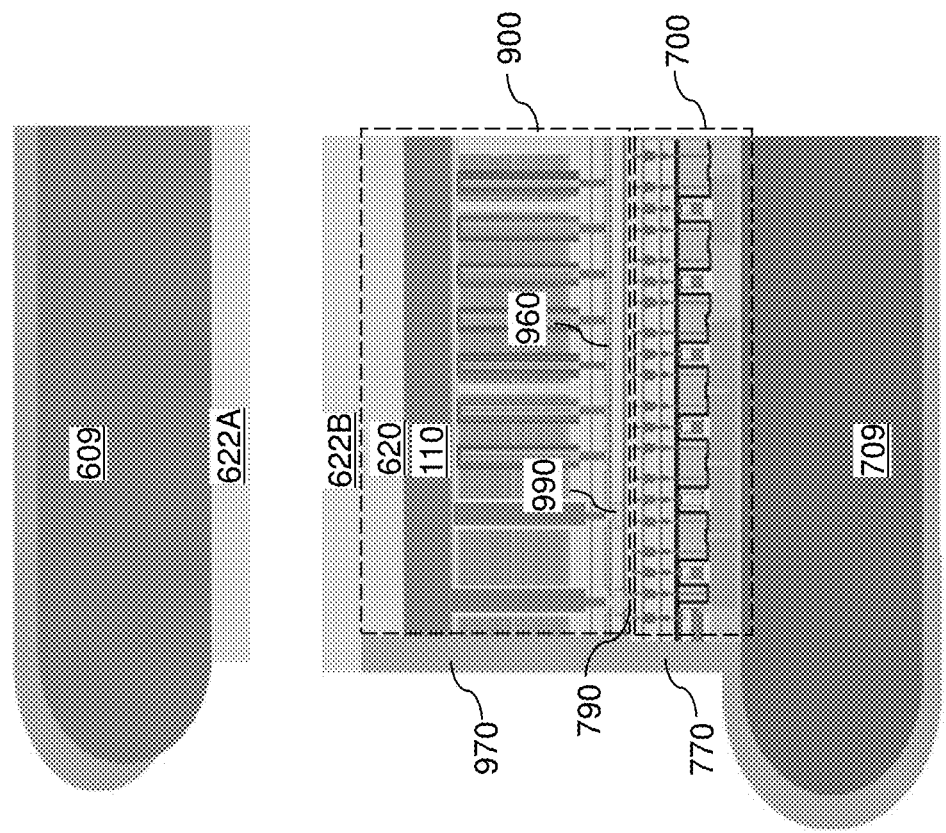

Referring to FIG. 37B, an isotropic etch process can be performed to isotropically etch peripheral portions of the silicon oxide layer 622. For example, a wet etch process employing dilute hydrofluoric acid can be performed to isotropically etch the peripheral portions of the silicon oxide layer 622. In case the silicon oxide layer 622 includes a doped silicate glass layer 622D (as illustrated in FIG. 19), the doped silicate glass layer 622D may be etched faster than the proximal silicon oxide layer 622A and the distal silicon oxide layer 622B.

The assembly including the polycrystalline germanium-containing layer 620, the single-crystalline III-V compound semiconductor layer 930, the alternating stack {(132, 146), (232, 246)}, and the memory opening fill structures 58 can be separated from the substrate material layer 609 at a separation surface that includes a surface of the silicon oxide layer 622. Generally, the assembly including the polycrystalline germanium-containing layer 620, the single-crystalline III-V compound semiconductor layer 930, the alternating stack {(132, 146), (232, 246)}, and the memory opening fill structures 58 can be pulled apart from the substrate material layer 609 by applying mechanical force. The separation may be performed by attaching electrostatic chucks to opposing substrates (609, 709) and then pulling the chucks apart to separate the silicon oxide layer 622 along the separation surface. The silicon oxide layer 622 can be separated within or at an interface with the substrate 609 or at an interface with the polycrystalline germanium-containing layer 620. In one embodiment, the separation surface may comprises a surface of the proximal silicon oxide layer 622A and/or a surface of the distal silicon oxide layer 622B.

Generally, the assembly including the polycrystalline germanium-containing layer 620, the single-crystalline III-V compound semiconductor layer 930, the alternating stack {(132, 146), (232, 246)}, and the memory opening fill structures 58 can be cleaved from the substrate material layer 609 after the second metal pads 790 are bonded to the first metal pads 990. Generally, peripheral portions of the silicon oxide layer 622 can be isotropically etched prior to separating the assembly including the polycrystalline germanium-containing layer 620, the single-crystalline III-V compound semiconductor layer 930, the alternating stack {(132, 146), (232, 246)}, and the memory opening fill structures 58 from the substrate material layer 609. Subsequently, the bonded assembly may be processed to thin the semiconductor substrate 709 and/or to form through-substrate via structures. The bonded assembly can be subsequently diced to form semiconductor chips including a respective bonded pair of a first semiconductor die 900 and a second semiconductor die 700.

Referring to FIGS. 19-37B and according to various embodiments of the present disclosure, a semiconductor structure is provided, which comprises: a polycrystalline germanium-containing layer 620; a polycrystalline III-V compound semiconductor layer (such as the lower polycrystalline III-V compound semiconductor layer 112) located on the germanium-containing layer 620; a source contact layer 114 located on the polycrystalline III-V compound semiconductor layer 112; an alternating stack of insulating layers (132, 232) and electrically conductive layers (146, 246) located on the source contact layer 114; memory stack structures 55 vertically extending through the alternating stack {(132, 146), (232, 246)}; first dielectric material layers 960 embedding first metal interconnect structures 980 and first metal pads 990 and located on the alternating stack {(132, 146), (232, 246)}, wherein the first metal interconnect structures 980 are electrically connected to nodes of the memory stack structures 55; second dielectric material layers embedding second metal interconnect structures and second metal pads, wherein the second dielectric material layers are located over the first dielectric material layers 960, and wherein the second metal pads are bonded to the first metal pads; and field effect transistors located over the second dielectric material layers and electrically connected to the second metal interconnect structures.

In one embodiment, the memory stack structures 55 are located within memory openings 49 that vertically extend through the alternating stack {(132, 146), (232, 246)}; and each of the memory stack structures 55 comprises a respective vertical semiconductor channel 60 and a memory film 50. In one embodiment, the vertical semiconductor channels 60 comprise, and/or consist essentially of, a III-V compound semiconductor channel material. In one embodiment, the source contact layer 114 contacts an outer sidewall of each of the vertical semiconductor channels 60. In one embodiment, the source contact layer 114 comprises a III-V compound semiconductor material.

In one embodiment, the three-dimensional memory device comprises: a silicon oxide layer (such as a distal silicon oxide layer 622B) located on the polycrystalline germanium-containing layer 620; a first silicon nitride diffusion barrier layer 970 laterally surrounding sidewalls of the first dielectric material layers 960; and a second silicon nitride diffusion barrier layer 770 laterally surrounding sidewalls of the second dielectric material layers 760.

The various embodiments of the present disclosure form a III-V compound semiconductor material layer by providing a germanium-containing layer over a silicon oxide layer. A device structure, such as a three-dimensional memory array can be formed on the III-V compound semiconductor material layer. The substrate employed to provide the silicon oxide layer can be subsequently detached from the device structure, and can be reused as a substrate for providing another silicon oxide layer and another germanium-containing layer in subsequent processing steps, thus reducing the cost of the process. Furthermore, the use of III-V compound semiconductor channels with increased electron mobility improves the cell current of the memory devices.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   providing a first assembly including a transfer substrate, a single-crystalline germanium-containing layer, and a first silicon oxide component layer;
   providing a second assembly including a substrate material layer and a second silicon oxide component layer;
   bonding the first silicon oxide component layer to the second silicon oxide component layer to form a silicon oxide layer;
   detaching the transfer substrate from an assembly including, from bottom to top, the substrate material layer, the silicon oxide layer, and the single-crystalline germanium-containing layer;
   growing a single-crystalline III-V compound semiconductor layer on the single-crystalline germanium-containing layer;
   forming an alternating stack of insulating layers and spacer material layers over the single-crystalline III-V compound semiconductor layer, wherein the spacer material layers are formed as, or are subsequently replaced with, electrically conductive layers;
   forming memory openings through the alternating stack; and
   forming memory opening fill structures in the memory openings, wherein each memory opening fill structure comprises a memory film and a vertical semiconductor channel having a bottom end that is electrically connected to the single-crystalline III-V compound semiconductor layer.

2. The method of claim 1, further comprising separating an assembly including the single-crystalline germanium-containing layer, the single-crystalline III-V compound semiconductor layer, the alternating stack, and the memory opening fill structures from the substrate material layer at a separation surface that includes a surface of the silicon oxide layer.

3. The method of claim 2, wherein the growing of the single-crystalline III-V compound semiconductor layer on the single-crystalline germanium-containing layer occurs after the bonding the first silicon oxide component layer to the second silicon oxide component layer to form the silicon oxide layer; and
   wherein the detaching of the transfer substrate from an assembly including the substrate material layer, the silicon oxide layer, and the single-crystalline germanium-containing layer occurs after the bonding the first silicon oxide component layer to the second silicon oxide component layer.

4. The method of claim 3, further comprising:
   growing an in-process single-crystalline germanium-containing layer on the transfer substrate, wherein the first silicon oxide component layer is formed over the in-process single-crystalline germanium-containing layer;
   forming a hydrogen implanted region within the in-process single-crystalline germanium-containing layer by implanting hydrogen atoms, wherein the in-process single-crystalline germanium-containing layer is divided into the single-crystalline germanium-containing layer contacting the first silicon oxide component layer and an additional single-crystalline germanium-containing layer located on the transfer substrate, and wherein the first assembly comprises the additional single-crystalline germanium-containing layer and the hydrogen implanted region.

5. The method of claim 4, wherein detaching the transfer substrate from the assembly including the substrate material layer, the silicon oxide layer, and the single-crystalline germanium-containing layer comprises inducing bubbling of hydrogen atoms in the hydrogen implanted region, wherein a combination of the transfer substrate and the additional single-crystalline germanium-containing layer is detached from the single-crystalline germanium-containing layer.

6. The method of claim 4, wherein:
   the transfer substrate comprises a single-crystalline silicon substrate;
   the in-process single-crystalline germanium-containing layer is grown on the transfer substrate by an epitaxial growth process; and
   the separation surface comprises an interface between the first silicon oxide component layer and the second silicon oxide component layer.

7. The method of claim 2, further comprising forming first dielectric material layers embedding first metal interconnect structures and first bonding pads over the alternating stack, wherein the first metal interconnect structures are electrically connected to nodes of the memory opening fill structures or the electrically conductive layers.

8. The method of claim 7, further comprising:
   forming field effect transistors on a semiconductor substrate;
   forming second dielectric material layers embedding second metal interconnect structures and second bonding pads over the field effect transistors, wherein the second metal interconnect structures are electrically connected to nodes of the field effect transistors; and
   bonding the second metal pads to the first metal pads, wherein the field effect transistors are located in a peripheral circuit configured to control operation of memory elements in the memory opening fill structures.

9. The method of claim 8, wherein the assembly including the single-crystalline germanium-containing layer, the single-crystalline III-V compound semiconductor layer, the alternating stack, and the memory opening fill structures is separated from the substrate material layer after the second metal pads are bonded to the first metal pads.

10. The method of claim 8, further comprising:
    forming a first silicon nitride diffusion barrier layer on sidewalls of the first dielectric material layers, wherein a surface of the silicon oxide layer is physically exposed;
    forming a second silicon nitride diffusion barrier layer on sidewalls of the second dielectric material layers; and
    isotropically etching peripheral portions of the silicon oxide layer prior to separating the assembly including the single-crystalline germanium-containing layer, the single-crystalline III-V compound semiconductor layer, the alternating stack, and the memory opening fill structures from the substrate material layer.

11. The method of claim 1, wherein each of the memory opening fill structures comprises a III-V compound semiconductor pedestal contacting a bottom end of a respective one of the vertical semiconductor channels and contacting a top surface of the single-crystalline III-V compound semiconductor layer.

12. The method of claim 11, wherein each III-V compound semiconductor pedestal is epitaxially aligned to the single-crystalline III-V compound semiconductor layer.

13. The method of claim 12, wherein each vertical semiconductor channel comprises a III-V compound semiconductor material.

14. The method of claim 11, wherein:
each III-V compound semiconductor pedestal and each vertical semiconductor channel have a doping of a first conductivity type; and
the single-crystalline III-V compound semiconductor layer has a doping of the first conductivity type.

15. The method of claim 11, wherein each memory film comprises a layer stack including a blocking dielectric layer, a charge storage layer, and a tunneling dielectric layer that contacts a respective one of the vertical semiconductor channels.

16. The method of claim 1, wherein the silicon oxide layer is located between the substrate material layer and the single-crystalline germanium-containing layer.

17. The method of claim 1, further comprising forming grooves on a top surface of the first silicon oxide component layer prior to bonding the first silicon oxide component layer to the second silicon oxide component layer, wherein volumes of the grooves become channels containing volumes of voids and located between the first silicon oxide component layer and the second silicon oxide component layer after formation of the silicon oxide layer.

18. The method of claim 17, further comprising removing portions of the first silicon oxide component layer and the second silicon oxide component layer that are proximal to the channels by introducing an isotropic etchant that etches the first silicon oxide material and the second silicon oxide material after formation of the memory opening fill structures.

19. The method of claim 1, further comprising detaching a first structure comprising the substrate material layer from a second structure comprising the single-crystalline germanium-containing layer and the alternating stack, wherein:
the first structure comprises a first portion of the silicon oxide layer; and
the second structure comprises a second portion of the silicon oxide layer.

20. The method of claim 1, wherein:
the first silicon oxide component layer consists essentially of a first silicon oxide material;
the second silicon oxide component layer consists essentially of a second silicon oxide material; and
the step of bonding the first silicon oxide component layer to the second silicon oxide component layer comprises bonding the first silicon oxide material to the second silicon oxide material, such that the silicon oxide layer consists essentially of the first silicon oxide material and the second silicon oxide material.

* * * * *